(12) United States Patent
Bibl et al.

(10) Patent No.: US 9,865,577 B2
(45) Date of Patent: Jan. 9, 2018

(54) LED DISPLAY WITH WAVELENGTH CONVERSION LAYER

(71) Applicant: Apple Inc., Cupertino, CA (US)

(72) Inventors: Andreas Bibl, Los Altos, CA (US); Kelly McGroddy, San Francisco, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 15/438,587

(22) Filed: Feb. 21, 2017

(65) Prior Publication Data

US 2017/0162553 A1 Jun. 8, 2017

Related U.S. Application Data

(63) Continuation of application No. 14/811,417, filed on Jul. 28, 2015, now Pat. No. 9,599,857, which is a
(Continued)

(51) Int. Cl.
| | |
|---|---|
| *H01L 33/50* | (2010.01) |
| *H01L 25/16* | (2006.01) |
| *H01L 25/075* | (2006.01) |
| *H01L 27/32* | (2006.01) |
| *H01L 51/52* | (2006.01) |

(Continued)

(52) U.S. Cl.
CPC ........ *H01L 25/167* (2013.01); *H01L 25/0753* (2013.01); *H01L 27/322* (2013.01); *H01L 27/3246* (2013.01); *H01L 33/50* (2013.01); *H01L 33/501* (2013.01); *H01L 33/502* (2013.01); *H01L 33/504* (2013.01); *H01L 33/507* (2013.01); *H01L 33/52* (2013.01);
(Continued)

(58) Field of Classification Search
None
See application file for complete search history.

(56) References Cited

U.S. PATENT DOCUMENTS

| | | |
|---|---|---|
| 5,442,254 A | 8/1995 | Jaskie |
| 5,592,358 A | 1/1997 | Shamouilian et al. |

(Continued)

FOREIGN PATENT DOCUMENTS

| | | |
|---|---|---|
| CN | 101587681 A | 11/2009 |
| CN | 102427075 A | 4/2012 |

(Continued)

OTHER PUBLICATIONS

Asano, Kazutoshi, et al., "Fundamental Study of an Electrostatic Chuck for Silicon Wafer Handling" IEEE Transactions on Industry Applications, vol. 38, No. 3, May/Jun. 2002, pp. 840-845.
(Continued)

*Primary Examiner* — Minh-Loan Tran
(74) *Attorney, Agent, or Firm* — Ratan & Tucker, LLP

(57) ABSTRACT

A display and method of manufacture are described. The display may include a substrate including an array of pixels with each pixel including multiple subpixels, and each subpixel within a pixel is designed for a different color emission spectrum. An array of micro LED device pairs are mounted within each subpixel to provide redundancy. An array of wavelength conversion layers comprising phosphor particles are formed over the array of micro LED device pairs for tunable color emission spectrum.

18 Claims, 37 Drawing Sheets

Related U.S. Application Data continuation of application No. 13/920,912, filed on Jun. 18, 2013, now Pat. No. 9,111,464.

(51) Int. Cl.
| | | |
|---|---|---|
| *H01L 33/52* | (2010.01) | |
| *H01L 33/58* | (2010.01) | |
| *H01L 33/54* | (2010.01) | |
| *H01L 33/56* | (2010.01) | |

(52) U.S. Cl.
CPC .............. *H01L 33/54* (2013.01); *H01L 33/56* (2013.01); *H01L 33/58* (2013.01); *H01L 51/5281* (2013.01)

(56) References Cited

U.S. PATENT DOCUMENTS

| | | |
|---|---|---|
| 5,839,187 A | 11/1998 | Sato et al. |
| 5,851,664 A | 12/1998 | Bennett et al. |
| 5,888,847 A | 3/1999 | Rostoker et al. |
| 5,903,428 A | 5/1999 | Grimard et al. |
| 5,996,218 A | 12/1999 | Shamouilian et al. |
| 6,071,795 A | 6/2000 | Cheung et al. |
| 6,335,263 B1 | 1/2002 | Cheung et al. |
| 6,403,985 B1 | 6/2002 | Fan et al. |
| 6,420,242 B1 | 7/2002 | Cheung et al. |
| 6,514,779 B1 | 2/2003 | Ryu et al. |
| 6,521,511 B1 | 2/2003 | Inoue et al. |
| 6,558,109 B2 | 5/2003 | Gibbel |
| 6,613,610 B2 | 9/2003 | Iwafuchi et al. |
| 6,629,553 B2 | 10/2003 | Odashima et al. |
| 6,670,038 B2 | 12/2003 | Sun et al. |
| 6,786,390 B2 | 9/2004 | Yang et al. |
| 6,878,607 B2 | 4/2005 | Inoue et al. |
| 6,911,666 B2 | 6/2005 | Voutsas |
| 7,033,842 B2 | 4/2006 | Haji et al. |
| 7,148,127 B2 | 12/2006 | Oohata et al. |
| 7,160,633 B2 | 1/2007 | Tai et al. |
| 7,199,397 B2 | 4/2007 | Huang et al. |
| 7,208,337 B2 | 4/2007 | Eisert et al. |
| 7,353,596 B2 | 4/2008 | Shida et al. |
| 7,358,158 B2 | 4/2008 | Aihara et al. |
| 7,399,429 B2 | 7/2008 | Liu et al. |
| 7,482,059 B2 | 1/2009 | Peng et al. |
| 7,482,696 B2 | 1/2009 | Shei |
| 7,510,889 B2 | 3/2009 | Pan et al. |
| 7,585,703 B2 | 9/2009 | Matsumura et al. |
| 7,642,710 B2 | 1/2010 | Yao et al. |
| 7,723,764 B2 | 5/2010 | Oohata et al. |
| 7,795,629 B2 | 9/2010 | Watanabe et al. |
| 7,795,804 B2 | 9/2010 | Kim |
| 7,797,820 B2 | 9/2010 | Shida et al. |
| 7,838,410 B2 | 11/2010 | Hirao et al. |
| 7,854,365 B2 | 12/2010 | Li et al. |
| 7,880,184 B2 | 2/2011 | Iwafuchi et al. |
| 7,884,543 B2 | 2/2011 | Doi |
| 7,888,690 B2 | 2/2011 | Iwafuchi et al. |
| 7,906,787 B2 | 3/2011 | Kang |
| 7,910,945 B2 | 3/2011 | Donofrio et al. |
| 7,927,976 B2 | 4/2011 | Menard |
| 7,928,465 B2 | 4/2011 | Lee et al. |
| 7,972,875 B2 | 7/2011 | Rogers et al. |
| 7,989,266 B2 | 8/2011 | Borthakur et al. |
| 7,999,454 B2 | 8/2011 | Winters et al. |
| 8,023,248 B2 | 9/2011 | Yonekura et al. |
| 8,049,410 B2 | 11/2011 | Suh et al. |
| 8,264,777 B2 | 9/2012 | Skipor et al. |
| 8,294,168 B2 | 10/2012 | Park et al. |
| 8,329,485 B2 | 12/2012 | McKean |
| 8,333,860 B1 | 12/2012 | Bibl et al. |
| 8,349,116 B1 | 1/2013 | Bibl et al. |
| 8,415,767 B1 | 4/2013 | Golda et al. |
| 8,415,768 B1 | 4/2013 | Golda et al. |
| 8,415,771 B1 | 4/2013 | Golda et al. |
| 8,426,227 B1* | 4/2013 | Bibl ..................... H01L 33/04 438/25 |
| 8,497,143 B2 | 7/2013 | Han |
| 8,497,512 B2 | 7/2013 | Nakamura et al. |
| 9,111,464 B2 | 9/2015 | Bibl et al. |
| 9,548,332 B2* | 1/2017 | Hu ..................... H01L 27/156 |
| 2001/0029088 A1 | 10/2001 | Odajima et al. |
| 2002/0036471 A1 | 3/2002 | Silvestre |
| 2002/0076848 A1 | 6/2002 | Spooner et al. |
| 2002/0158835 A1 | 10/2002 | Kobayashi et al. |
| 2003/0010975 A1 | 1/2003 | Gibb et al. |
| 2003/0015721 A1 | 1/2003 | Slater, Jr. et al. |
| 2003/0017360 A1 | 1/2003 | Tai et al. |
| 2003/0040142 A1 | 2/2003 | Lin et al. |
| 2003/0094615 A1 | 5/2003 | Yamazaki et al. |
| 2003/0177633 A1 | 9/2003 | Haji et al. |
| 2004/0208210 A1 | 10/2004 | Inoguchi |
| 2004/0227704 A1 | 11/2004 | Wang et al. |
| 2004/0232439 A1 | 11/2004 | Gibb et al. |
| 2005/0017256 A1 | 1/2005 | Slater, Jr. et al. |
| 2005/0078104 A1 | 4/2005 | Matthies et al. |
| 2005/0104530 A1 | 5/2005 | Chung et al. |
| 2005/0116620 A1 | 6/2005 | Kobayashi |
| 2005/0176190 A1 | 8/2005 | Tomoda et al. |
| 2005/0232728 A1 | 10/2005 | Rice et al. |
| 2005/0243039 A1 | 11/2005 | Kwak |
| 2005/0274959 A1 | 12/2005 | Kim et al. |
| 2006/0065905 A1 | 3/2006 | Eisert et al. |
| 2006/0071225 A1 | 4/2006 | Beeson et al. |
| 2006/0154390 A1 | 7/2006 | Tran et al. |
| 2006/0157721 A1 | 7/2006 | Tran et al. |
| 2006/0160276 A1 | 7/2006 | Brown et al. |
| 2006/0169993 A1 | 8/2006 | Fan et al. |
| 2006/0202210 A1 | 9/2006 | Mok et al. |
| 2006/0208271 A1 | 9/2006 | Kim et al. |
| 2006/0214299 A1 | 9/2006 | Fairchild et al. |
| 2006/0238463 A1 | 10/2006 | Kim et al. |
| 2007/0048902 A1 | 3/2007 | Hiatt et al. |
| 2007/0063644 A1 | 3/2007 | Kim |
| 2007/0111324 A1 | 5/2007 | Nie et al. |
| 2007/0166851 A1 | 7/2007 | Tran et al. |
| 2007/0194330 A1 | 8/2007 | Ibbetson et al. |
| 2008/0093606 A1 | 4/2008 | Pan et al. |
| 2008/0142817 A1 | 6/2008 | Ibbetson et al. |
| 2008/0163481 A1 | 7/2008 | Shida et al. |
| 2008/0194054 A1 | 8/2008 | Lin et al. |
| 2008/0196237 A1 | 8/2008 | Shinya et al. |
| 2008/0283190 A1 | 11/2008 | Papworth et al. |
| 2008/0303038 A1 | 12/2008 | Grotsch et al. |
| 2009/0014748 A1 | 1/2009 | Hirao et al. |
| 2009/0028993 A1 | 1/2009 | Chan et al. |
| 2009/0068774 A1 | 3/2009 | Slater et al. |
| 2009/0114934 A1 | 5/2009 | Horng et al. |
| 2009/0140282 A1 | 6/2009 | Wu et al. |
| 2009/0146303 A1 | 6/2009 | Kwon |
| 2009/0230383 A1 | 9/2009 | Meng et al. |
| 2009/0284501 A1 | 11/2009 | Nathan et al. |
| 2009/0289963 A1 | 11/2009 | Minami et al. |
| 2009/0303713 A1 | 12/2009 | Chang et al. |
| 2009/0314991 A1 | 12/2009 | Cho et al. |
| 2010/0051910 A1 | 3/2010 | Choi |
| 2010/0105172 A1 | 4/2010 | Li et al. |
| 2010/0167441 A1 | 7/2010 | Ray et al. |
| 2010/0188794 A1 | 7/2010 | Park et al. |
| 2010/0203659 A1 | 8/2010 | Akaike et al. |
| 2010/0203661 A1 | 8/2010 | Hodota |
| 2010/0248484 A1 | 9/2010 | Bower et al. |
| 2010/0270567 A1 | 10/2010 | Emerson et al. |
| 2010/0276726 A1 | 11/2010 | Cho et al. |
| 2010/0309100 A1 | 12/2010 | Cok et al. |
| 2010/0321640 A1 | 12/2010 | Yeh et al. |
| 2011/0001148 A1 | 1/2011 | Sun et al. |
| 2011/0003410 A1 | 1/2011 | Tsay et al. |
| 2011/0012141 A1 | 1/2011 | Le Toquin et al. |
| 2011/0049540 A1 | 3/2011 | Wang et al. |
| 2011/0057866 A1 | 3/2011 | Konicek |
| 2011/0089810 A1 | 4/2011 | Su |
| 2011/0114969 A1 | 5/2011 | Lee et al. |
| 2011/0151602 A1 | 6/2011 | Speier |

(56) References Cited

U.S. PATENT DOCUMENTS

| | | |
|---|---|---|
| 2011/0159615 A1 | 6/2011 | Lai |
| 2011/0198598 A1 | 8/2011 | Kim et al. |
| 2011/0210351 A1 | 9/2011 | Kim et al. |
| 2011/0210357 A1 | 9/2011 | Kaiser et al. |
| 2011/0242083 A1 | 10/2011 | Chiou |
| 2011/0266561 A1 | 11/2011 | Rogers et al. |
| 2011/0284867 A1 | 11/2011 | Tran et al. |
| 2011/0297975 A1 | 12/2011 | Yeh et al. |
| 2011/0299044 A1 | 12/2011 | Yeh et al. |
| 2012/0018746 A1 | 1/2012 | Hsieh |
| 2012/0032573 A1 | 2/2012 | Lai |
| 2012/0064642 A1 | 3/2012 | Huang et al. |
| 2012/0087108 A1 | 4/2012 | Ke et al. |
| 2012/0092389 A1 | 4/2012 | Okuyama |
| 2012/0132944 A1 | 5/2012 | Hsieh et al. |
| 2012/0134065 A1 | 5/2012 | Furuya et al. |
| 2012/0146030 A1 | 6/2012 | You et al. |
| 2012/0155076 A1 | 6/2012 | Li et al. |
| 2012/0161113 A1 | 6/2012 | Lowenthal et al. |
| 2012/0168714 A1 | 7/2012 | Chu et al. |
| 2012/0168776 A1 | 7/2012 | Nakamura et al. |
| 2012/0223875 A1* | 9/2012 | Lau .................. H01L 27/156 345/83 |
| 2012/0250304 A1 | 10/2012 | Harbers et al. |
| 2012/0286208 A1 | 11/2012 | McKean et al. |
| 2012/0326188 A1 | 12/2012 | Han |
| 2013/0056867 A1 | 3/2013 | Pagaila et al. |
| 2013/0069098 A1 | 3/2013 | Hikosaka et al. |
| 2013/0126081 A1 | 5/2013 | Hu et al. |
| 2013/0126891 A1 | 5/2013 | Bibl et al. |
| 2013/0187179 A1 | 7/2013 | Tan et al. |
| 2013/0210194 A1 | 8/2013 | Bibl et al. |
| 2013/0214297 A1 | 8/2013 | Yang et al. |
| 2013/0240880 A1 | 9/2013 | Lee et al. |
| 2013/0285082 A1 | 10/2013 | Bierhuizen |
| 2013/0285086 A1 | 10/2013 | Hu et al. |
| 2014/0027709 A1 | 1/2014 | Higginson et al. |
| 2014/0062315 A1 | 3/2014 | Tischler et al. |
| 2014/0084240 A1 | 3/2014 | Hu et al. |
| 2014/0084482 A1 | 3/2014 | Hu et al. |
| 2014/0159043 A1 | 6/2014 | Sakariya et al. |
| 2014/0159064 A1 | 6/2014 | Sakariya et al. |
| 2014/0159067 A1 | 6/2014 | Sakariya et al. |
| 2014/0339495 A1 | 11/2014 | Bibl et al. |

FOREIGN PATENT DOCUMENTS

| | | |
|---|---|---|
| CN | 101839401 A | 9/2012 |
| CN | 102751275 A | 10/2012 |
| EP | 1780798 A1 | 5/2007 |
| JP | 05-291624 A | 11/1993 |
| JP | 07-060675 A | 3/1995 |
| JP | 08-045972 A | 2/1996 |
| JP | 3406207 | 5/1999 |
| JP | 2001-298072 A | 10/2001 |
| JP | 2001-353682 A | 12/2001 |
| JP | 2002-134822 A | 5/2002 |
| JP | 2002-164695 A | 6/2002 |
| JP | 2002-176291 A | 6/2002 |
| JP | 2002-240943 A | 8/2002 |
| JP | 2004-095944 A | 3/2004 |
| JP | 2004-303706 A | 10/2004 |
| JP | 2007-173408 A | 7/2007 |
| JP | 2008-200821 A | 9/2008 |
| JP | 2010-056458 A | 3/2010 |
| JP | 2010-157638 A | 7/2010 |
| JP | 2010-186829 A | 8/2010 |
| JP | 2013-098458 A | 5/2013 |
| KR | 10-0610632 B1 | 8/2006 |
| KR | 10-2007-0042214 A | 4/2007 |
| KR | 10-2007-0093091 A | 9/2007 |
| KR | 10-0973928 B1 | 8/2010 |
| KR | 2010-0089115 A | 8/2010 |
| KR | 10-1001454 B1 | 12/2010 |
| KR | 10-2007-0006885 A | 1/2011 |
| KR | 10-2011-0084888 A | 7/2011 |
| KR | 10-1051488 B1 | 7/2011 |
| KR | 10-2013-0000506 | 1/2013 |
| WO | WO 98-48319 A1 | 10/1998 |
| WO | WO 03-012884 A1 | 2/2003 |
| WO | WO 2005-099310 A2 | 10/2005 |
| WO | WO 2010/149027 A1 | 12/2010 |
| WO | WO 2011/082497 A1 | 7/2011 |
| WO | WO 2011/102030 A1 | 8/2011 |
| WO | WO 2011/123285 | 10/2011 |

OTHER PUBLICATIONS

Bower, C.A., et al., "Active-Matrix OLED Display Backplanes Using Transfer-Printed Microscale Integrated Circuits", IEEE, 2010 Electronic Components and Technology Conference, pp. 1339-1343.

"Characteristics of electrostatic Chuck(ESC)" Advanced Materials Research Group, New Technology Research Laboratory, 2000, pp. 51-53 accessed at http://www.socnb.com/report/ptech_e/2000p51_e.pdf.

Guerre, Roland, et al, "Selective Transfer Technology for Microdevice Distribution" Journal of Microelectromechanical Systems, vol. 17, No. 1, Feb. 2008, pp. 157-165.

Han, Min-Koo, "AM backplane for AMOLED" Proc. of ASID '06, Oct. 8-12, New Delhi, pp. 53-58.

Harris, Jonathan H., "Sintered Aluminum Nitride Ceramics for High-Power Electronic Applications" Journal of the Minerals, Metals and Materials Society, vol. 50, No. 6, Jun. 1998, p. 56.

Horwitz, Chris M., "Electrostatic Chucks: Frequently Asked Questions" Electrogrip, 2006, 10 pgs, accessed at www.electrogrip.com.

Hossick-Schott, Joachim, "Prospects for the ultimate energy density of oxide-based capacitor anodes" Proceedings of CARTS Europe, Barcelona, Spain, 2007, 10 pgs.

Lee, San Youl, et al., "Wafer-level fabrication of GAN-based vertical light-emitting diodes using a multi-functional bonding material system" Semicond. Sci. Technol. 24, 2009, 4 pgs.

"Major Research Thrust: Epitaxial Layer Transfer by Laser Lift-off" Purdue University, Heterogeneous Integration Research Group, accessed at https://engineering.purdue.edu/HetInt/project_epitaxial_layer_transfer_llo.htm, last updated Aug. 2003.

Mei, Zequn, et al., "Low-Temperature Solders" Hewlett-Packard Journal, Article 10, Aug. 1996, pp. 1-10.

Mercado, Lei, L., et al., "A Mechanical Approach to Overcome RF MEMS Switch Stiction Problem" 2003 Electronic Components and Technology Conference, pp. 377-384.

Miskys, Claudio R., et al., "Freestanding GaN-substrates and devices" phys. Stat. sol. © 0, No. 6, 2003, pp. 1627-1650.

"Principles of Electrostatic Chucks: 1—Techniques for High Performance Grip and Release" ElectroGrip, Principles1 rev3 May 2006, 2 pgs, accessed at www.electrogrip.com.

Steigerwald, Daniel, et al., "III-V Nitride Semiconductors for High-Performance Blue and Green Light-Emitting Devices" article appears in journal JOM 49 (9) 1997, pp. 18-23. Article accessed Nov. 2, 2011 at http://www.tms.org/pubs/journals/jom/9709/setigerwald-9709.html, 12 pgs.

Widas, Robert, "Electrostatic Substrate Clamping for Next Generation Semiconductor Devices" Apr. 21, 1999, 4 pgs.

Griffin, C., et al, "Micro-pixellated flip-chip InGaN and AlInGaN light-emitting diodes," Optical Society of America, 2007, 2 pgs.

Patel, Prachi, "Quantum Dots Are Behind New Displays," IEEE Spectrum, accessed at http://spectrum.ieee.org/consumer-electronics/audiovideo/quantum-dots-are-behind-new-displays, Jun. 13, 2012, updated Jul. 17, 2012, 3 pgs.

Pickett, et al., "Matters—Commercial volumes of quantum dots: controlled nanoscale synthesis and micron-scale applications," Nanoco Group PLC, accessed at http://www.nanocotechnologies.com/content/Library/NewsandEvents/articles/Material_Matters_Commercial_volumes_of_quantum_dots_controlled_nanoscale_synthesis_and_microscale_applications/45.aspx, Dec. 13, 2007, 6 pgs.

(56) References Cited

OTHER PUBLICATIONS

PCT International Search Report and Written Opinion for International Application No. PCT/US2014/041487, dated Sep. 23, 2014, 8 pages.

Geffroy, et al., "Organic light-emitting diode (OLED) technology: materials, devices and display technologies," 2006 Society of Chemical Industry, pp. 572-582.

Gohda, et al., "58.3: A 3.6-in. 202-ppi Full-Color AMPLED Display Fabricated by Ink-Jet Method," 2006 SID Digest, pp. 1767-1770.

Ohara, et al., "4.0-inch Active-Matrix Organic Light-Emitting Diode Display Integrated with Driver Circuits Using Amorphous In—Ga—Zn-Oxide Thin-Film Transistors with Suppressed Variation," 2010 The Japan Society of Applied Physics, pp. 1-6.

Hekmatshoar, et al., "A novel TFT-OLED integration for OLED-independent pixel programming in amorphous-Si AMOLED pixels," 2008, Society for Information Display, Journal of the SID 16/1, pp. 183-188.

Sarma, et al., "Active Matrix OLED Using 150° C. a-Si TFT Backplane Built on Flexible Plastic Substrate," SPIE Symp. on Aerospace/Defense Sending, Orlando, FL, Apr. 2003, and to be published in SPIE Proc., vol. 5080, paper 24 (2003), 12 pgs.

"Line Scan Imaging Basics—Application Note," DALSA—Technology with vision, 11 pgs., [n.d.], PDF metadata indicates document creation date Jan. 21, 2003.

Kipman, Yair, "Dot placement Analysis Using a Line Scan Camera and Rigid Body Rotation," ImageXpert Inc., Nashua, NH, USA, 4 pgs., [n.d.], PDF metadata indicates document creation date May 10, 2004.

"Optical Coating," Wikipedia.org. Retrieved by Examiner from http://en.wikipedia.org/wiki/Optical_coating May 27, 2014, 6 pages.

Furman, et al., "A High Concentration Photovoltaic Module Utilizing Micro-Transfer Printing and Surface Mount Technology" Photovoltaic Specialists Conference (PVSC), 2010 35th IEEE, 2010, pp. 000475-000480.

Tsujimura, et al., "4.3 Passive-Matrix OLED Display" OLED Displays: Fundamentals and Applications, 2012, pp. 91-109, John Wiley & Sons, Inc., Hoboken, New Jersey, USA.

Yoo, et al., "Flexible GaN LED on a Polymide Substrate for Display Applications" Quantum Sensing and Nanophotonic Devices IX, edited by Manijeh Razeghi, et al., 2012, Proc. of SPIE vol. 8268, pp. 82681Y-1 to 82681Y-6.

Long, K., et al., "Active-Matrix Amorphous-Silicon TFT Arrays at 180° C. on Clear Plastic and Glass Substrates for Organic Light-Emitting Displays," IEEE Transactions on Electron Devices, vol. 53, No. 8, Aug. 2006, pp. 1789-1796.

Seong, Ryu-Gi, et al., "Flexible AMOLED Backplane Technology Using Pentacene TFT's," Proc. Int. Symp. Super-Functionality Organic Devices IPAP Conf. Series 6, pp. 146-149.

PCT International Preliminary Report on Patentability for International Application No. PCT/US2014/041487, dated Dec. 30, 2015, 6 pages.

\* cited by examiner

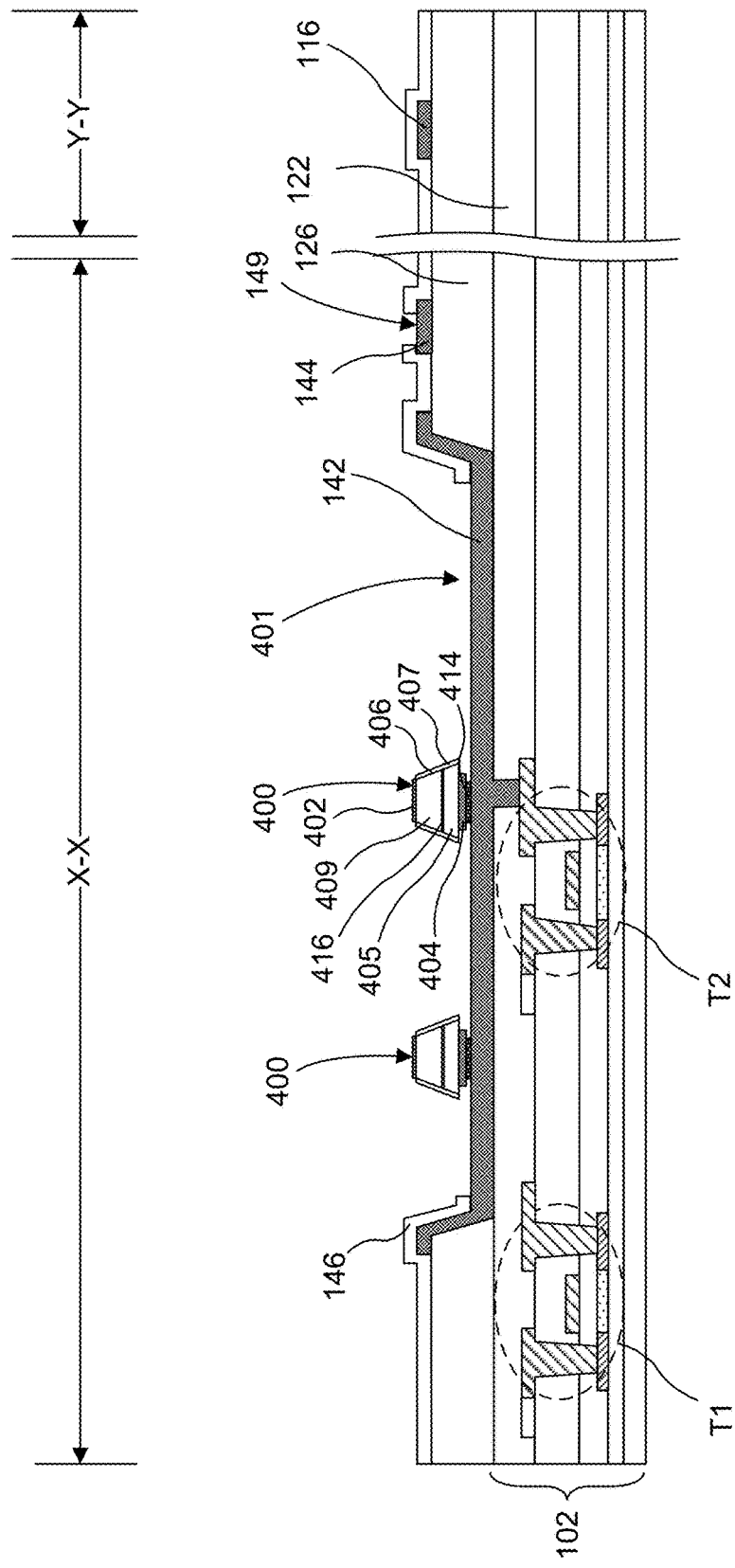

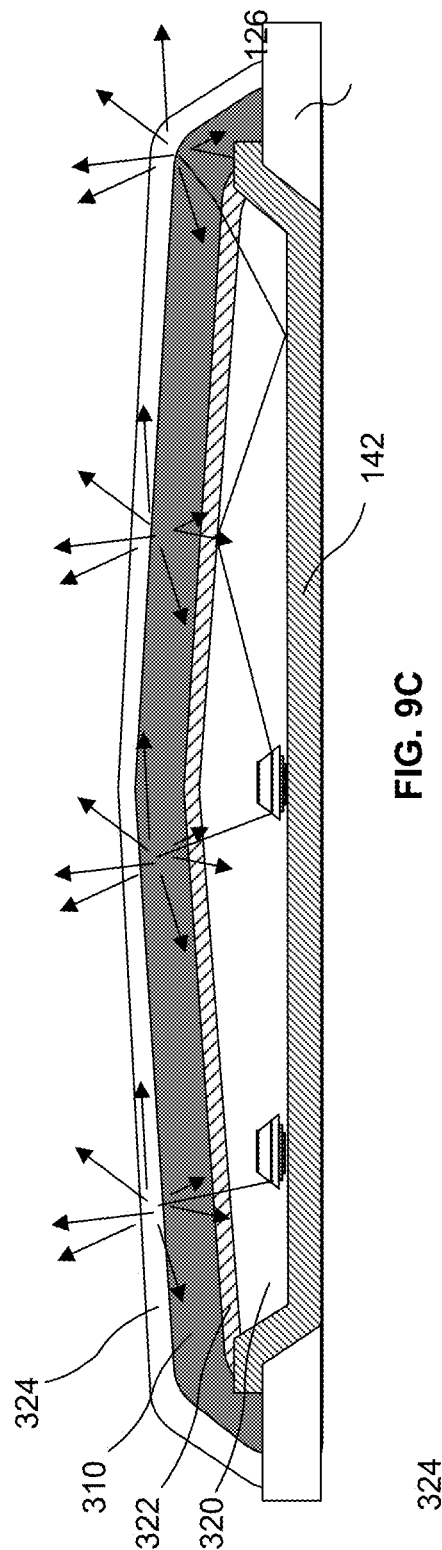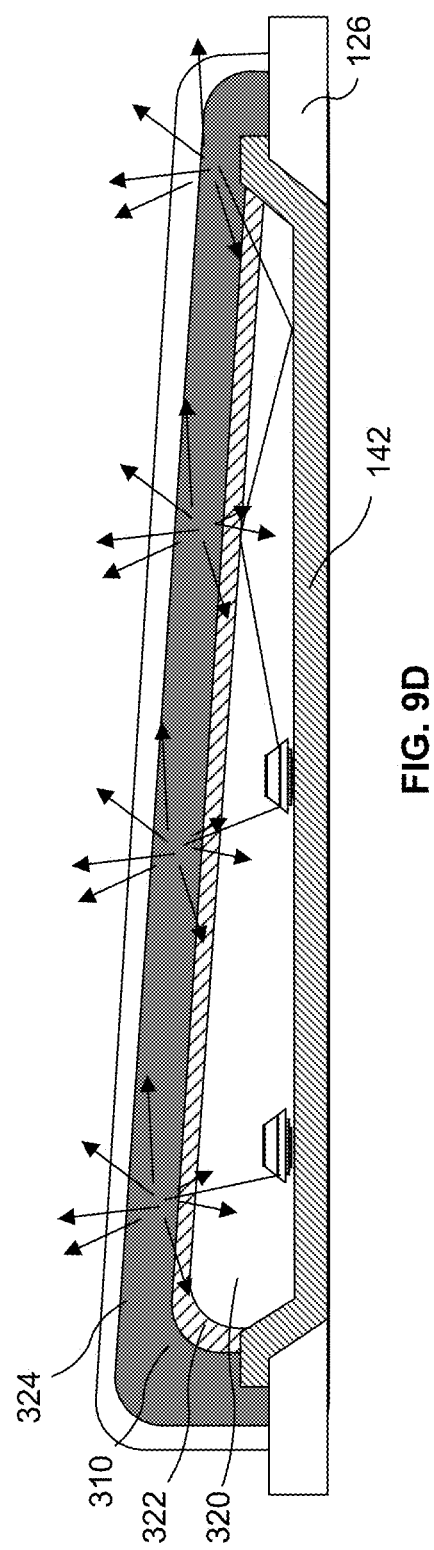

LED DISPLAY WITH WAVELENGTH CONVERSION LAYER

RELATED APPLICATIONS

This application is a continuation of co-pending U.S. patent application Ser. No. 14/811,417, filed Jul. 28, 2015, which is a continuation of U.S. patent application Ser. No. 13/920,912, filed on Jun. 18, 2013, now U.S. Pat. No. 9,111,464 which is herein incorporated by reference.

BACKGROUND

Field

The present invention relates to micro LED devices. More particularly embodiments of the present invention relate to methods and structures for integrating micro LED devices onto a substrate with tunable color emission spectrum.

Background Information

Quantum dots are semiconductor nanocrystals that can be tuned to emit light throughout the visible and infrared spectrum. Due to the small size of 1 to 100 nm, more typically 1 to 20 nm, quantum dots display unique optical properties that are different from those of the corresponding bulk material. The wavelength, and hence color, of the photo emission is strongly dependent on the size of a quantum dot. For an exemplary cadmium selenide (CdSe) quantum dot, light emission can be gradually tuned from red for a 5 nm diameter quantum dot, to the violet region for a 1.5 nm quantum dot. There are generally two types of schemes for quantum dot (QD) excitation. One uses photo excitation, and the other uses direct electrical excitation.

One proposed implementation for quantum dots is integration into the backlighting of a liquid crystal display (LCD) panel. Current white light emitting diode (LED) backlight technology for LCD panels utilizes a cerium doped YAG:Ce (yttrium aluminum garnet) down-conversion phosphor layer over a plurality of blue emitting LED chips. The combination of blue light from the LED chips and a broad yellow emission from the YAG:Ce phosphor results in a near white light. It has been proposed to replace the YAG:Ce phosphor with a blend of quantum dots to achieve the white backlighting. U.S. Pat. No. 8,294,168 describes arranging a quantum dot sealing package over a package including a row of light emitting device chips in an edge-type backlight unit light source module. The light source module is positioned at an edge of the LED display panel so that it emits light through a side surface of a light guide plate behind the LED display panel, where the light is reflected toward the LCD display panel.

SUMMARY OF THE INVENTION

A display panel with one or more wavelength conversion layers and redundancy scheme are disclosed. In an embodiment a display panel includes a display substrate including an array of pixels, with each pixel including multiple subpixels, and each subpixel is designed for a different emission spectrum. For example, such a configuration may be a red-green-blue (RGB) pixel, including a subpixel designed for red emission, a subpixel designed for green emission, and a subpixel designed for blue emission. An array of micro LED device pairs are mounted within each subpixel to form a redundancy scheme, and an array of wavelength conversion layers including phosphor particles are formed over the array of micro LED device pairs. Exemplary phosphor particles include quantum dots and particles that exhibit luminescence due to their composition that do not qualify as quantum dots. Exemplary micro LED devices may have a maximum width of 1 μm-100 μm. The array of wavelength conversion layers can include multiple groups of wavelength conversion layers, with each group designed to emit a different color emission spectrum. The different groups of wavelength conversion layers can be separated into different subpixels. For example, in an RGB pixel arrangement, the different groups of wavelength conversion layers can be designed for red, green, and blue emission and separated into the red emission subpixel, green emission subpixel, and blue emission subpixel, respectively.

In some embodiments a wavelength conversion layer is not formed over every micro LED device. For example, some micro LED devices can be "naked" and it is not required to convert the emission spectrum of the micro LED device with a wavelength conversion layer. The micro LED devices can all have the same color emission spectrum, or the array of micro LED devices can include groups of micro LED devices designed to emit different color emission spectra, with the different micro LED device groups separated into different subpixels. Various combinations of micro LED devices color emission spectra and wavelength conversion layer spectra are available. For example, a pixel can include a pair of "naked" red micro LED devices in a red subpixel, a green emission wavelength conversion layer over a blue micro LED device in a green subpixel, and a "naked" blue micro LED device in a blue subpixel, as an example for one of several manners of forming an RGB pixel arrangement with redundancy pairs.

The size and shape of wavelength conversion layers can also be varied. In some embodiments, each wavelength conversion layer is formed over only a single micro LED device. Each wavelength conversion layer may also be formed over both micro LED devices of the redundant pair of micro LED devices in a subpixel. Wavelength conversion layers may assume a dome shaped configuration such as hemispherical outer surface, and may be narrowed or flattened. The wavelength conversion layers can also assume an elongated shape, such as elongated dome shaped. Light distribution layers may be formed between the corresponding micro LED devices and the wavelength conversion layers. In some embodiments the light distribution layers are in the form of light pipes, and may be characterized with a lateral length or width that is greater than a thickness of the light distribution layer. Each light pipe may span over a single subpixel, or multiple subpixels. For example, each light pipe may span over no more than one subpixel and the micro LED device pairs mounted within the subpixel. For example, each light pipe may span over more than one subpixel and the micro LED device pairs mounted within the more than one subpixel. Each light pipe may span over all of the multiple subpixels within a corresponding pixel and the micro LED device pairs mounted within the multiple subpixels of the pixel.

A reflective bank layer may be formed within each subpixel, where each reflective bank layer is independently addressable from working circuitry within the substrate. For example, the display substrate may be a thin film transistor substrate. A ground line may be formed on or within the display substrate. One or more top electrode layers can be formed to electrically connect the array of micro LED device pairs to the ground line. In an embodiment, a first top electrode layer connects the first micro LED device of a pair of micro LED device to the ground line, and a separate top electrode layer connects the second micro LED device of the pair to the ground line. In an embodiment micro LED device irregularities are within the array of micro LED device pairs. Exemplary irregularities can be missing, defective, or contaminated micro LED devices, and a passivation layer can be formed over the plurality of irregularities to electrically insulate them from one or more top electrode layers, which may be formed directly over the irregularities or adjusted so that they are not formed directly over the irregularities. Repair micro LED devices may be formed within the subpixels corresponding to the plurality of micro LED device irregularities.

BRIEF DESCRIPTION OF THE DRAWINGS

FIG. 1C is a schematic side-view illustration of the active matrix display panel of FIG. 1A taken along lines X-X and Y-Y after the transfer of a pair of micro LED devices in accordance with an embodiment of the invention.

FIGS. 9C-9D are cross-sectional side view illustrations of a tapered light pipe around a pair of micro LED devices and a wavelength conversion layer over the tapered light pipe in accordance with embodiments of the invention.

DETAILED DESCRIPTION OF THE INVENTION

Figure 1A:
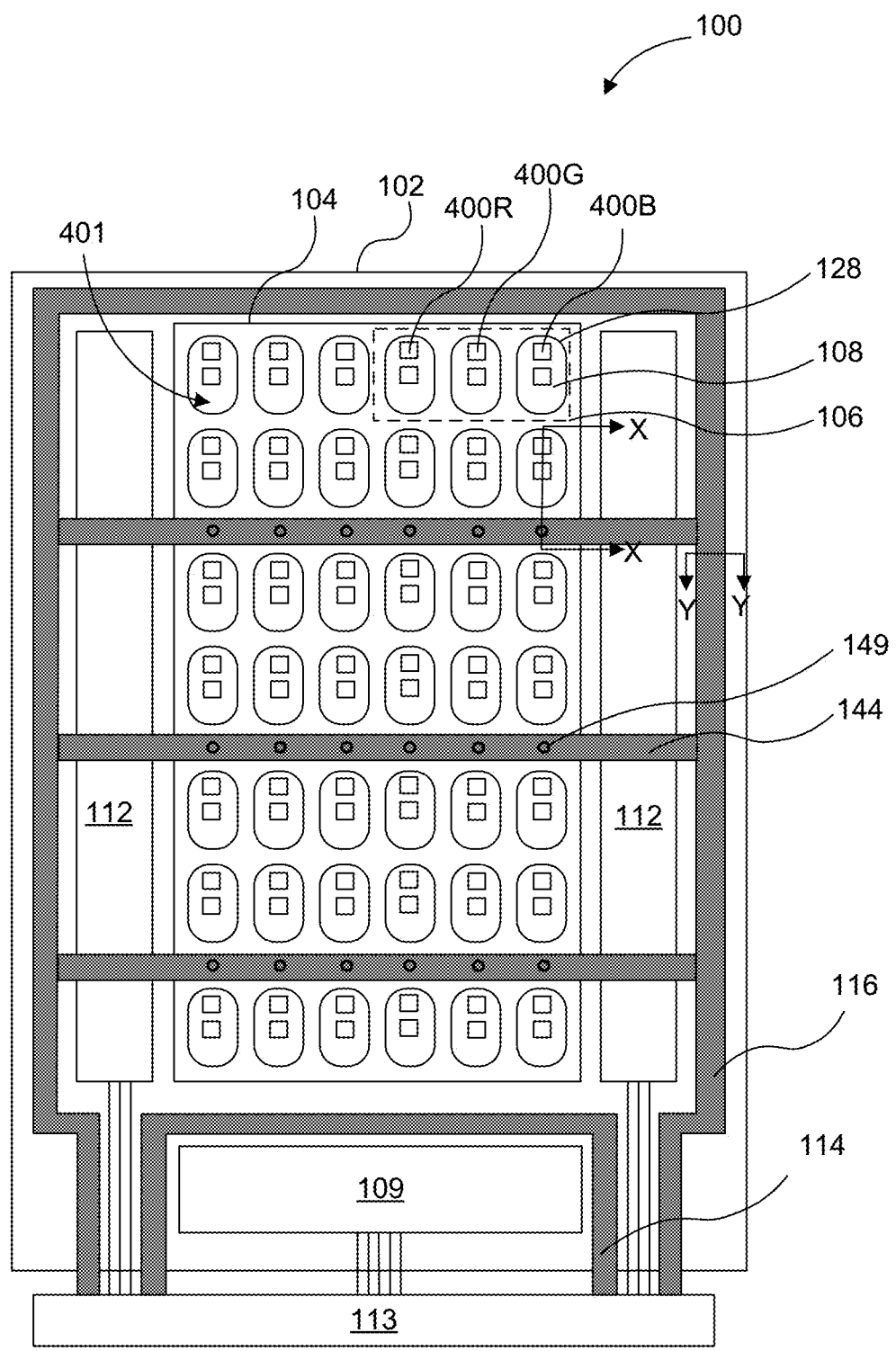
FIG. 1A is a schematic top view illustration of an active matrix display panel in accordance with an embodiment of the invention.

Embodiments of the present invention describe a display in which a display substrate includes an array of pixels, with each pixel including multiple subpixels, and each subpixel within a pixel is designed for a different color emission spectrum. The display includes an array of micro LED device pairs, with a pair of micro LED devices being mounted within each subpixel. An array of wavelength conversion layers comprising phosphor particles are formed over the array of micro LED device pairs. In an embodiment, the wavelength conversion layer includes a polymer or glass matrix and a dispersion of phosphor particles (e.g. quantum dots that exhibit luminescence due to their size, and particles that exhibit luminescence due to their composition) within the matrix. In this manner, the light emission can be accurately tuned to specific colors in the color spectrum, with improved color gamut. In addition, the incorporation of micro LED devices in accordance with embodiments of the invention can be used to combine the performance, efficiency, and reliability of wafer-based LED devices with the high yield, low cost, mixed materials of thin film electronics, for both lighting and display applications. Exemplary micro LED devices which may be utilized with some embodiments of the invention are described in U.S. Pat. No. 8,426,227, U.S. Publication No. 2013/0126081, U.S. patent application Ser. Nos. 13/458,932, 13/711,554, and 13/749,647 all of which are incorporated herein by reference. The micro LED devices are highly efficient at light emission and consume very little power (e.g., 250 mW for a 10 inch diagonal display) compared to 5-10 watts for a 10 inch diagonal LCD or OLED display, enabling reduction of power consumption of an exemplary display panel incorporating the micro LED devices and wavelength conversion layers.

In one aspect, embodiments of the invention provide for configurations that allow phosphor particles of different emission spectra to be separated from one another while still providing good color mixing of the light as perceived by the viewer. Separating the phosphor particles from each other in each subpixel can prevent secondary absorption of light emitted from a phosphor particle emitting a different spectrum (e.g. absorption of green light emitted from a green emitting phosphor particle by a red emitting phosphor particle). This may increase efficiency and reduce unintended color shift. In the micro LED device systems in accordance with embodiments of the invention the spatial color separation between different color emitting areas (e.g. subpixels) can be small enough (e.g. approximately 100 μm or less) that it will not be perceived by the human eye. In this manner, the "micro" LED device scale enables the arrangement of micro LED devices, light distribution layers, and wavelength conversion layers including phosphor particles with small enough pitch (e.g. approximately 100 μm or less) between adjacent micro LED devices or subpixels that the spatial color separation is not perceived by the human eye. In such a configuration, spatially non-uniform color of the light source often associated with non-micro LED device systems can be avoided.

In another aspect, embodiments of the invention describe a light distribution layer formed over one or more micro LED devices that allows the light emitted from a micro LED device to spread out prior to entering the wavelength conversion layer, and also decrease the optical intensity of light entering the wavelength conversion layer (and color filter). The spread out light may result in more even emission from the wavelength conversion layer to be formed over the transparent light distribution layer. Consequently reduction of the optical density may reduce thermal degradation of the phosphor particles in wavelength conversion layer, prolonging lifetime of the light emitting device. This may also increase the chances of color conversion by the phosphor particles in the wavelength conversion layer without having to increase the volume loading of the phosphor particles in the wavelength conversion layer. Spreading out of the light and reduction of the optical intensity may also reduce the amount of back reflection and emission from the wavelength conversion layer that is absorbed by a micro LED device. In accordance with embodiments of the invention, inclusion of the light distribution layer may increase total light emission, increase emission uniformity, and increase sharpness of the color spectrum for the display.

In another aspect, embodiments of the invention describe light pipe configurations that can increase the fill factor for micro LED devices, pixels, or subpixels including micro LED devices. Wafer-based LED devices can be characterized as point sources, where light emission occupies a small area and has a concentrated output. If wafer-based LED devices are secured far enough apart that they can be perceived by the human eye (e.g. approximately 100 μm or more) it may be possible that the light emitted from the individual LED devices is perceived as small dots. The light pipe configurations described in accordance with embodiments of the invention can be used to increase the fill factor for micro LED devices, pixels, or subpixels including micro LED devices, so that the individual micro LED devices are not distinguishable by the human eye, and small dots are not perceived.

In another aspect, embodiments of the invention describe a redundancy scheme in which a plurality of bonding sites are available for bonding a plurality of micro LED devices within each subpixel, for example, within each bank opening for a subpixel. In an embodiment, the redundancy scheme includes bonding layers (e.g. indium posts) at a pair of bonding sites (or more) within a bank opening, with each bonding layer designed to receive a separate micro LED device. In an embodiment, the redundancy scheme can also include a repair bonding site within the bank opening that is large enough to receive a micro LED device. The repair bonding site may also optionally include a bonding layer. In this manner, in an embodiment, each bank opening may correspond to a single emission color of a subpixel, and receives a plurality of micro LED devices of the emission color. If one of the micro LED devices of a pair of micro LED devices mounted within a subpixel is defective, then the other micro LED device compensates for the defective micro LED device. In addition, the repair bonding site may be used to bond an additional micro LED device if desired. In one embodiment, a redundancy and repair configuration is integrated into a backplane structure which can improve emission uniformity across the display panel without having to alter the underlying thin film transistor (TFT) architecture already incorporated in conventional active matrix organic light emitting diode (AMOLED) displays. Thus, embodiments of the invention may be compatible with conventional TFT backplane technology of AMOLED displays where the micro LED devices replace the organic emission layers of AMOLED display technology.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "one embodiment" means that a particular feature, structure, configuration, or characteristic described in connection with the embodiment is included in at least one embodiment of the invention. Thus, the appearances of the phrase "in one embodiment" in various places throughout this specification are not necessarily referring to the same embodiment of the invention. Furthermore, the particular features, structures, configurations, or characteristics may be combined in any suitable manner in one or more embodiments.

The terms "spanning", "over", "to", "between" and "on" as used herein may refer to a relative position of one layer with respect to other layers. One layer "spanning", "over", or "on" another layer or bonded "to" another layer may be directly in contact with the other layer or may have one or more intervening layers. One layer "between" layers may be directly in contact with the layers or may have one or more intervening layers.

Referring now to FIGS. 1A-1D schematic top and side-view illustrations are provided of an active matrix display panel in accordance with an embodiment of the invention. In such an embodiment, the underlying TFT substrate 102 can be similar to those in a typical AMOLED backplane including working circuitry (e.g. T1, T2). Referring to FIG. 1A, panel 100 may generally include a pixel area 104 including pixels 106 and subpixels 108 arranged in a matrix, and working circuitry connected to each subpixel for driving and switching the subpixels. The non-pixel area generally includes a data driver circuit 109 connected to a data line of each subpixel to enable data signals (Vdata) to be transmitted to the subpixels, a scan driver circuit 112 connected to scan lines of the subpixels to enable scan signals (Vscan) to be transmitted to the subpixels, a power supply line 114 to transmit a power signal (Vdd) to the TFTs, and a ground ring 116 to transmit a ground signal (Vss) to the array of subpixels. As shown, the data driver circuit, scan driver circuit, power supply line, and ground ring are all connected to a flexible circuit board (FCB) 113 which includes a power source for supplying power to the power supply line 114 and a power source ground line electrically connected to the ground ring 116. In accordance with embodiments of the invention, each of the subpixels 108 may be individually addressed with the corresponding underlying TFT circuitry while a uniform ground signal is supplied to the top of the pixel area 104.

Figure 1B:
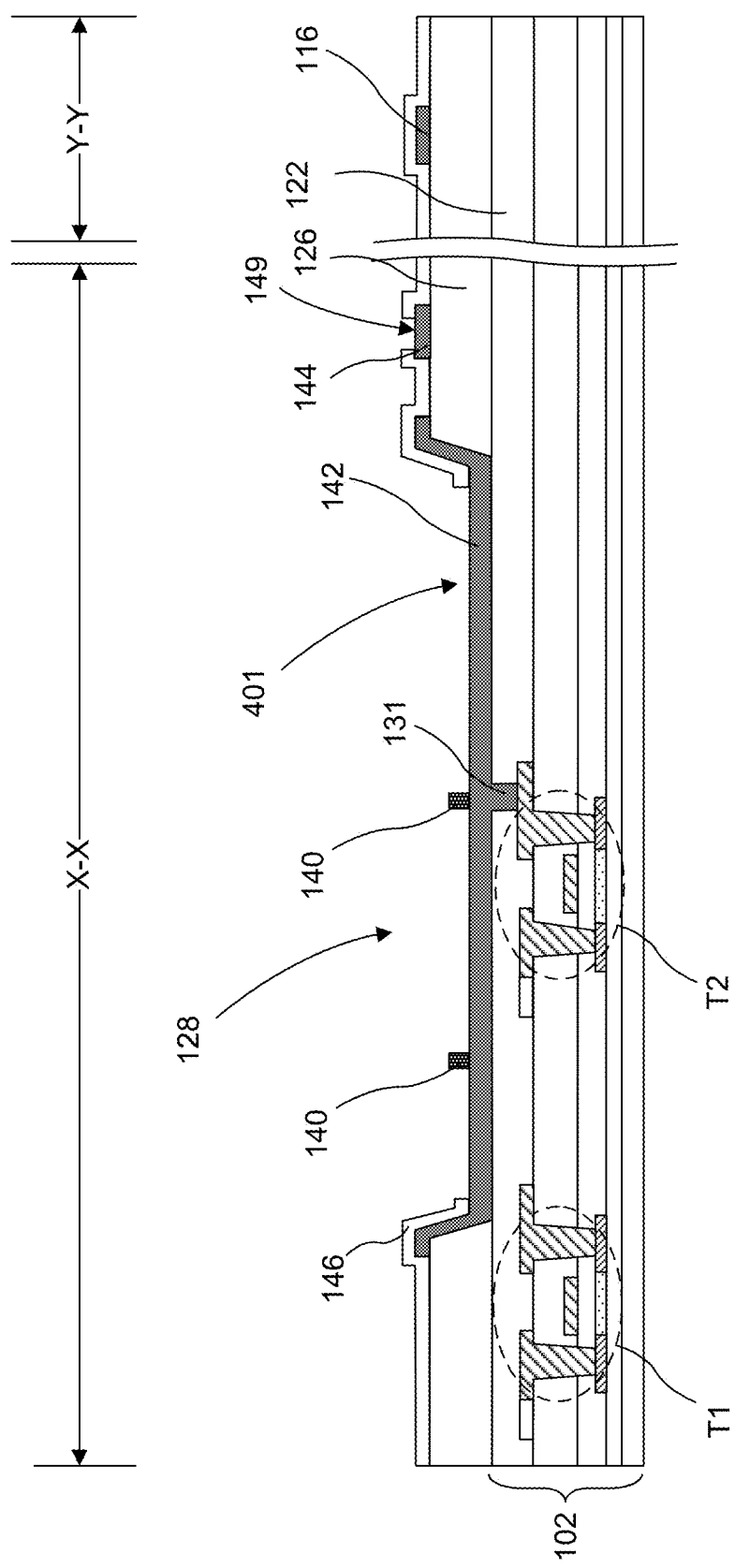
FIG. 1B is a schematic side-view illustration of the active matrix display panel of FIG. 1A taken along lines X-X and Y-Y prior to the transfer of a pair of micro LED devices in accordance with an embodiment of the invention.
Figure 1D:
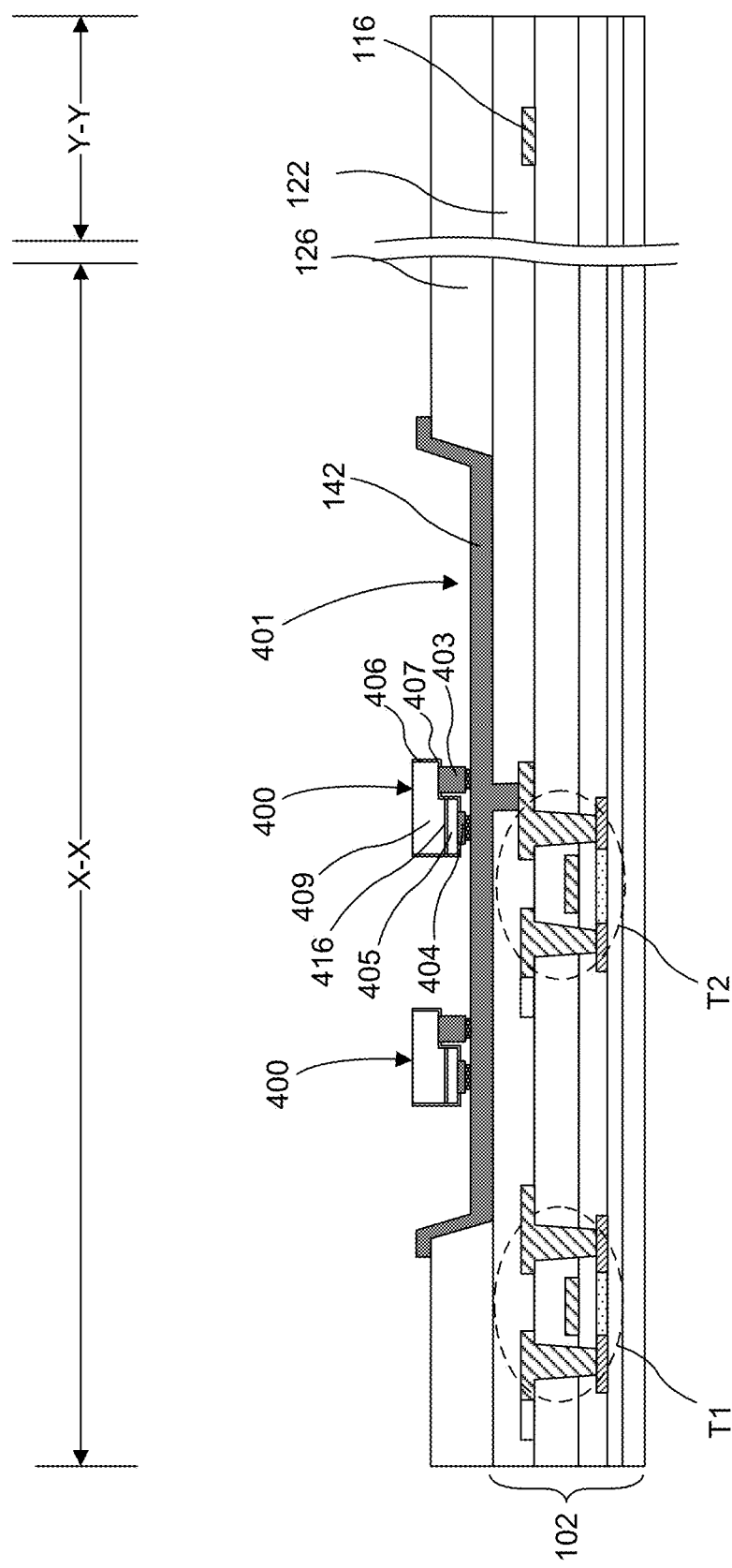
FIG. 1D is a schematic side-view illustration of an active matrix display panel similar to FIG. 1A taken along lines X-X and Y-Y after the transfer of a pair of micro LED devices in accordance with an embodiment of the invention.

Referring now to FIGS. 1B-1D, openings 131 may be formed in the planarization layer 122 to contact the working circuitry. Exemplary planarization materials include benzocyclobutene (BCB) and acrylic. The working circuitry can include traditional 2T1C (two transistors, one capacitor) circuits including a switching transistor, a driving transistor, and a storage capacitor. It is to be appreciated that the 2T1C circuitry is meant to be exemplary, and that other types of circuitry or modifications of the traditional 2T1C circuitry are contemplated in accordance with embodiments of the invention. For example, more complicated circuits can be used to compensate for process variations of the driver transistor and the micro LED devices, or for their instabilities. Furthermore, while embodiments of the invention are described and illustrated with regard to top gate transistor structures in the TFT substrate 102, embodiments of the invention also contemplate the use of bottom gate transistor structures. Likewise, while embodiments of the invention are described and illustrated with regard to a top emission structure, embodiments of the invention also contemplate the use of bottom, or both top and bottom emission structures. In addition, embodiments of the invention are described and illustrated below specifically with regard to a high side drive configuration including ground tie lines and ground ring. In a high side drive configuration a LED may be on the drain side of a PMOS driver transistor or a source side of an NMOS driver transistor so that the circuit is pushing current through the p-terminal of the LED. Embodiments of the invention are not so limited may also be practiced with a low side drive configuration in which case the ground tie lines and ground ring become the power line in the panel and current is pulled through the n-terminal of the LED.

A patterned bank layer 126 including bank openings 128 is formed over the planarization layer 122. Bank layer 126 may be formed by a variety of techniques such as ink jet printing, screen printing, lamination, spin coating, CVD, and PVD. Bank layer 126 may be opaque, transparent, or semi-transparent to the visible wavelength. Bank layer 126 may be formed of a variety of insulating materials such as, but not limited to, photo-definable acrylic, photoresist, silicon oxide ($SiO_2$), silicon nitride ($SiN_x$), poly(methyl methacrylate) (PMMA), benzocyclobutene (BCB), polyimide, acrylate, epoxy, and polyester. In an embodiment, bank layer is formed of an opaque material such as a black matrix material. Exemplary insulating black matrix materials include organic resins, glass pastes, and resins or pastes including a black pigment, metallic particles such as nickel, aluminum, molybdenum, and alloys thereof, metal oxide particles (e.g. chromium oxide), or metal nitride particles (e.g. chromium nitride).

In accordance with embodiments of the invention, the thickness of the bank layer 126 and width of the bank openings 128 described with regard to the following figures may depend upon the height of the micro LED devices to be mounted within the opening, height of the transfer heads transferring the micro LED devices, and resolution of the display panel. In an embodiment, the resolution, pixel density, and subpixel density of the display panel may account for the width of the bank openings 128. For an exemplary 55 inch television with a 40 PPI (pixels per inch) and 211 μm subpixel pitch, the width of the bank openings 128 may be anywhere from a few microns to 206 μm to account for an exemplary 5 μm wide surrounding bank structure between bank openings 128. For an exemplary display panel with 440 PPI and a 19 μm subpixel pitch, the width of the bank openings 128 may be anywhere from a few microns to 14 μm to account for an exemplary 5 μm wide surrounding bank structure. Width of the bank structure (i.e. between bank openings 128) may be any suitable size, so long as the structure supports the required processes and is scalable to the required PPI.

Table 1 provides a list of exemplary implementations in accordance with embodiments of the invention for various red-green-blue (RGB) displays with 1920×1080 p and 2560×1600 resolutions. In the exemplary embodiments, the 40 PPI pixel density may correspond to a 55 inch 1920×1080 p resolution television, and the 326 and 440 PPI pixel density may correspond to a handheld device with RETINA (RTM) display. It is to be appreciated that embodiments of the invention are not limited to RGB color schemes or the 1920×1080 p or 2560×1600 resolutions, and that the specific resolution and RGB color scheme is for illustrational purposes only.

TABLE 1

| Display Substrate | Pixel Pitch (x, y) | Sub-Pixel pitch (x, y) | Pixels per inch (PPI) | Possible transfer head array pitch |
|---|---|---|---|---|
| 55" 1920 × 1080 | (634 μm, 634 μm) | (211 μm, 634 μm) | 40 | X: Multiples or fractions of 211 μm Y: Multiples or fractions of 634 μm |
| 10" 2560 × 1600 | (85 μm, 85 μm) | (28 μm, 85 μm) | 299 | X: Multiples or fractions of 28 μm Y: Multiples or fractions of 85 μm |
| 4" 640 × 1136 | (78 μm, 78 μm) | (26 μm, 78 μm) | 326 | X: Multiples or fractions of 26 μm Y: Multiples or fractions of 78 μm |
| 5" 1920 × 1080 | (58 μm, 58 μm) | (19 μm, 58 μm) | 440 | X: Multiples or fractions of 19 μm Y: Multiples or fractions of 58 μm |

In accordance with embodiments of the invention, the thickness of the bank layer 126 is not too thick in order for the bank structure to function. Thickness may be determined by the micro LED device height and a predetermined viewing angle. For example, where sidewalls of the bank openings 128 make an angle with the planarization layer 122, shallower angles may correlate to a wider viewing angle of the system. In an embodiment, exemplary thicknesses of the bank layer 126 may be between 1 μm-50 μm. In an embodiment the thickness of the bank layer 126 is within 5 μm of the thickness of the micro LED devices 400.

A patterned conductive layer is then formed over the patterned bank layer 126. In one embodiment the patterned conductive layer includes reflective bank layer 142 formed within the bank openings 128 and in electrical contact with the working circuitry. For example, a reflective bank layer 142 can be formed for each subpixel, wherein each reflective bank layer functions as a bottom electrode and is independently addressable from working circuitry within the substrate. Accordingly, all micro LED devices that are bonded to one reflective bank layer of a subpixel are addressed together. The patterned conductive layer may also optionally include the ground tie lines 144 and/or the ground ring 116. As used herein the term ground "ring" does not require a circular pattern, or a pattern that completely surrounds an object. In addition, while the following embodiments are described and illustrated with regard to a ground line in the form of a ground ring 116 at least partially surrounding the pixel area on three sides, it is to be appreciated that embodiments of the invention can also be practiced with a ground line running along one side (e.g. left, right, bottom, top), or two sides (a combination of two of the left, right, bottom, top) of the pixel area. Accordingly, it is to be appreciated that in the following description the reference to and illustration of a ground ring, could potentially be replaced with a ground line where system requirements permit.

The patterned conductive layer may be formed of a number of conductive and reflective materials, and may include more than one layer. In an embodiment, a patterned conductive layer comprises a metallic film such as aluminum, molybdenum, titanium, titanium-tungsten, silver, or gold, or alloys thereof. In application, the patterned conductive layer may include a stack of layers or metallic films. The patterned conductive layer may include a conductive material such as amorphous silicon, transparent conductive oxides (TCO) such as indium-tin-oxide (ITO) and indium-zinc-oxide (IZO), carbon nanotube film, or a transparent conducting polymer such as poly(3,4-ethylenedioxythiophene) (PEDOT), polyaniline, polyacetylene, polypyrrole, and polythiophene. In an embodiment, the patterned conductive layer includes a stack of a conductive material and a reflective conductive material. In an embodiment, the patterned conductive layer includes a 3-layer stack including top and bottom layers and a reflective middle layer wherein one or both of the top and bottom layers are transparent. In an embodiment, the patterned conductive layer includes a conductive oxide-reflective metal-conductive oxide 3-layer stack. The conductive oxide layers may be transparent. For example, the patterned conductive layer may include an ITO-silver-ITO layer stack. In such a configuration, the top and bottom ITO layers may prevent diffusion and/or oxidation of the reflective metal (silver) layer. In an embodiment, the patterned conductive layer includes a Ti—Al—Ti stack, or a Mo—Al—Mo-ITO stack. In an embodiment, the patterned conductive layer includes an ITO-Ti—Al—Ti-ITO stack. In an embodiment, the patterned conductive layer is 1 µm or less in thickness. The patterned conductive layer may be deposited using a suitable technique such as, but not limited to, PVD.

Following the formation of reflective bank layers 142, ground tie lines 144, and ground ring 116, an insulator layer 146 may then optionally be formed over the TFT substrate 102 covering the sidewalls of the pattered conductive layer. The insulator layer 146 may at least partially cover the bank layer 126 and the reflective bank layer 142, ground tie lines 144, and/or ground ring 116. In the embodiment illustrated the insulator layer 146 completely covers the ground ring 116, however, this is optional.

In an embodiment, the insulator layer 146 is formed by blanket deposition using a suitable technique such as lamination, spin coating, CVD, and PVD, and then patterned using a suitable technique such as lithography to form openings exposing the reflective bank layers 142 and openings 149 exposing the ground tie lines 144. In an embodiment, ink jet printing or screen printing may be used to form the insulator layer 146 and openings in the insulator layer without requiring lithography. Insulator layer 146 may be formed of a variety of materials such as, but not limited to, $SiO_2$, $SiN_x$, PMMA, BCB, polyimide, acrylate, epoxy, and polyester. For example, the insulator layer 146 may be 0.5 µm thick. The insulator layer 146 may be transparent or semi-transparent where formed over the sidewalls of the reflective bank layers 142 within the bank openings 128 as to not significantly degrade light emission extraction of the completed system. Thickness of the insulator layer 146 may also be controlled to increase light extraction efficiency, and also to not interfere with the array of transfer heads during transfer of the array of light emitting devices to the reflective bank structure. As will become more apparent in the following description, the patterned insulator layer 146 is optional, and represents one manner for electrically separating conductive layers.

In the embodiment illustrated in FIG. 1B-1C, the reflective bank layers 142, ground tie lines 144, and ground ring 116 can be formed of the same conductive layer. In another embodiment, the ground tie lines 144 and/or ground ring 116 can be formed of a conductive material different from the reflective bank layer 142. For example, ground tie lines 144 and ground ring 116 may be formed with a material having a higher conductivity than the reflective bank layer 142. In another embodiment, ground tie lines 144 and/or ground ring 116 can also be formed within different layers from the reflective bank layers. The ground tie lines 144 and ground ring 116 can also be formed within or below the patterned bank layer 126. For example, openings may be formed through the patterned bank layer 126 when forming the ground tie lines 144 and ground ring 116. Openings may also be formed through the patterned bank layer 126 and planarization layer 122 to contact the ground tie lines 144. In an embodiment, the ground ring and ground tie lines 144 may have been formed during formation of the working circuitry of the TFT substrate 102. Accordingly, it is to be appreciated that a number of possibilities exist for forming the ground tie lines 144 and ground ring 116.

Referring to the embodiment illustrated in FIG. 1B, a plurality of bonding layers 140 may be formed on the reflective bank layer 142 to facilitate bonding of micro LED devices. In the specific embodiment illustrated two bonding layers 140 are illustrated for bonding a pair of micro LED devices. In an embodiment, the bonding layer 140 is selected for its ability to be inter-diffused with a bonding layer on the micro LED device (yet to be placed) through bonding mechanisms such as eutectic alloy bonding, transient liquid phase bonding, or solid state diffusion bonding as described in U.S. patent application Ser. No. 13/749,647. In an embodiment, the bonding layer 140 has a melting temperature of 250° C. or lower. For example, the bonding layer 140 may include a solder material such as tin (232° C.) or indium (156.7° C.), or alloys thereof. Bonding layer 140 may also be in the shape of a post, having a height greater than width. In accordance with some embodiments of the invention, taller bonding layers 140 may provide an additional degree of freedom for system component leveling, such as planarity of the array of micro LED devices with the TFT substrate during the micro LED device transfer operation and for variations in height of the micro LED devices, due to the change in height of the liquefied bonding layers as they spread out over the surface during bonding, such as during eutectic alloy bonding and transient liquid phase bonding. The width of the bonding layers 140 may be less than a width of a bottom surface of the micro LED devices to prevent wicking of the bonding layers 140 around the sidewalls of the micro LED devices and shorting the quantum well structures.

FIG. 1C is a schematic side-view illustration of the active matrix display panel of FIG. 1A taken along lines X-X and Y-Y after the transfer of a pair of micro LED devices 400 in accordance with an embodiment of the invention. The micro LED devices 400 can be transferred and bonded to the substrate 102 as part of an array of micro LED devices 400 using a variety of techniques including a transfer bonding process, transfer using elastomeric stamps, or transfer and bonding using an electrostatic transfer head array, as described in any of U.S. Pat. Nos. 8,333,860, 8,349,116, 8,415,771, 8,415,767, or 8,415,768. In the following embodiments, description is made with regard to a specific vertical micro LED device 400 structures. It is to be appreciated, that the specific micro LED devices 400 illustrated is exemplary and that embodiments of the invention are not limited. For example, embodiments of the invention may also be practiced with LED devices that are not vertical LED devices. In the particular embodiment illustrated, the micro LED devices 400 include a micro p-n diode between a bottom contact 404 and top contact 402. In an embodiment, the micro p-n diode is several microns thick, such as 30 μm or less, or even 5 μm or less, with the top and bottom contacts 404, 402 being 0.1 μm-2 μm thick. The micro p-n diode may include a n-doped layer 409, a p-doped layer 405, and one or more quantum well layers 416 between the n-doped layer and p-doped layer. In the particular embodiment illustrated in FIG. 1C the n-doped layer 409 is illustrated as being above the p-doped layer 405. Alternatively, the p-doped layer 405 may be above the n-doped layer 409. The micro LED devices 400 may have straight or tapered sidewalls 406 (from top to bottom). The top and bottom contacts 402, 404 may include one or more layers and can be formed of a variety of electrically conducting materials including metals, conductive oxides, and conductive polymers. The top and bottom contacts 402, 404 may be transparent or semi-transparent to the visible wavelength spectrum (e.g. 380 nm-750 nm) or opaque. The top and bottom contacts 402, 404 may optionally include a reflective layer, such as a silver layer. In an embodiment, a conformal dielectric barrier layer 407 may optionally be formed along the sidewalls 406 of the p-n diode to electrically passivate the quantum well 416, and optionally along the top or bottom surface of the micro p-n diode. The conformal dielectric barrier layer 407 may be thinner than the p-n diode so that it forms an outline of the topography of the p-n diode it is formed on. For example, the conformal dielectric barrier layer 407 may be approximately 50-600 angstroms thick aluminum oxide. A bonding layer 414 may be positioned between the micro LED device 400 and the reflective bank layer 142 to facilitate bonding of the bottom contact 404 of micro LED device 400 to the reflective bank layer 142, or other intervening layer. In an embodiment, bonding layer 414 includes a material such as indium, gold, silver, molybdenum, tin, aluminum, silicon, or an alloy or alloys thereof. Bonding layer 414 may be an alloy or intermetallic compound of a micro device bonding layer and a bonding layer 140.

In addition to bonding layers 140, the embodiments illustrated in FIGS. 1A-1C include a repair bonding site 401 within each bank opening 128 that is large enough to receive a micro LED device. In this manner, the plurality of bonding layers 140 and repair bonding site 401 create a redundancy and repair configuration within each bank opening 128. In the particular embodiments illustrated in FIGS. 1A-1C the repair bonding site 401 is illustrated as being a bare surface on the reflective bank layer 142. However, embodiments of the invention are not limited to such. In other embodiments, the repair bonding site 401 may also include a bonding layer 140 similarly as the other two bonding layers 140 described and illustrated for the preexisting redundancy scheme. Accordingly, in some embodiments, bonding layers 140 are provided on the reflective bank layer 142 at the sites of all of the intended micro LED devices in the redundancy scheme, as well as at the repair site 401.

In the embodiments illustrated an arrangement of ground tie lines 144 may run between bank openings 128 in the pixel area 104 of the display panel 100. In addition, a plurality of openings 149 expose the plurality of ground tie lines 144. The number of openings 149 may or may not have a 1:1 correlation to the number of columns (top to bottom) of bank openings 128. For example, in the embodiment illustrated in FIG. 1A, a ground tie opening 149 is formed for each column of bank openings 128, however, this is not required and the number of ground tie openings 149 may be more or less than the number of columns of bank openings 128. Likewise, the number of ground tie lines 144 may or may not have a 1:1 correlation to the number of rows (left to right) of bank openings. For example, in the embodiment illustrated a ground tie line 144 is formed for every two rows of bank openings 128, however, this is not required and the number of ground tie lines 144 may have a 1:1 correlation, or any 1:n correlation to the number (n) of rows of bank openings 128.

While the above embodiments have been described and illustrated with ground tie lines 144 running left and right horizontally across the display panel 100, embodiments are not so limited. In other embodiments, the ground tie lines can run vertically, or both horizontally and vertically to form a grid. A number of possible variations are envisioned in accordance with embodiments of the invention. In accordance with embodiments of the invention, ground tie lines are formed between the bank openings 128 in the pixel area and are electrically connected to the ground ring 116 or ground line in the non-display area. In this manner, the ground signal may be more uniformly applied to the matrix of subpixels, resulting in more uniform brightness across the display panel 100. In addition, by forming the ground tie lines 144 from a material having better electrical conductivity than the top electrode layer (which is yet to be formed), this may reduce the contact resistance in the electrical ground path.

It is to be appreciated, that the specific arrangement of vertical micro LED devices 400 with ground tie lines 144 illustrated in FIGS. 1A-C is exemplary and that embodiments of the invention may also be practiced with other micro LED devices. For example, FIG. 1D illustrates alternative micro LED devices 400 transferred and bonded to display substrate 102 similarly as described above with regard to FIG. 1C. Similar to the micro LED devices of FIG. 1C, the micro LED devices in FIG. 1D includes a micro p-n diode including doped layers 405, 409 opposite one or more quantum well layers 416. Unlike the micro LED devices of FIG. 1C, the micro LED devices in FIG. 1D includes bottom contacts to both the doped layers 405, 409. For example, bottom contact 404 is formed on doped layer 405, and bottom contact 403 is formed on doped layer 409. A conformal dielectric barrier layer 407 may also be optionally formed on the micro LED devices of FIG. 1D, particularly to protect sidewalls 406 including the quantum well layer(s) 416. Since the micro LED devices 400 of FIG. 1D includes bottom contacts for both the n-doped and p-doped layers, the reflective layer 142 may also be separated into two electrically separate layers to make electrical contact with bottom contacts 404, 403, respectively. Accordingly, the micro LED device of FIG. 1D may be implemented within embodiments of the invention where it is not required to have top and bottom contacts, and the micro LED devices can be operably connected with bottom contacts.

Figure 2A:
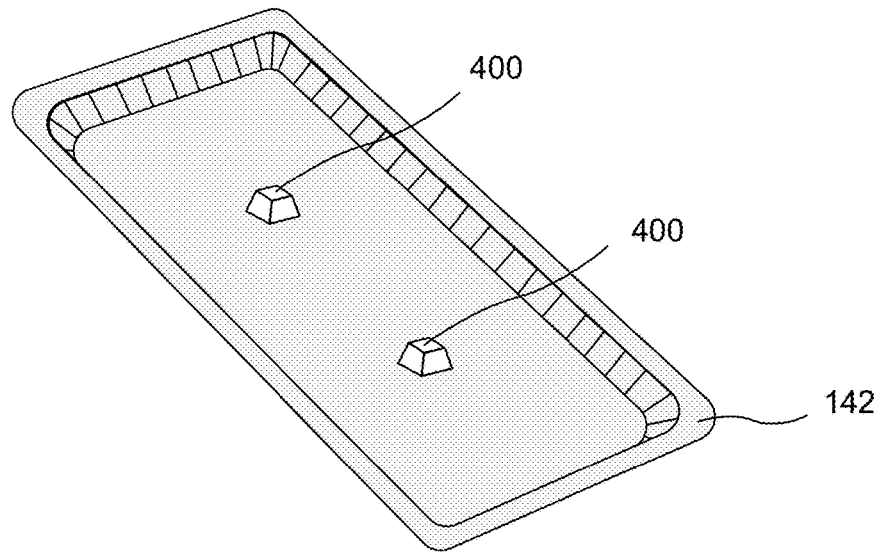
FIGS. 2A-2D are isometric view illustrations of an arrangement of micro LED devices mounted within a reflective bank layer of a subpixel in accordance with embodiments of the invention.
Figure 2B:
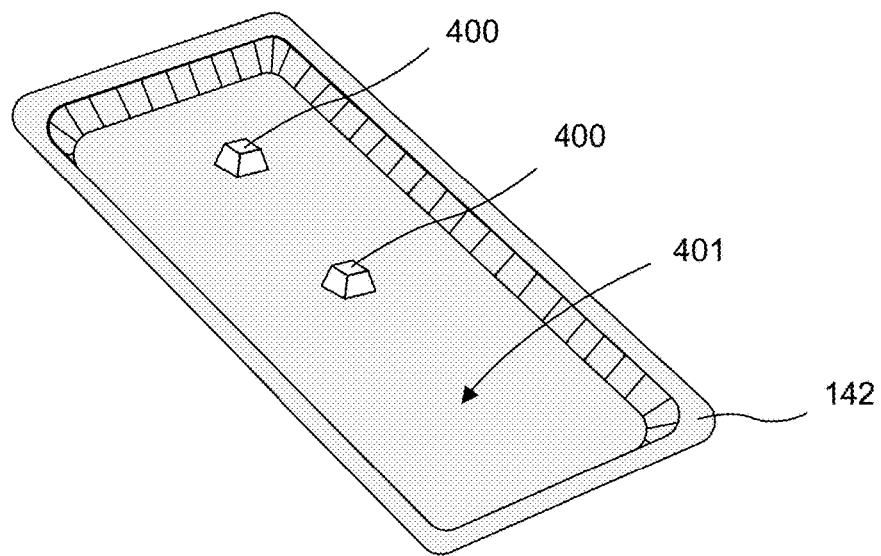

Referring now to FIGS. 2A-2D isometric view illustrations are provided for arrangements of micro LED devices mounted within a reflective bank layer of a subpixel 108 in accordance with embodiments of the invention. FIG. 2A illustrates a reflective bank layer 142 formed along the sidewalls and bottom surface of the bank openings 128 as previously described above, and partially along the top surface of the patterned bank layer 126 adjacent the bank openings 128. In the embodiment illustrated in FIG. 2A, a pair of micro LED devices 400 are mounted within the reflective bank layer 142 such that they are evenly spaced from opposite sidewalls along the length of the bank opening. Accordingly, FIG. 2A is illustrative of an exemplary micro LED device redundancy scheme. In the embodiment illustrated in FIG. 2B, a pair of micro LED devices 400 are mounted within the reflective bank layer 142 so that there is room for an additional micro LED device at a repair bonding site 401. Accordingly, FIG. 2B is illustrative of an exemplary micro LED device redundancy scheme with repair site.

In practical application, it is not expected to always achieve 100% transfer success of the micro LED devices 400 from a carrier substrate to the display substrate 102, and with no defective, missing, or contaminated micro LED devices. In accordance with embodiments of the invention, micro LED devices may be of 1 to 100 μm in scale, for example, having a maximum width of approximately 20 μm, 10 μm, or 5 μm. Such micro LED devices are fabricated so that they are poised for pick up from a carrier substrate and transfer to the display substrate, for example, using an array of electrostatic transfer heads. Defective micro LED devices may result from a variety of reasons, such as contamination, stress fractures, and shorting between conductive layers. Micro LED devices also may not be picked up during the transfer operation due to a variety of reasons, such as non-planarity of the carrier substrate, contamination (e.g. particulates), or irregular adhesion of the micro LED devices to the carrier substrate. After the micro LED device 400 transfer operations are completed, testing can be performed to detect defective, missing, or contaminated micro LED devices and determine if any repair operations need to be performed.

Figure 2C:
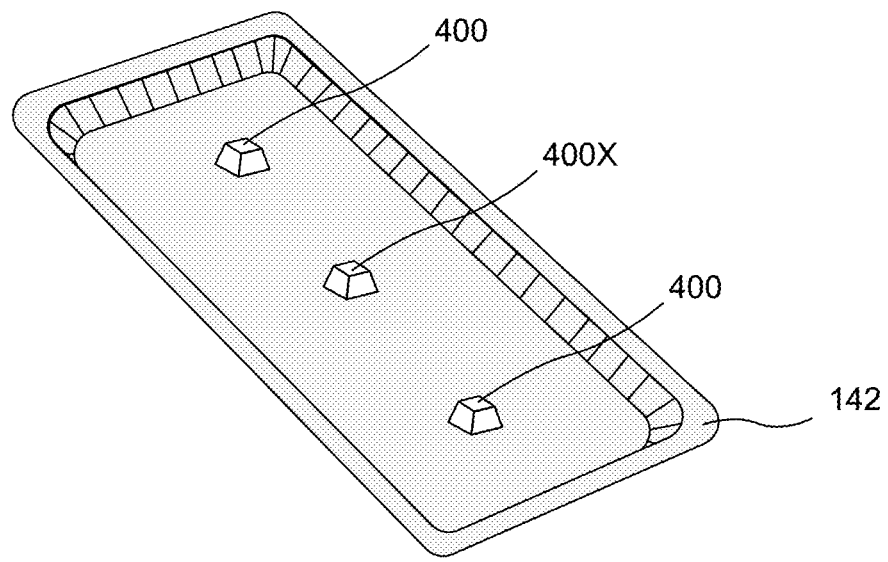
Figure 2D:
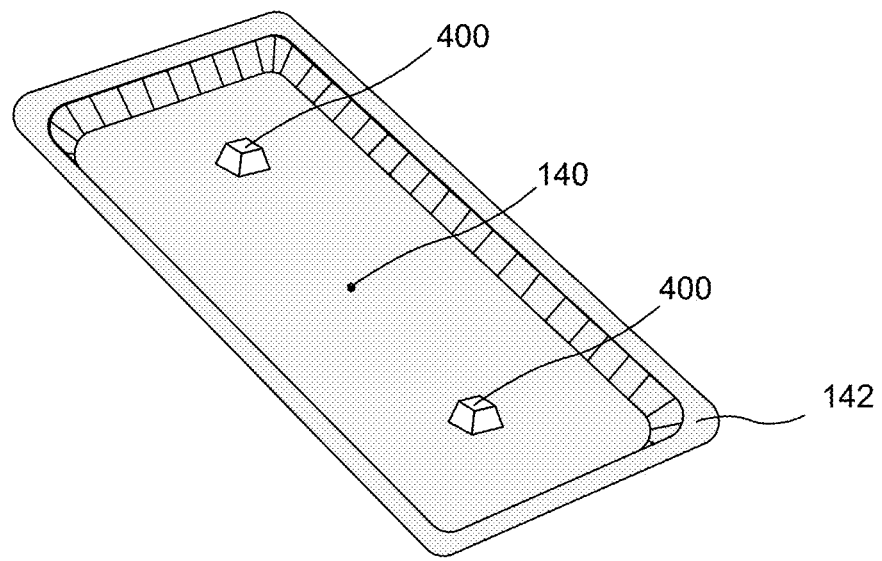

FIGS. 2C-2D illustrate exemplary applications of placing an additional micro LED device at the repair site after a defective, missing, or contaminated micro LED device is detected. For example, following the transfer and bonding of micro LED devices 400 shown in FIG. 2B the micro LED devices transferred to the display substrate can be inspected. If it is found that a micro LED device 400X is defective or contaminated, a repair micro LED device 400 can then be bonded at the repair site 401 as illustrated in FIG. 2C. Alternatively, it is found that a micro LED device was not transferred to an intended bonding site, a repair micro LED device 400 can then be bonded at the repair site 401 as illustrated in FIG. 2D.

Figure 3A:
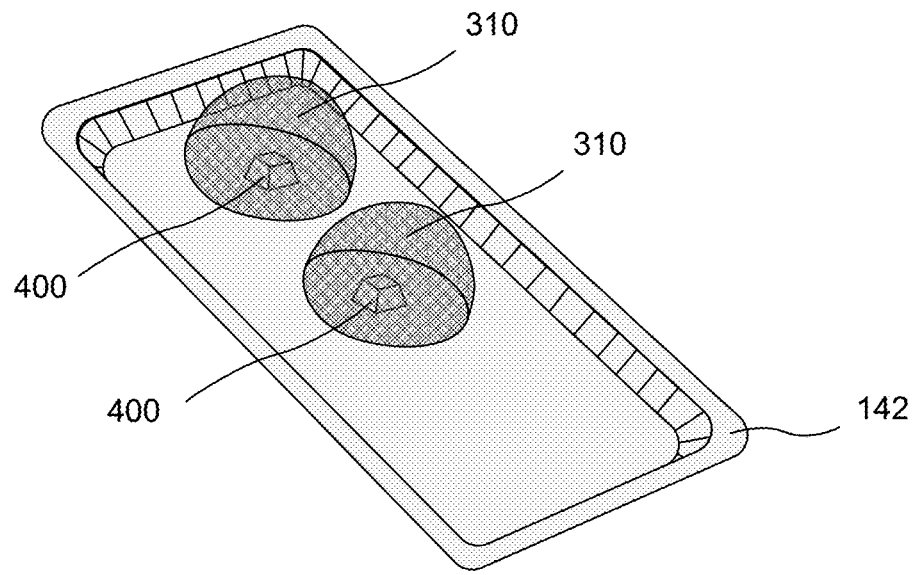
FIGS. 3A-3C are isometric view illustrations of an arrangement of micro LED devices mounted within a reflective bank layer of a subpixel with separate wavelength conversion layers formed over individual micro LED devices in accordance with embodiments of the invention.
Figure 3B:
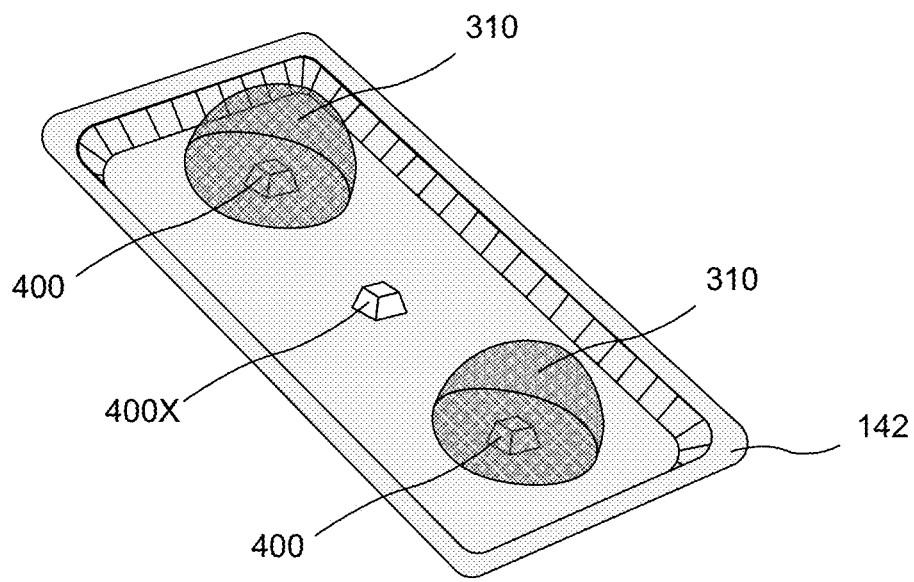
Figure 3C:
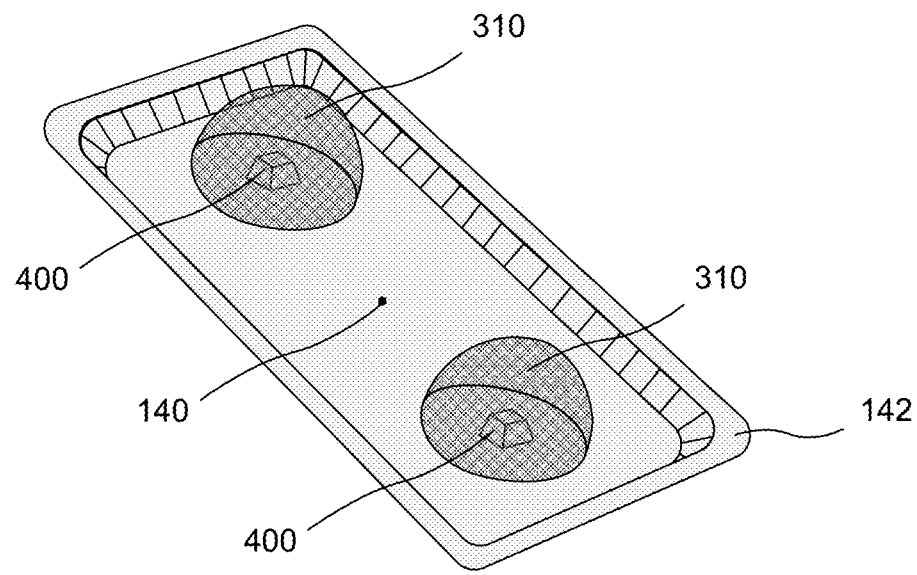

Referring now to FIGS. 3A-3C isometric view illustrations are shown of arrangements of micro LED devices mounted within a reflective bank layer of a subpixel with separate wavelength conversion layers formed over individual micro LED devices in accordance with embodiments of the invention. As shown in FIG. 3A a separate wavelength conversion layer 310 is formed over each of the individual micro LED devices 400 of a pair of micro LED devices. As shown in FIG. 3B a repair micro LED device 400 has been transferred to the reflective bank layer 142 and a separate wavelength conversion layer 310 is formed over each of the individual micro LED devices 400 of a pair of micro LED devices. In this configuration, a wavelength conversion layer 310 has not been formed over a defective or contaminated micro LED device 400X. FIG. 3C is similar to that of FIG. 3B, except that a wavelength conversion layer is not formed over the bonding layer 140 corresponding to a missing micro LED device.

Figure 4A:
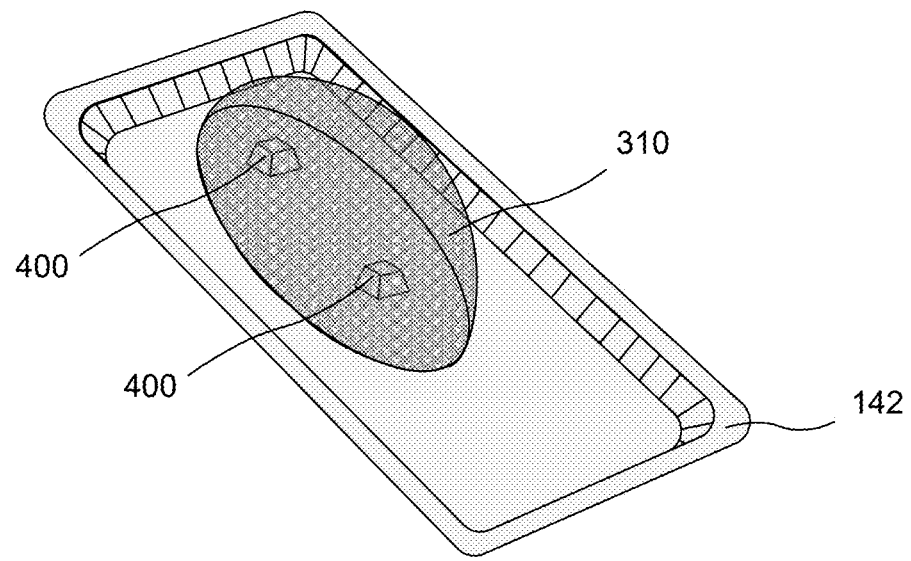
FIGS. 4A-4C are isometric view illustrations of an arrangement of micro LED devices mounted within a reflective bank layer of a subpixel with a single wavelength conversion layer formed over the micro LED devices in accordance with embodiments of the invention.
Figure 4B:
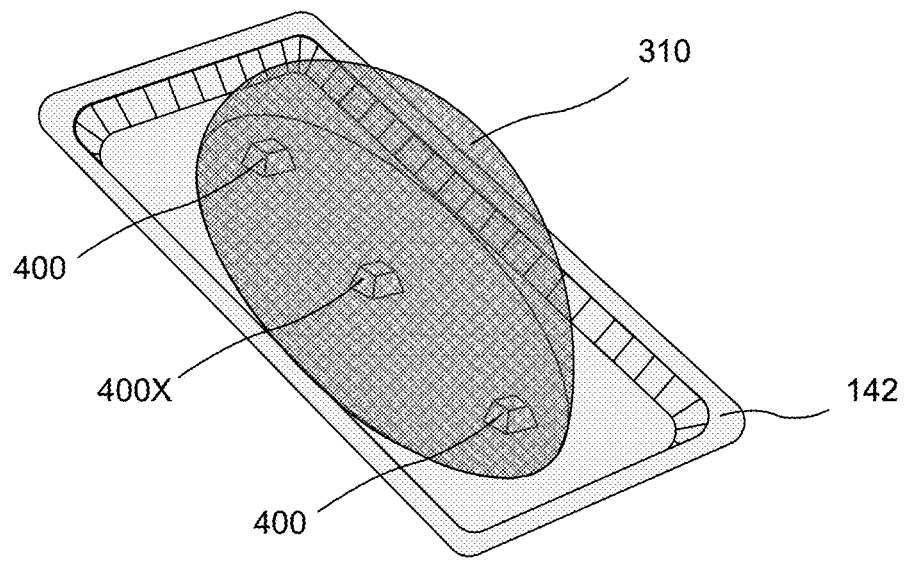
Figure 4C:
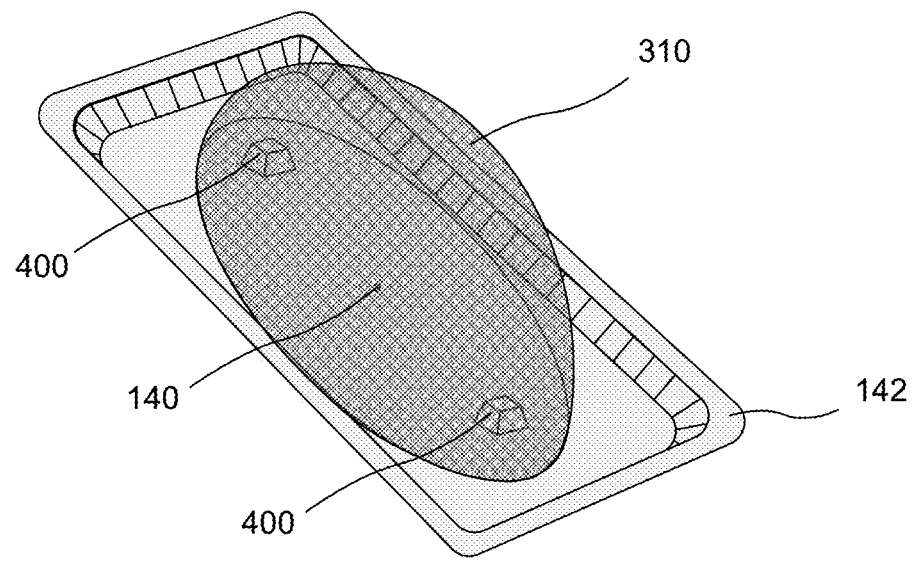

FIGS. 4A-4C show isometric view illustrations of an arrangement of micro LED devices mounted within a reflective bank layer of a subpixel with a single wavelength conversion layer formed over the micro LED devices in accordance with embodiments of the invention. The arrangement of the micro LED devices in FIGS. 4A-4C is the same as the exemplary arrangements shown in FIGS. 3A-3C, with the difference being that a single wavelength conversion layer 310 is formed over all of the micro LED devices 400 within the subpixel, or within reflective bank layer 142. As shown in FIGS. 4B-4C, the wavelength conversion layer 310 may also be formed over a defective or contaminated micro LED device 400X, or a bonding layer 140 corresponding to a missing micro LED device.

Figure 5:
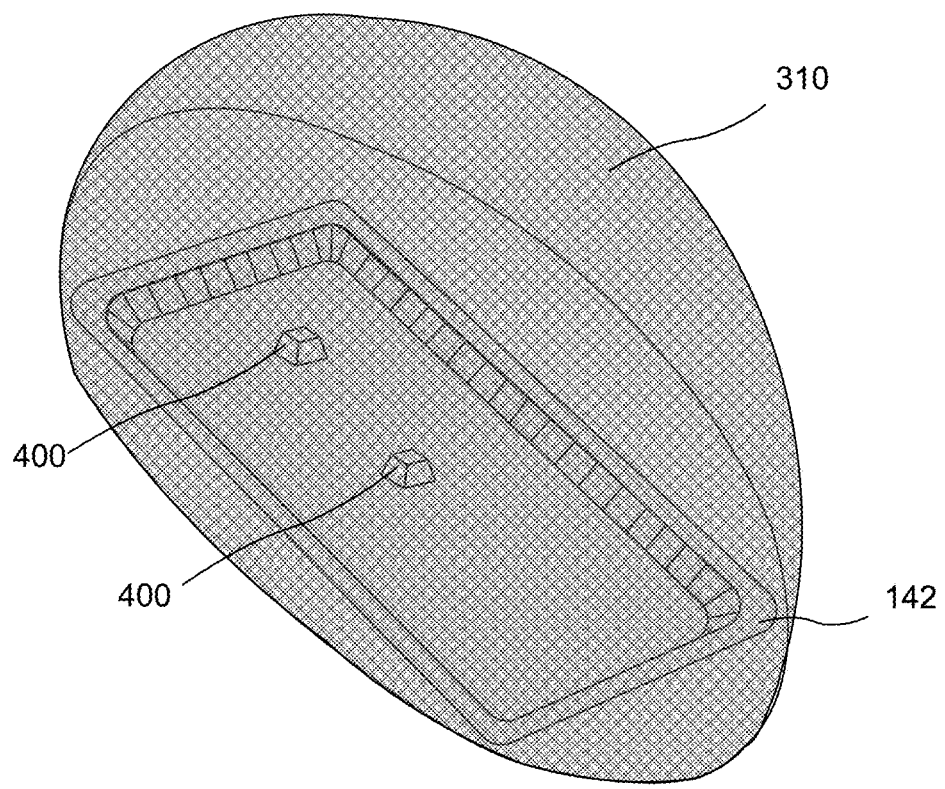
FIG. 5 is an isometric view illustration of an arrangement of micro LED devices mounted within a reflective bank layer of a subpixel with a single wavelength conversion layer formed over the reflective bank structure and micro LED devices in accordance with embodiments of the invention.

In the embodiments illustrated in FIGS. 4A-4C, the wavelength conversion layer 310 is illustrated as being within the reflective bank layer 142 within the subpixel, however, in other embodiments the wavelength conversion layer 310 is formed over the entire reflective bank layer 142 as illustrated in FIG. 5. In other embodiments, the wavelength conversion layer 310 is formed over at least the bottom surface and sidewalls of the reflective bank layer 142. A black or white matrix material can be formed over portions of the reflective bank layer 142 formed on top of the patterned bank layer 126. In this manner all light emitted from the micro LED devices within the reflective bank layer 142 that is visible by the viewer passes through the wavelength conversion layer. In addition, such a configuration requires reflected light from other sources, such as outside of the display, to pass through the wavelength conversion layer 310. It is to be appreciated, that while FIG. 5 illustrates the micro LED device 400 pair configuration of FIG. 2B, that the wavelength conversion layer 310 of FIG. 5 can be formed over any micro LED device configuration mounted within the reflective bank layer 142, including, for example, those previously illustrated in FIG. 2A, FIG. 2C, and FIG. 2D.

Thus far the wavelength conversion layer 310 in FIG. 3A-FIG. 5 have been illustrated as being in a dome shaped configuration, which can be formed from the wavelength conversion layer 310, and optionally additional layers. For example, a light distribution layer can be formed underneath the wavelength conversion layer as will be described in further detail in the following description. The dome shape profile may be hemispherical, flattened, or narrowed. For example, a hemispherical profile may improve light extraction and create a Lambertian emission pattern. Flattening or narrowing of the dome profile can be used to adjust viewing angle for the light emitting device. In accordance with embodiments of the invention, the thickness and profile the layers can be adjusted in order to change the light emission beam profile from the micro LED devices, as well as color over angle characteristics of the display which can be related to edge effects.

Referring now to FIGS. 6A-8B, a variety of configurations are illustrated including an elongated dome shaped wavelength conversion layer, which can be formed from the wavelength conversion layer 310, and optionally additional layers. For example, a light distribution layer can be formed underneath the wavelength conversion layer as will be described in further detail in the following description. In this manner, the light distribution layer can function as a light pipe to increase the fill factor for the micro LED devices within the reflective bank layers.

Figure 6A:
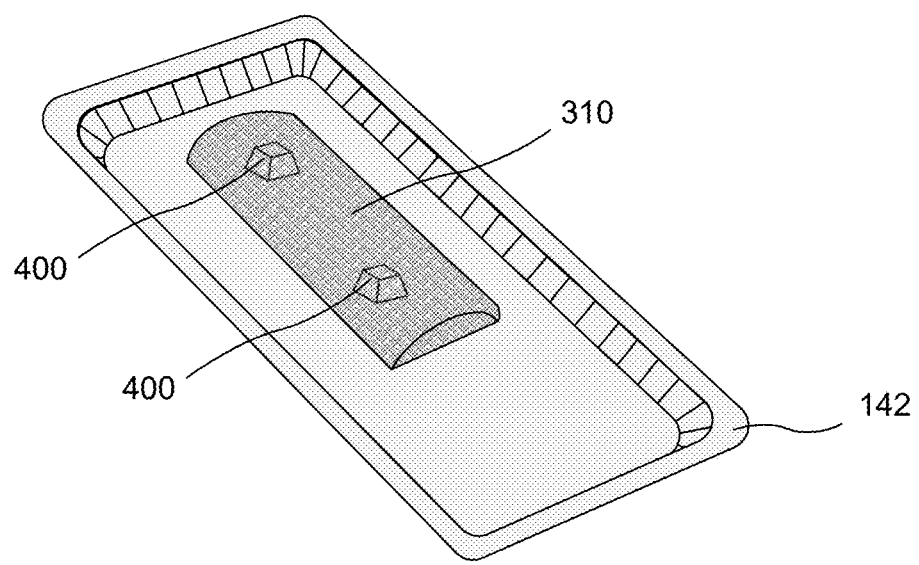
FIGS. 6A-6C are isometric view illustrations of an arrangement of micro LED devices mounted within a reflective bank layer of a subpixel with an elongated dome shaped wavelength conversion layer formed over the micro LED devices in accordance with embodiments of the invention.
Figure 6B:
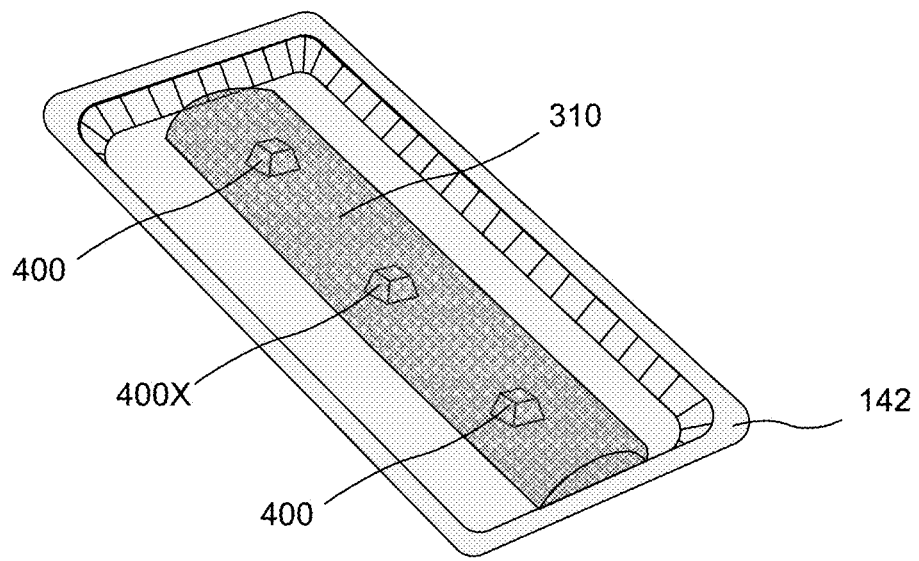
Figure 6C:
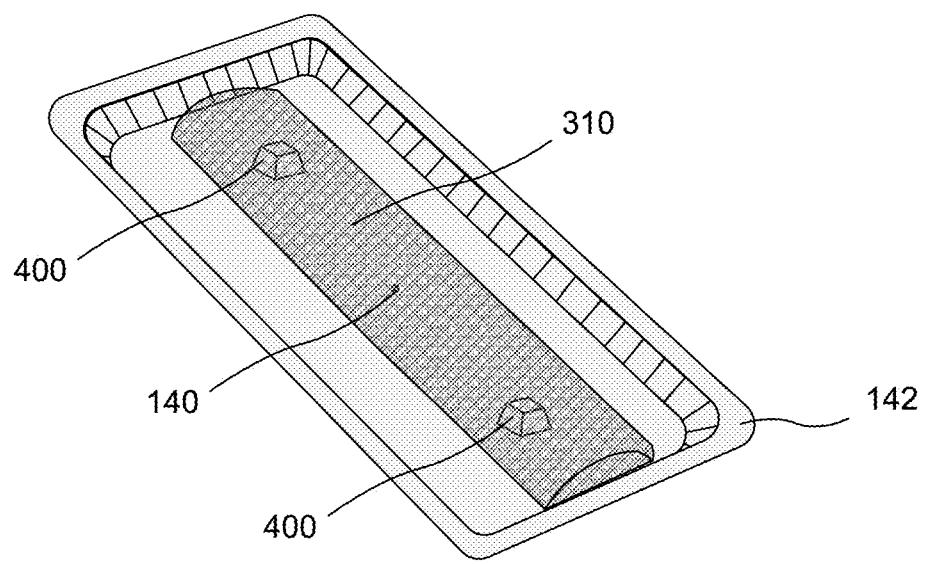

FIGS. 6A-6C show isometric view illustrations of an arrangement of micro LED devices mounted within a reflective bank layer of a subpixel with a single elongated wavelength conversion layer formed over the micro LED devices in accordance with embodiments of the invention. The arrangement of the micro LED devices in FIGS. 6A-6C is the same as the exemplary arrangements shown in FIGS. 3A-3C, with the difference being that a single elongated wavelength conversion layer 310 is formed over all of the micro LED devices 400 within the subpixel, or within reflective bank layer 142. As shown in FIGS. 6B-6C, the elongated wavelength conversion layer 310 may also be formed over a defective or contaminated micro LED device 400X, or a bonding layer 140 corresponding to a missing micro LED device.

Figure 7A:
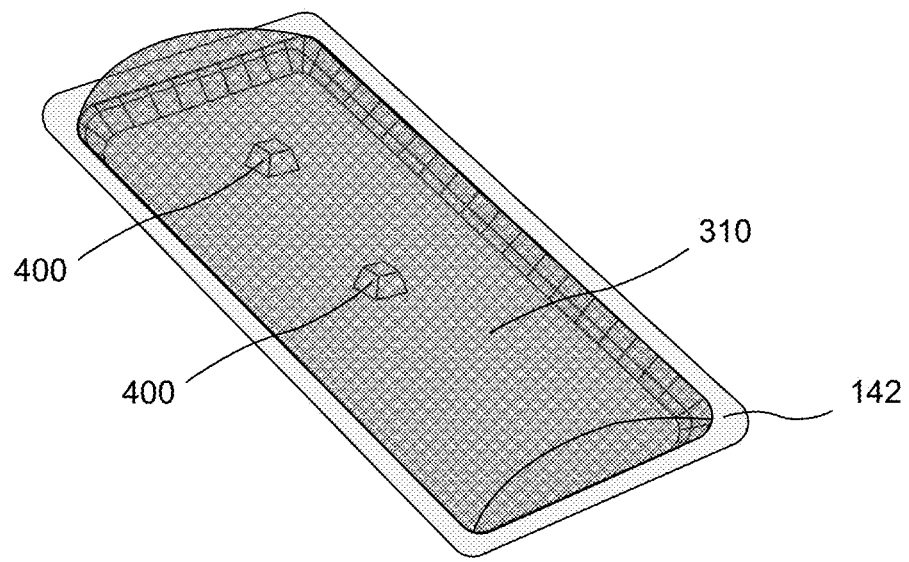
FIG. 7A is an isometric view illustration of an arrangement of micro LED devices mounted within a reflective bank layer of a subpixel with a single elongated dome shaped wavelength conversion layer formed over the micro LED devices in accordance with embodiments of the invention.
Figure 7B:
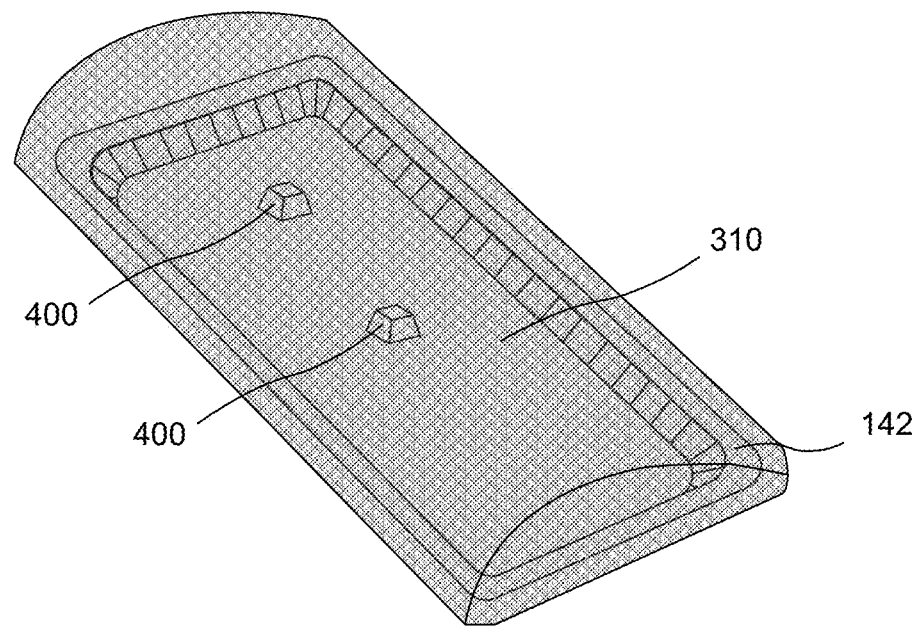
FIG. 7B is an isometric view illustration of an arrangement of micro LED devices mounted within a reflective bank layer of a subpixel with a single elongated dome shaped wavelength conversion layer formed over the reflective bank structure and micro LED devices in accordance with embodiments of the invention.

In the embodiments illustrated in FIGS. 6A-6C, the wavelength conversion layer 310 is illustrated as being only on the bottom surface of the reflective bank layer 142 within the subpixel. FIG. 7A illustrates an embodiment in which the wavelength conversion layer 310 is formed over at least the bottom surface and sidewalls of the reflective bank layer 142. FIG. 7B illustrates an embodiment in which the wavelength conversion layer 310 is formed over the entire reflective bank layer 142. In this manner all light emitted from the micro LED devices within the reflective bank layer 142 that is visible by the viewer passes through the wavelength conversion layer. The configuration illustrated in FIG. 7B requires light that is reflected by the reflective bank layer 142 originating from sources other than the micro LED device, such as outside of the display, to pass through the wavelength conversion layer 310. In the configurations illustrated in FIGS. 6A-6C and FIG. 7A a black or white matrix material can be formed over portions of the reflective bank layer 142 formed on top of the patterned bank layer 126. It is to be appreciated, that while FIGS. 7A-7B illustrate the micro LED device 400 pair configuration of FIG. 2B, that the wavelength conversion layer 310 of FIGS. 7A-7B can be formed over any micro LED device configuration mounted within the reflective bank layer 142, including, for example, those previously illustrated in FIG. 2A, FIG. 2C, and FIG. 2D.

Figure 8A:
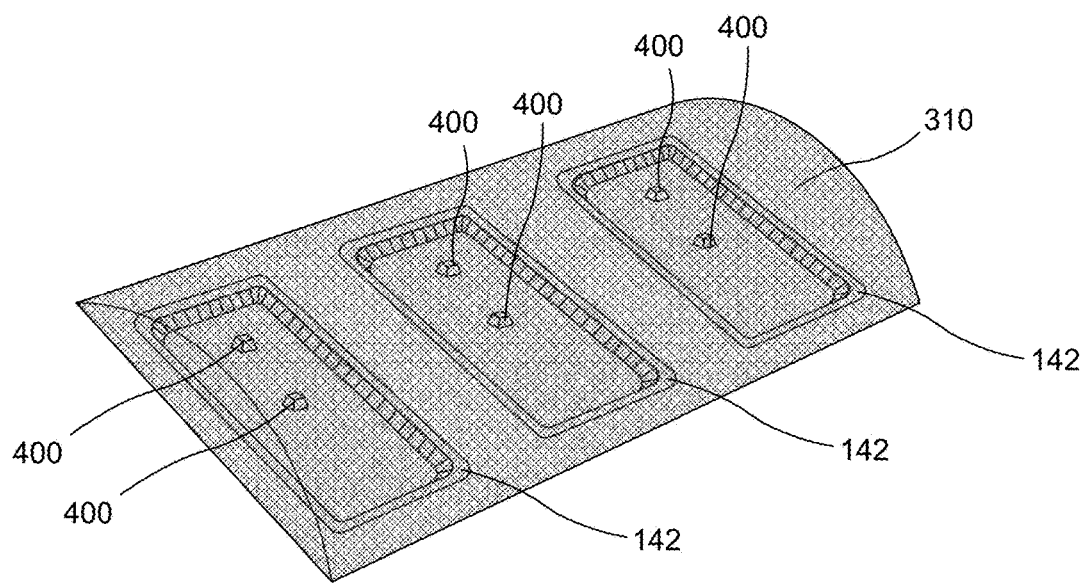
FIG. 8A is an isometric view illustration of a pixel including an elongated dome shaped wavelength conversion layer formed over multiple subpixels in accordance with an embodiment of the invention.
Figure 8B:
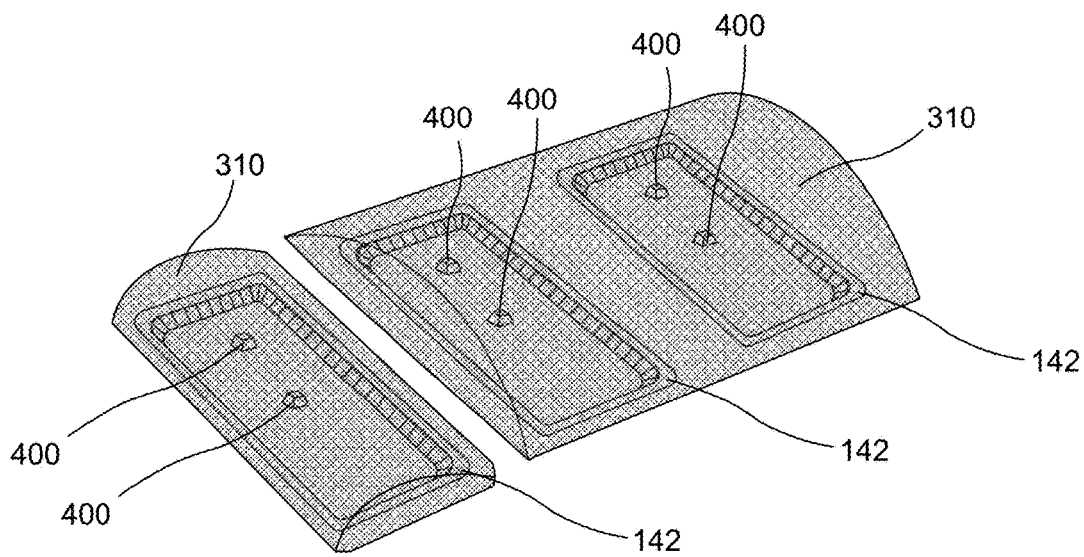
FIG. 8B is an isometric view illustration of a pixel including both an elongated dome shaped wavelength conversion layer formed over multiple subpixels and an elongated dome shaped wavelength conversion layer formed over a single subpixel in accordance with an embodiment of the invention.

Up until this point, configurations have been illustrated in which a wavelength conversion layer is formed over a single reflective bank layer 142. In the embodiments illustrated in FIGS. 8A-8B a wavelength conversion layer is illustrated as being formed over or spanning multiple reflective bank layers 142. For example, each reflective bank layer 142 can correspond to a subpixel within a pixel. FIG. 8A is an isometric view illustration of a pixel including an elongated dome shaped wavelength conversion layer 310 formed over multiple reflective bank layers 142 corresponding to multiple subpixels in accordance with an embodiment of the invention. As illustrated, the wavelength conversion layer 310 may be formed over all of the reflective bank layers 142 within a pixel. FIG. 8B is an isometric view illustration of a pixel including both an elongated dome shaped wavelength conversion layer 310 formed over multiple reflective bank layers 142 corresponding to multiple subpixels and an elongated dome shaped wavelength conversion layer 310 formed over a single reflective bank layer 142 corresponding to a single subpixel in accordance with an embodiment of the invention.

Up until this point the wavelength conversion layers 310 have been illustrated as single layer systems. In some embodiments, a number of additional layers can be formed under or over the wavelength conversion layers. For example, the wavelength conversion layers may be included in a micro lens configuration that may be shaped to change the light emission beam profile from the micro LED devices 400.

Figure 9A:
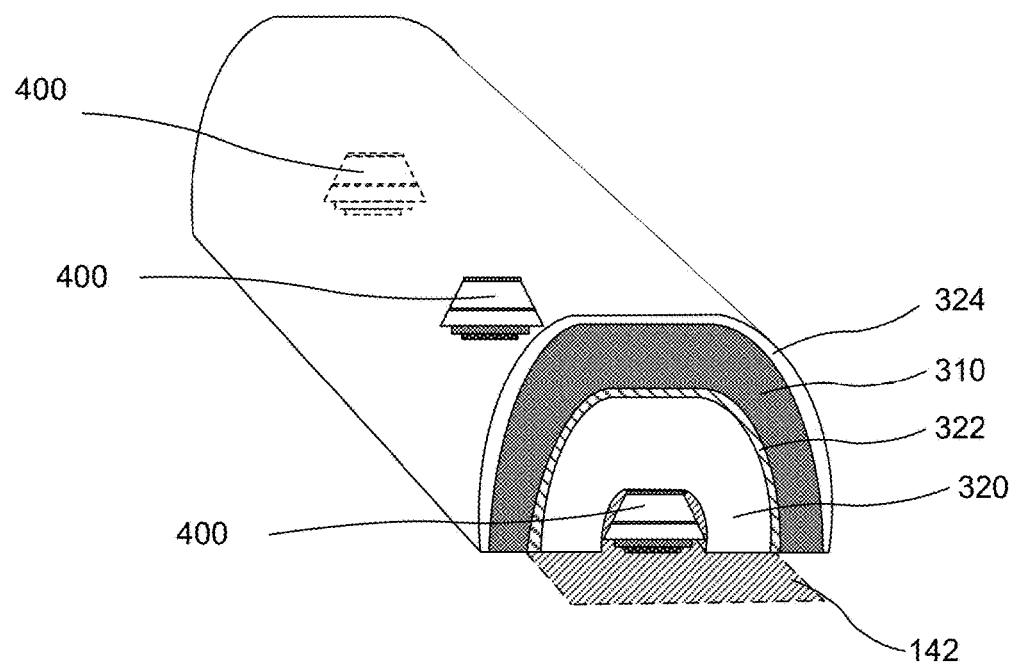
FIG. 9A is a combination view illustration of a light pipe around a plurality of micro LED devices and a wavelength conversion layer over the light pipe in accordance with an embodiment of the invention.

Referring now to FIG. 9A a combination view is provided of a light distribution layer in the form of a light pipe around a micro LED device and wavelength conversion layer over the light pipe in accordance with an embodiment of the invention. FIG. 9A is referred to as a combination view because it includes characteristics of an isometric view, plan view for location of the micro LED device, and cross-sectional view of the layers. In the following embodiments description is made with regard to a specific vertical micro LED device 400 structure. It is to be appreciated, that the specific micro LED device 400 illustrated is exemplary and that embodiments of the invention are not limited. For example, embodiments of the invention may also be practiced with LED devices such as those described and illustrated with regard to FIG. 1D. The following description is also made with regard to a light distribution layer 320 in the form of a light pipe. It is to be appreciated that such a configuration has been selected in order to adequately describe numerous possible arrangements of layers and shapes, and that the arrangements of layers can also be used to form any of the profiles previously described, such as dome shaped and elongated dome shaped, among others.

As shown in FIGS. 9A a light distribution layer 320 is optionally formed around one or more micro LED devices 400 prior to forming the wavelength conversion layer 310. As described herein a layer "around" a micro LED device may be formed laterally to, over, or below the micro LED device. Thus, the term "around" a micro LED device does not require the layer to be located at all directions from the micro LED device. Rather, the term "around" is intended to refer to a neighboring area through which the light emission beam path from the micro LED device is designed to pass through. In the particular embodiment illustrated in FIG. 9A, the light pipe around the micro LED devices 400 is both lateral to and over the micro LED devices.

A light distribution layer 320 in the form of a light pipe may be shaped to both allow refraction of incident light from the micro LED devices 400 out of the light pipe and toward a wavelength conversion layer 310, and to cause internal reflection and lateral spreading of incident light from the micro LED devices 400 within the light distribution layer 320. The light distribution layer 320 may be thicker than the micro LED device 400. In an embodiment, the light distribution layer 320 is 1 μm-100 μm thick. The lateral length/width of the light distribution layer may be greater than the thickness of the light distribution layer in order to support lateral spreading of the incident light. In an exemplary embodiment, considering a 100 μm×100 μm wide subpixel, a light distribution layer 320 may have a lateral length of 100 μm, a lateral width of 100 μm and a height that is equal to or less than the maximum lateral length or width.

The light distribution layer 320 may also be dome shaped to create radial spreading of the light refracted out of the light pipe. The dome shape profile may be hemispherical. The dome shape may also be flattened or narrowed. In some embodiments, the light distribution layer 320 is elongated dome shaped. In an embodiment, the thickness and profile of the light distribution layer 320 provides a base structure upon which a micro lens structure is formed in order to change the light emission beam profile from the micro LED devices 400, as well as color over angle characteristics of the display which can be related to edge effects. Light distribution layer 320 may be formed of a variety of transparent materials such as epoxy, silicone, and acrylic, which have the following reported refractive indices (n) at nominal 590 nm wavelength: n=1.51-1.57 (epoxy), n=1.38-1.58 (silicone), n=1.49 (acrylic). In an embodiment, light distribution layer 320 is formed by ink jet printing. In an embodiment, the light distribution layer 320 is formed by application of a molten glass. Glass compositions can range from a variety of compositions ranging from acrylic glass, crown glass, flint glass, and borosilicate glasses that possess indices of refraction that can be matched to those of a matrix material forming the wavelength conversion layer 310 such as epoxy, silicone, or acrylic. The particular profile of the light distribution layer 320 can be created through several processing techniques. One way is by tailoring surface tension on in ink printed materials. Lithography or other wafer-level optics techniques such as those used to form micro lenses may also be used. Physical techniques such as moulding or imprint lithography may also be used.

Figure 9B:
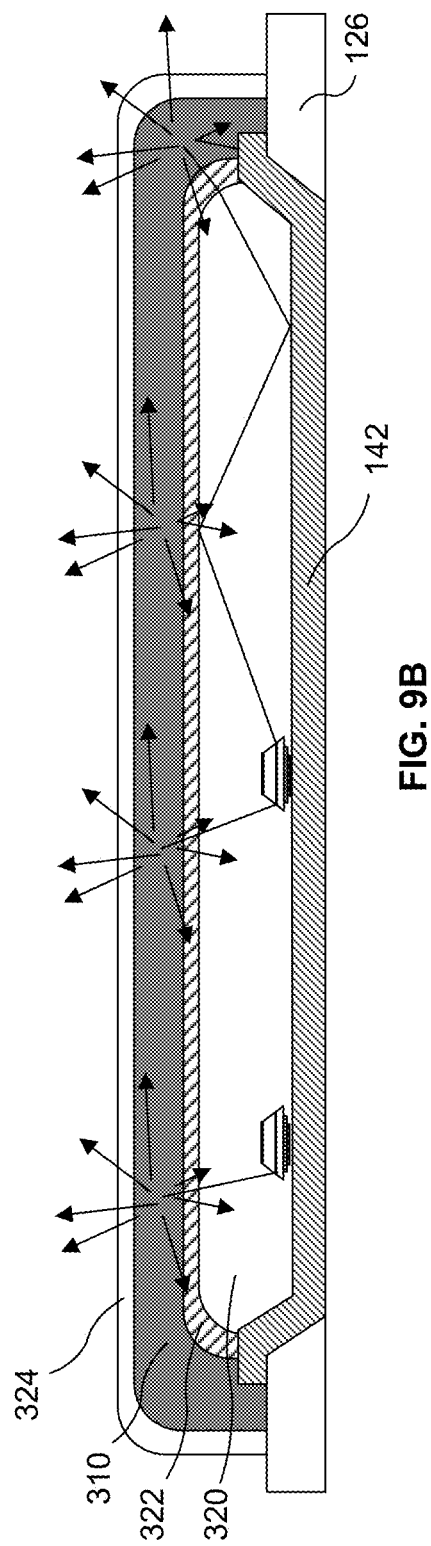
FIG. 9B is a cross-sectional side view illustration of a light pipe around a pair of micro LED devices and a wavelength conversion layer over the light pipe in accordance with an embodiment of the invention.

FIG. 9B is a cross-sectional side view illustration of a light distribution layer in the form of a light pipe around a micro LED device and a wavelength conversion layer over the light pipe in accordance with an embodiment of the invention. As shown in FIG. 9B, incident light emitting from the micro LED devices 400 can both be refracted out of the light distribution layer 320 and into the wavelength conversion layer 310, and also reflected internally within the light distribution layer 320 to cause lateral spreading of the incident light from the micro LED devices where the reflected light is eventually refracted out of the light distribution layer 320 and into the wavelength conversion layer 310. FIGS. 9C-9D are cross-sectional side view illustrations of a light distribution layer in the form of a light pipe and having a tapered profile in accordance with embodiments of the invention. In the particular embodiment illustrated in FIG. 9C, the light distribution layer 320 is tapered toward the lateral edges so that the light distribution layer is thinner at the edges than the middle. Tapering the thickness of the light distribution layer 320 can result in increase reflection, causing the light to eventually refract through the top surface of the light distribution layer rather than through the edges. In the embodiment illustrated in FIG. 9D, the pair of micro LED devices are placed nearer one edge of the light distribution layer 320, which is tapered from one side to the other. In this manner, the light distribution layer 320 can guide the light from one side of the light distribution layer to the other where the light is refracted through the top surface rather than through a side of the light distribution layer.

In addition to allowing refraction and reflection of incident light from the micro LED devices 400, light distribution layer 320 may also allow the light emitting from the micro LED devices 400 to spread out prior to entering the wavelength conversion layer 310, which decreases the optical intensity of light entering the wavelength conversion layer. In one aspect, the internally reflected light allows for an improved fill factor of the micro LED devices 400, pixel, or subpixel including the micro LED devices. In another aspect, the spread out light (including incident light not reflected, as well as reflected light) may result in more even emission from the wavelength conversion layer 310 to be formed over the light distribution layer. In another aspect, the light distribution layer 320 may function to increase the length that light travels in the device before being emitted. This can result in a reduction of the optical density and reduce thermal degradation of the phosphor particles in wavelength conversion layer, prolonging lifetime of the display device. This may also increase the chances of color conversion by the phosphor particles in the wavelength conversion layer without having to increase the volume loading of the phosphor particles in the wavelength conversion layer. In yet another aspect, spreading out of the light and reduction of the optical intensity may reduce the amount of back reflection from the wavelength conversion layer that could otherwise be reabsorbed by the micro LED devices 400. In accordance with embodiments of the invention, light distribution layer 320 may increase the fill factor, increase total light emission, increase emission uniformity, and increase sharpness of the color spectrum for the display device. The thickness and profile of the light distribution layer may also provide a base structure from which a micro lens structure is formed in order to change the light emission beam profile from the micro LED devices 400, as well as color over angle characteristics of the display which can be related to edge effects.

Following the formation of the optional light distribution layer 320, a matching layer 322 may optionally be formed over the light distribution layer 320 prior to forming the wavelength conversion layer 310. The matching layer 322 may function to match the indices of refraction for the light distribution layer 320 and wavelength conversion layer 310 to reduce back reflection of light. For example, where layers 320, 310 are formed of, for example, an epoxy, silicone, acrylic, or glass having different indices of refraction, the matching layer 322 is formed of an epoxy, silicone, acrylic, or glass having an index of refraction between that of layers 320, 310. In accordance with embodiments of the invention, the polymer matrix forming layers 320, 310 is the same, and layers 320, 310 have an identical index of refraction. In another embodiment, the index of refraction for layers 320, 310 is within 0.3, or more particularly within 0.1. In an embodiment, matching layer is 2 μm or less in thickness. In an embodiment, curing of the matching layer 322 may be thermal or UV.

In accordance with embodiments of the invention, a wavelength conversion layer 310 is formed over the micro LED devices 400 and over the optional light distribution layer 320 and matching layer, if present. In an embodiment, the wavelength conversion layer includes phosphor particles to control the light emission spectrum. In one embodiment, the wavelength conversion layer includes different phosphor particles (different in designed size or shape, or composition) for a blended color emission spectrum (e.g. a combination of any of red, blue, green, yellow, etc). In another embodiment, the wavelength conversion layer includes phosphor particles designed for a single color emission spectrum (e.g. red, blue, green, yellow, etc).

In an embodiment, the wavelength conversion layer 310 is formed of phosphor particles. For example, the wavelength conversion layer is formed of a spray deposition method followed by removal of solvents. In an embodiment, the wavelength conversion layer includes a dispersion of phosphor particles in a matrix material such as a polymer or glass matrix material. Other filler materials such as pigment, dye, or scattering particles may also be dispersed within the matrix or among the phosphor particles themselves if no matrix material is present. In an embodiment, wavelength conversion layer 310 is formed by ink jet printing, and UV cured. In an embodiment, the wavelength conversion layer 310 is formed by application of a molten glass, where the fillers are thermally and chemically stable within the molten glass. The thickness of the wavelength conversion layer 310, as well a concentration of fillers, e.g. phosphor particles, pigment, dye, or light scattering particles are tuned to achieve the requisite color spectrum. For example, in an embodiment the thickness and concentration is tuned to minimize color bleeding from the micro LED devices through the wavelength conversion layer, and maximize emission from the phosphor particles. Thickness of the wavelength conversion layer 310 (as well as light distribution layer) may also be partly determined by the spacing between micro LED devices. For example, micro LED devices may be spaced more closely together in high resolution display applications compared to lighting applications. In an embodiment, the wavelength conversion layer 310 is 5 μm-100 μm thick, or more specifically 30 μm-50 μm thick for an exemplary 5 μm wide and 3.5 μm tall micro LED device 400. In some embodiments, the thickness of the wavelength conversion layer and concentration of fillers may be designed to allow some light from the micro LED devices 400 to pass through resulting a mix of the micro LED device light spectrum and the converted light spectrum to achieve a blended emission spectrum, for example, white light. Concentration of the color converting materials (e.g. phosphor particles, pigment, dye) as well as thickness of the layers can depend upon the particular application of the light emitting device, for example, if full color conversion (e.g. from blue to red, or blue to green, etc.) is to occur, if leakage or bleeding of light from the underlying micro LED devices is to occur, or if a mixture of converting materials is employed. In an embodiment where full color conversion (e.g. from blue to red, or blue to green, etc.) occurs a volume loading percent of greater than 50% color converting materials may be included in the wavelength conversion layer. In an embodiment, the wavelength conversion layer includes greater than 50% volume loading of phosphor particles. The light distribution layer 320 can function to increase the length that light travels in the device before being emitted in order to increase the chances of color conversion by the phosphor particles in the wavelength conversion layer 310 without having to increase the volume loading of the phosphor particles in the wavelength conversion layer.

In accordance with embodiments of the invention, the term "phosphor" may refer to any type of wavelength converting material that will absorb light at one wavelength and emit light at another wavelength. One type of phosphor particle is a quantum dot. Quantum dots are semiconductor materials where the size of the structure is small enough (less than tens of nanometers) that the electrical and optical characteristics differ from the bulk properties due to quantum confinement effects. For example, the emission properties of quantum dots are related to their size and shape in addition to their composition. Fluorescence of quantum dots is a result of exciting a valence electron by absorbing a certain wavelength, followed by the emission of lower energy in the form of photons as the excited electrons return to the ground state. Quantum confinement causes the energy difference between the valence and conduction bands to change based on size and shape of the quantum dot meaning that the energy and wavelength of the emitted photons is determined by the size and shape of the quantum dot. The larger the quantum dot, the lower the energy of its fluorescence spectrum. Accordingly, smaller quantum dots emit bluer light (higher energy) and larger quantum dots emit redder light (lower energy). This allows size-dependent tuning of the semiconductor photoluminescence emission wavelength throughout the visible spectrum, with a sharp emission spectrum and high quantum efficiency.

Examples of quantum dot materials include, but are not limited to, groups II-VI, III-V, IV-VI semiconductor materials. Some exemplary compound semiconductors include CdS, CdSe, CdTe, ZnS, ZnSe, ZnTe, GaAs, GaP, GaAs, GaSb, HgS, HgSe, HgTe, InAs, InP, InSb, AlAs, AlP, AlSb. Some exemplary alloyed semiconductors include InGaP, ZnSeTe, ZnCdS, ZnCdSe, and CdSeS. Multi-core structures are also possible. Exemplary multi core configurations may include a semiconductor core material, a thin metal layer to protect the core from oxidation and to aid lattice matching, and a shell to enhance the luminescence properties. The shell may function to absorb light at a specific spectrum that is different from the emission spectrum from the quantum dot. The core and shell layers may be formed of the same material, and may be formed of any of the exemplary compound semiconductors or alloyed semiconductors listed above. The metal layer often comprises Zn or Cd.

In accordance with embodiments of the invention, one type of phosphor particle is a particle that exhibits luminescence due to its composition. Some exemplary phosphor particles that exhibit luminescence due to their composition include sulfides, aluminates, oxides, silicates, nitrides, YAG (optionally doped with cerium), and terbium aluminum garnet (TAG) based materials. Other exemplary materials include yellow-green emitting phosphors: $(Ca,Sr,Ba)Al_2O_4$:Eu (green), $(Lu, Y)_3Al_5O_{12}$:$Ce^{3+}$(LuAG, YAG) (yellow-green), $Tb_3Al_5O_{12}$:$Ce^{3+}$(TAG) (yellow-green); orange-red emitting phosphors: $BaMgAl_{10}O_{17}$:$Eu^{2+}$($Mn^{2+}$), $Ca_2Si_5N_8$:$Eu^{2+}$(orange-red), $(Zn,Mg)S$:Mn (green, red), $(Ca,Sr,Ba)S$:$Eu^{2+}$(red); uv-deep blue absorbing phosphors for blue and yellow-green emission: $(Mg,Ca,Sr,Ba)_2SiO_4$:$Eu^{2+}$(uv-blue excitation, yellow emission), $(Mg,Ca,Sr,Ba)_3Si_2O_7$:$Eu^{2+}$ (uv-deep blue excitation, blue-green emission), $Ca_8Mg(SiO_4)_4Cl_2$:$Eu^{2+}$(uv-deep blue excitation, blue emission); and phosphors that can emit over the full visible spectrum depending on composition and processing $(Sr,Ca,Ba)Si_{x-}O_yN_z$:$Eu^{2+}$(y>0 green, y=0 red), $Y_2O_2S$:$Eu^{3+}$(blue-green), $(Ca,Mg,Y)_xSi_wAl_xO_yN_z$:$Eu^2$(yellow-green-red). In some embodiments the particle size for such phosphor particles may be from 1 μm to 20 μm. In other embodiments, the particles size for such phosphor particles can be nanoparticles from 100 nm to 1 μm. The phosphor particles can also include a blend of the 1 μm to 20 μm particles and 100 nm to 1 μm nanoparticles. Nanoparticles may be useful, for example, to reduce the amount of settling when dispersed within a matrix material of a wavelength conversion layer prior to curing or solvent removal, which may result in more even distribution of the nanoparticles and light emission of the light emitting device.

Other materials may also be dispersed within the wavelength conversion layer. For example, the other materials may be dispersed within the matrix material, such as glass or polymer matrix of the wavelength conversion layer. In an embodiment, a light scattering agent such as $TiO_2$ or $Al_2O_3$ particles is dispersed within the wavelength conversion layer. Such light scattering agents may have the effect of increasing the phosphor particle efficiency by increasing scattered light within the wavelength conversion layer. Such light scattering agents may additionally have the effect of reduced bleeding of the micro LED device emitted light through the wavelength conversion layer. Light scattering particles can also be used to control when and where light is emitted from the micro lens structure. For example, a higher concentration of light scattering particles can be placed at the ends of the micro lens structure, e.g. at lateral edges of the wavelength conversion layer, to direct the light out. In an embodiment, a pigment or dye may be dispersed within the wavelength conversion layer 310. This may have the effect of incorporating a color filter into the wavelength conversion layer. In an embodiment, the pigment or dye may have a color similar to the emission wavelength of the phosphor particle. In this manner, the pigment or die can absorb wavelengths other than those being emitted from the phosphor particle, further sharpening the emission spectrum of the assembly. For example, in a particular embodiment, the micro LED device 400 is a gallium nitride (GaN) based material, and emits a blue (e.g. 450 nm-495 nm) or deep blue (e.g. 420 nm-450 nm) light. Quantum dots designed for red emission may be dispersed in the wavelength conversion layer 310 in order to absorb the blue or deep blue emission from the micro LED device 400 and convert the emission wavelength to red. In such an embodiment, a red pigment or dye may also be dispersed within the wavelength conversion layer 310 to also absorb colors other than red. In this manner, the red pigment or dye may absorb additional blue or deep blue light, thereby reducing bleeding of the unconverted blue or deep blue light. Exemplary pigments include lithol rubine (Red), B-copper thalocyanine (Blue), and diarylide yellow (Yellow). It is to be appreciated that a blue micro LED device and red phosphor particles with red pigment or dye is exemplary and a variety of emission spectrum configurations for the micro LED devices and wavelength conversion layers, where present, are possible.

In accordance with some embodiments of the invention, the polymer matrix forming the wavelength conversion layer 310 may be permeable to oxygen or moisture. In an embodiment, following the formation of the wavelength conversion layer 310, an oxygen barrier film 324 may optionally be formed in order to protect the wavelength conversion layer 310 from oxygen or moisture absorption. For example, where wavelength conversion layer 310 includes quantum dots, the oxygen barrier film 324 can act as a barrier to oxygen or moisture absorption by the quantum dots, thereby prolonging the lifetime of the quantum dots in the display device. Suitable materials for the oxygen barrier film 324 include, but are not limited to, $Al_2O_3$, $SiO_2$, $SiN_x$, and glass. The deposition method for oxygen barrier film 324 may be a low temperature method in order to not thermally degrade the quantum dots or other fillers. Exemplary conformal deposition methods include atomic layer deposition (ALD), sputtering, spin on, and lamination. The oxygen barrier film may also be blanket deposited over the entire substrate, or over all of the micro LED devices. In an embodiment, an $Al_2O_3$ oxygen barrier film is deposited by atomic layer deposition (ALD).

Figure 10A:
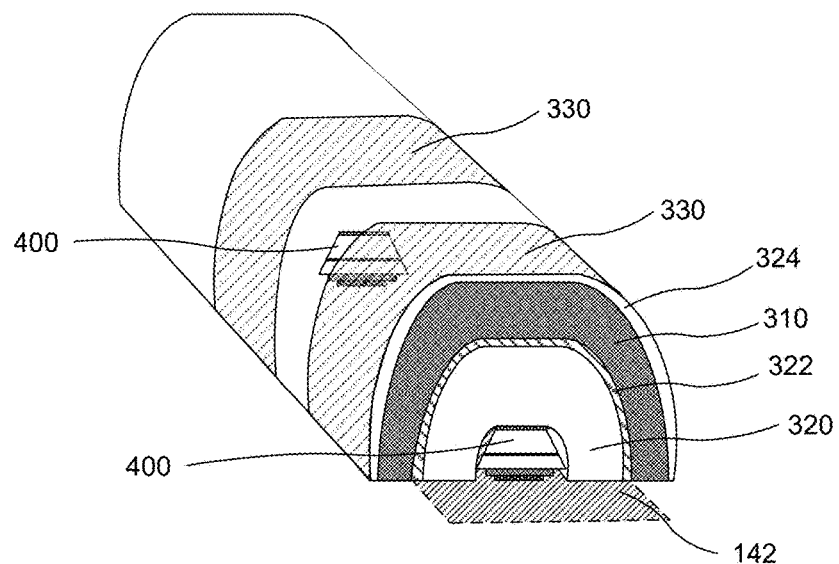
FIG. 10A is a combination view illustration of a light pipe around a pair of micro LED devices and a pair of reflective layers over the pair of micro LED devices in accordance with an embodiment of the invention.
Figure 10B:
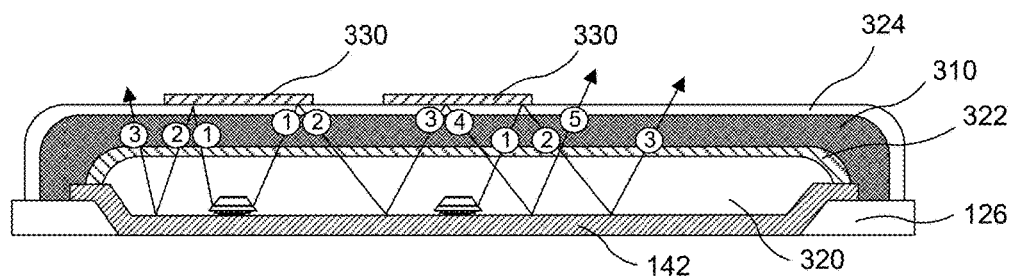
FIG. 10B is a cross-sectional side view illustration of a pair of reflective layers over a wavelength conversion layer and light pipe in accordance with an embodiment of the invention.
Figure 10C:
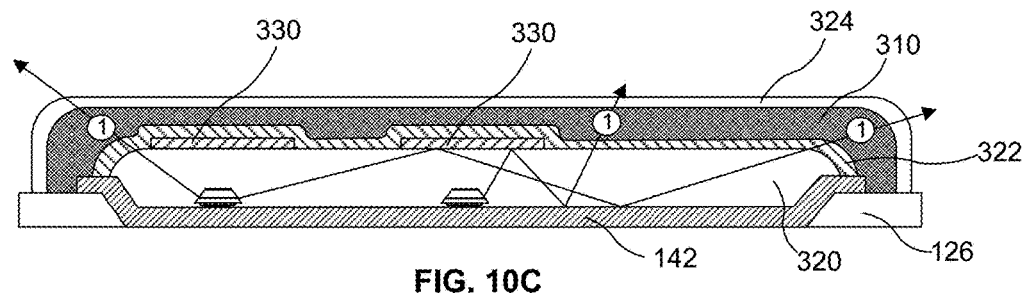
FIG. 10C is a cross-sectional side view illustration of a pair of reflective layers over a light pipe and underneath a wavelength conversion layer in accordance with an embodiment of the invention.

Referring now to FIGS. 10A-10C, combination and cross-sectional side view illustrations are provided for embodiments including reflective layers 330 directly over the micro LED devices 400 where light distribution layer 320 is in the form of a light pipe. Reflective layers 330 can be provided in different locations, which may result in different effects on the light pipe and wavelength conversion layer configuration. In one embodiment illustrated in FIG. 10B the reflective layers 330 are formed over the wavelength conversion layer 310. In this manner, the reflective layer can block incident light emitted from the micro LED devices 400 from bleeding through the wavelength conversion layer 310 at the closest location to the micro LED devices, where optical intensity may be the greatest. Reflection of the incident light can also have the effect of laterally spreading the light thereby improving the fill factor. Another effect of the reflective layers 330 may also be to increase the number of passes of the incident light through the wavelength conversion layer. By way of example, situations are illustrated where the incident light passes through the wavelength conversion layer 310 three times and five times. With each pass, phosphor particles are excited and emit converted spectra. In this manner, the efficiency of the phosphor particles in the wavelength conversion layer 310 can be improved, thereby increasing the converted spectra light intensity of the system, while also improving the fill factor, and providing more even emission from the wavelength conversion layer 310.

In another embodiment illustrated in FIG. 10C reflective layers 330 are formed between the light distribution layer 320 and the wavelength conversion layer 310. In such a configuration, the reflective layer may influence lateral spreading of incident light, and improve the fill factor. Such a configuration may also block incident light from entering the wavelength conversion layer 310 at the closest location to the micro LED devices, where optical intensity may be the greatest. As such, bleeding of incident light through the wavelength conversion layer 310 can be reduced. This configuration may also increase the lifetime of the phosphor particles, particularly where optical intensity would have been the greatest.

Figure 10D:
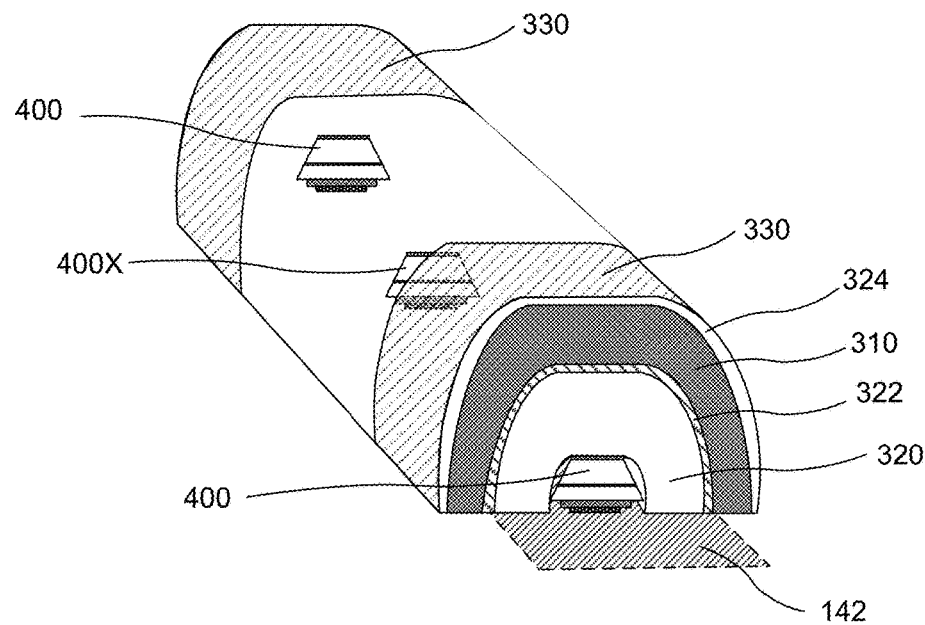
FIG. 10D is a combination view illustration of a light pipe around a pair of micro LED devices and a pair of reflective layers over the pair of micro LED devices in accordance with an embodiment of the invention.
Figure 10E:
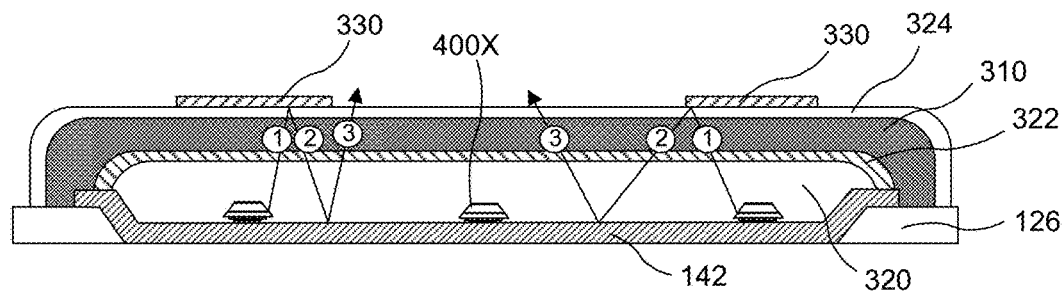
FIG. 10E is a cross-sectional side view illustration of a pair of reflective layers over a wavelength conversion layer and light pipe in accordance with an embodiment of the invention.
Figure 10F:
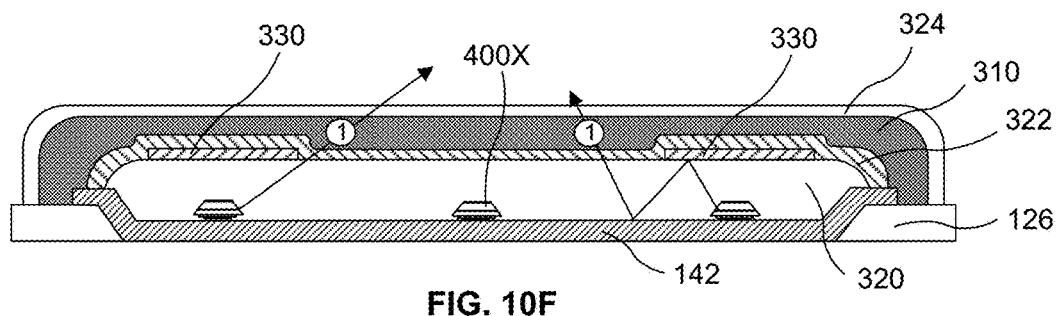
FIG. 10F is a cross-sectional side view illustration of a pair of reflective layers over a light pipe and underneath a wavelength conversion layer in accordance with an embodiment of the invention.

FIGS. 10D-10F illustrate embodiments similar to those illustrated and described with regard to FIGS. 10A-10C. In the embodiments illustrated in FIGS. 10D-10F, a reflective layer 330 is formed over a micro LED device 400 pair including a repair micro LED device, and optionally not formed over a missing, defective, or contaminated micro LED device 400X. Alternatively, a reflective layer can also be formed over a missing, defective, or contaminated micro LED device 400X.

The reflective layers 330 described above and illustrated in FIGS. 10A-10F are illustrated as being flat layers. However, it is not required that the reflective layers 330 are flat. Any configuration is possible, and the reflective layers 330 may be shaped to control the direction of light emission. Reflective layers 330 also are not required to be formed directly above the micro LED devices, and may be formed at other locations such as along the lateral edges of the light pipe or wavelength conversion layer.

In accordance with embodiments of the invention, the light emitting device configurations including the micro LED devices and wavelength conversion layers can be incorporated into a variety of display devices. Exemplary display applications include display signage, display panels, televisions, tablets, phones, laptops, computer monitors, kiosks, digital cameras, handheld game consoles, media displays, ebook displays, or large area signage display.

The wavelength conversion layers can be designed to all emit the same color emission spectrum, or the wavelength conversion layers can be divided into multiple groups of wavelength conversion layers, with each group designed to emit a different color emission spectrum. In this manner, the displays can emit any color or patterns of colors depending upon the arrangement and content of the micro LED devices and wavelength conversion layers. In one embodiment, white light can be generated by incorporating red (e.g. 620 nm-750 nm) and green (e.g. 495 nm-570 nm) emitting phosphor particles in a wavelength conversion layer positioned over a blue emitting (e.g. 450 nm-495 nm) micro LED device. In another embodiment, white light can be generated by incorporating multiple micro LED devices into a pixel, with each micro LED device designed to emit the same emission spectrum (e.g. visible spectrum or UV spectrum), and different wavelength conversion layers designed to convert color emission. In this manner, by including phosphor particles of a single color emission spectrum over each light distribution layer, secondary absorption of light emitted from different emission spectra of different phosphor particles is avoided. This may increase efficiency and reduce unintended color shift.

Figure 11A:
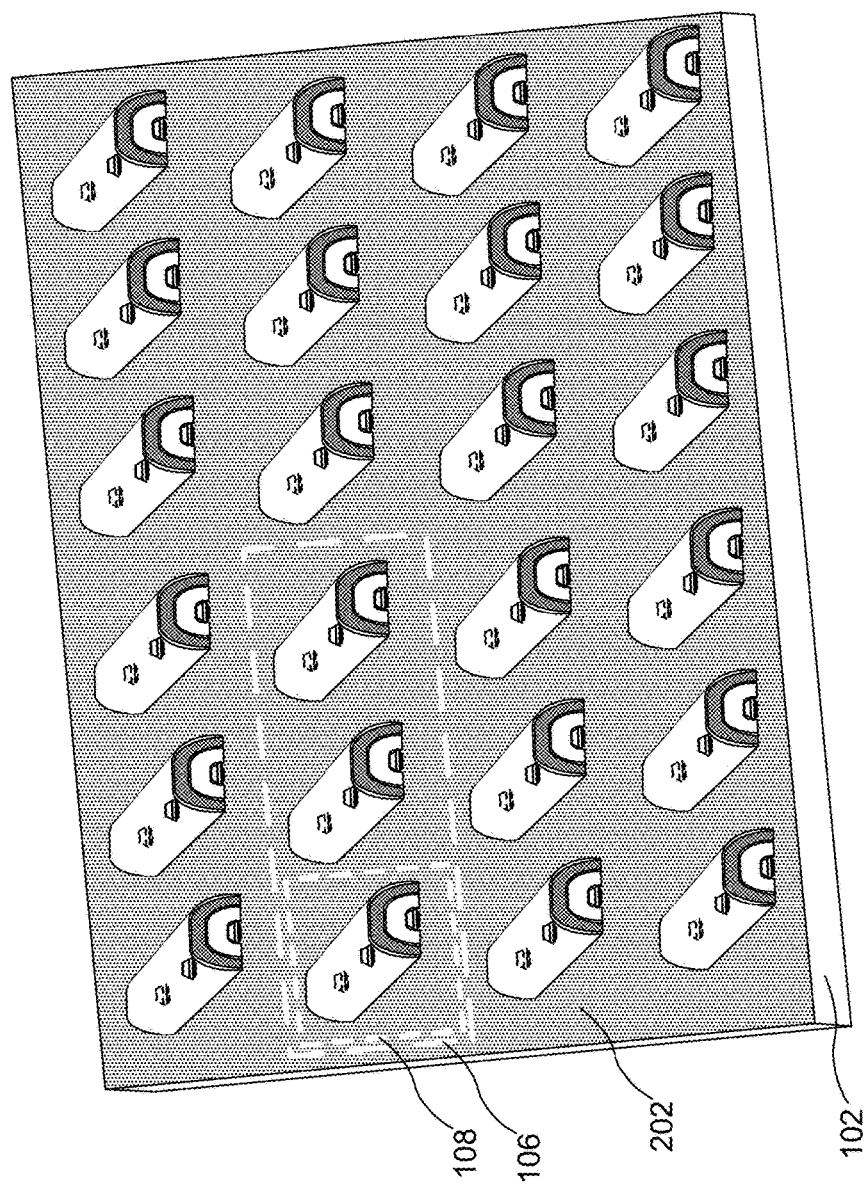
FIG. 11A is a combination view illustration of a display including a plurality of micro LED devices and a plurality of light pipes and wavelength conversion layers over the plurality of micro LED devices in accordance with an embodiment of the invention.

Referring now to FIG. 11A, a combination view illustration is provided of a display including a plurality of micro LED devices 400 bonded to a display substrate 102, a plurality of light distribution layers 320 in the form of light pipes around the plurality of micro LED devices 400, and a plurality of wavelength conversion layers 310 over the plurality of light distribution layers 320. In the particular embodiment illustrated, a pixel 106 includes a plurality of micro LED devices 400 within light distribution layers 320 and wavelength conversion layers 310 designed to convert emission, e.g. in an RGB subpixel arrangement. In an embodiment, a black matrix material 202 can be formed over the substrate 102 and between the light pipes to absorb light and prevent color bleeding into adjacent pixels 106 or subpixels 108. Alternatively, the black matrix material 202 can be substituted with a white matrix material to reflect light and prevent color bleeding into adjacent pixels 106 or subpixels 108.

When arranged in a pixel configuration, each subpixel 108 may contain a single phosphor color emission, where present. Each subpixel may likewise contain a different phosphor color emission, where present. In this manner, secondary absorption of light emitted from a phosphor particle emitting a different spectrum (e.g. absorption of green light emitted from a green emitting phosphor particle by a red emitting phosphor particle) is avoided. This may increase efficiency and reduce unintended color shift. Such pixel and subpixel configurations can be used for the final output of white light, or any other color of light.

For example, a pixel may contain 3 micro LED devices in 3 light pipes, or a pair of micro LED devices in each light pipe, with all the micro LED devices designed to emit blue light, with one red emitting wavelength conversion layer over one light pipe, one green emitting wavelength conversion layer over a second light pipe, and the third light pipe either not including a wavelength conversion layer over it or including a blue emitting wavelength conversion layer over it. In one embodiment, white light can be generated by incorporating multiple micro LED devices into a pixel, with each micro LED device designed to emit UV light, with one red emitting conversion layer over a first light pipe, one green emitting wavelength conversion layer over a second light pipe, and one blue emitting wavelength conversion layer over a third light pipe. In another embodiment, white light can be generated by incorporating combinations of micro LED devices designed for different emission spectrum and different wavelength conversion layers, or no wavelength conversion layers. In another exemplary embodiment, white light can be generated with a light pipe around a micro LED device designed for red emission with no overlying wavelength conversion layer, a light pipe around a micro LED device designed for blue emission with an overlying wavelength conversion layer designed for green emission, and a light pipe around a micro LED device designed for blue emission with no overlying wavelength conversion layer.

In the above exemplary embodiments, a red-green-blue (RGB) subpixel arrangement is obtained, and each pixel includes three subpixels that emit red, green and blue lights, respectively. It is to be appreciated that the RGB arrangement is exemplary and that embodiments are not so limited. Examples of other subpixel arrangements that can be utilized include, but are not limited to, red-green-blue-yellow (RGBY), red-green-blue-yellow-cyan (RGBYC), or red-green-blue-white (RGBW), or other subpixel matrix schemes where the pixels may have different number of subpixels, such as the displays manufactured under the trademark name PenTile®.

FIGS. 11B-11E are schematic side view illustration of various pixel configurations in accordance with embodiments of the invention. While not specifically illustrated, each micro LED device 400 may be one of a pair of micro LED devices 400 mounted within a reflective bank layer 142 of a subpixel 108, for example, as illustrated and described above with regard to FIGS. 1A-1D.

Figure 11B:
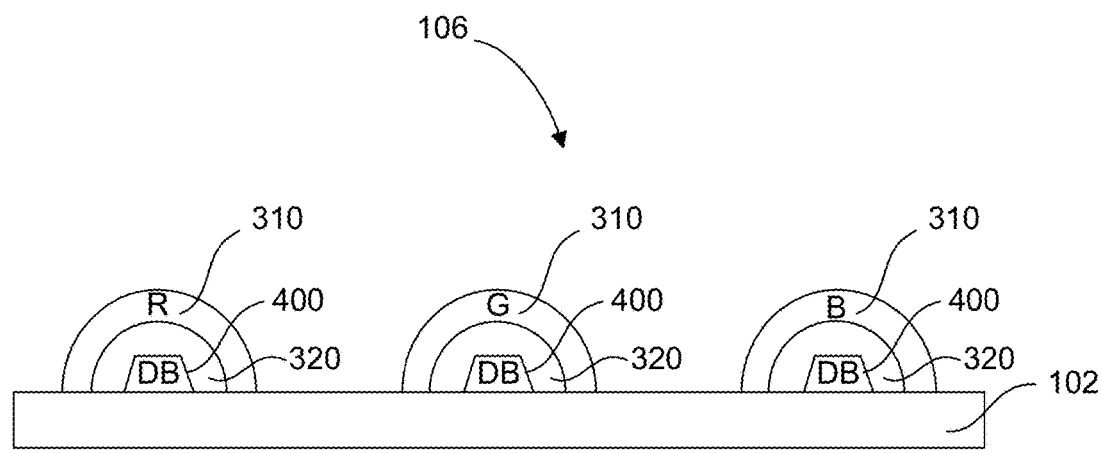
FIG. 11B-11E are schematic side view illustrations of pixels in accordance with an embodiments of the invention.

FIG. 11B is a schematic side view illustration of a pixel 106 in accordance with an embodiment of the invention. As illustrated in FIG. 11B, each micro LED device 400 is designed to emit a deep blue (DB) color spectrum. In such an embodiment, the different wavelength conversion layers 310 can be designed to emit red (R), green (G), and blue (B) in an RGB subpixel arrangement.

Figure 11C:
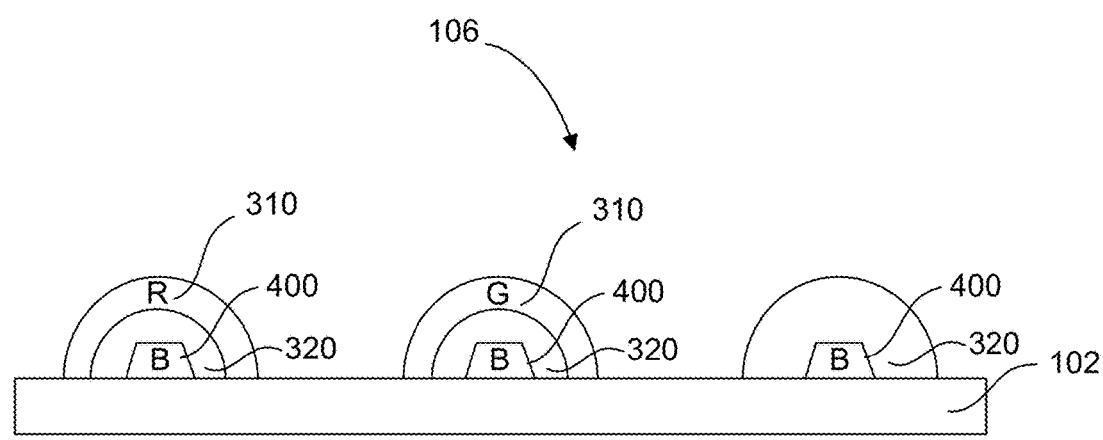

FIG. 11C is a schematic side view illustration of a pixel 106 in accordance with an embodiment of the invention. As illustrated in FIG. 11C, each micro LED device 400 is designed to emit a blue (B) color spectrum. In such an embodiment, the different wavelength conversion layers 310 can be designed to emit red (R) and green (G). A wavelength conversion layer 310 is not formed over the third light distribution layer 320. In this manner an RGB subpixel arrangement is achieved without having to covert the blue light from the blue emitting subpixel. In an embodiment, the third light distribution layer 320 can be made thicker than the other two light distribution layers 320 over which wavelength conversion layers 310 are formed in order to achieve similar micro lens characteristics. For example, the thickness of the third light distribution layer 320 may be similar to the total thickness of the first light distribution layer 320 and first red wavelength conversion layer 310 (and any intermediate layers).

Figure 11D:
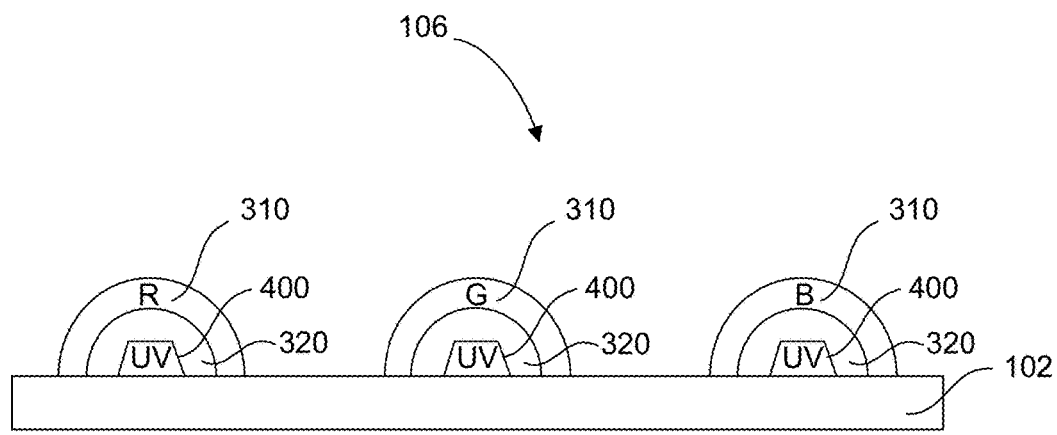

FIG. 11D is a schematic side view illustration of a pixel 106 in accordance with an embodiment of the invention. As illustrated in FIG. 11D, each micro LED device 400 is designed to emit an ultraviolet (UV) color spectrum. In such an embodiment, the different wavelength conversion layers 310 can be designed to emit red (R), green (G), and blue (B).

Figure 11E:
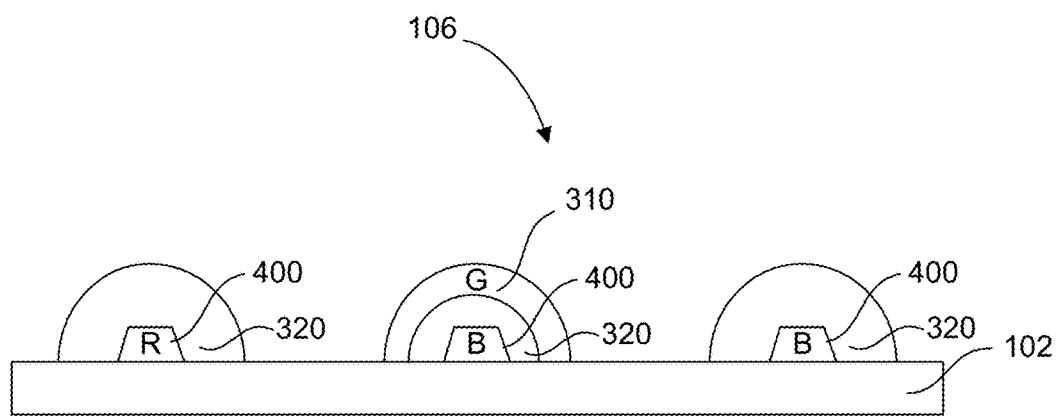

FIG. 11E is a schematic side view illustration of a pixel 106 in accordance with an embodiment of the invention. As illustrated in FIG. 11E, the pixel 106 includes micro LED devices 400 designed to emit a red (R) or blue (B) color emission spectrum. As illustrated, a green (G) emitting wavelength conversion layer 310 is formed over one of the light distribution layers 320 around one of the blue emitting micro LED device 400, and a wavelength conversion layer 310 is not required to be formed over the light distribution layers 320 formed around the red emitting micro LED device 400 or the other blue emitting micro LED device 400. Such a configuration may be implemented, for example, when it is possible to fabricate and integrate blue emitting and red emitting micro LED devices that are more efficient than green emitting micro LED devices. In such an embodiment, it may be more efficient to convert blue light to green light with a wavelength conversion layer. Such a configuration may also be useful when providing a broad spectrum at the visual response peak, around 555 nm. Such a configuration may also be useful for increasing the color rendering index (CRI), for example by using a narrow red (or blue) emission spectrum from the micro LED device rather than a broader phosphor particle emission spectrum. Such a configuration may also allow for controlling the correlated control temperature (CCT) of the light emitting device, and hence controlling the warmth, without losing lumens due to conversion in the red spectrum. As described above with regard to FIG. 11C, the light distribution layer 320 formed around the red emitting micro LED device or the other blue emitting micro LED device in FIG. 11E may be made thicker than the other light distribution layer over which a wavelength conversion layer is formed in order to achieve similar micro lens characteristics.

Referring now to FIGS. 11F-11J various pixel configurations are illustrated similar to those illustrated and described above with regard to FIGS. 11A-11E with one difference being that each light distribution layer 320 in the form of a light pipe spans across multiple subpixels within a pixel 106. For example, the embodiment illustrated in FIG. 11F may be an exemplary RGB subpixel arrangement in which a light pipe 320 is formed around a micro LED device pair in each subpixel of the pixel 106, however, other subpixel arrangements are possible such as, but not limited to RGBY, RGBYC, RGBW, or others. In the particular cross-section illustrated, only a single micro LED device 400 of a pair is illustrated. In such arrangements the light pipe spanning across multiple subpixels within a pixel allows for color mixing between subpixels. Such a configuration may be used in applications where the micro LED devices or subpixels are far enough apart that they could otherwise be perceived by the human eye (e.g. approximately 100 µm or more) and perceived as small dots. The color mixing associated with the light pipe configurations of FIGS. 11F-11J may be used to blend the micro LED device emissions so that they are not perceived by the human eye. One possible application may be in a heads up display where the viewing distance is short, and it is more likely that the viewer is to be capable of perceiving emission spectra from individual subpixels or micro LED devices.

While not specifically illustrated, each micro LED device 400 in FIGS. 11G-11J may be one of a pair of micro LED devices 400 mounted within a reflective bank layer 142 of a subpixel 108, for example, as illustrated and described above with regard to FIGS. 1A-1D. The arrangements of emission spectra for the micro LED devices 400 and wavelength conversion layers 310 is similar to that of FIGS. 11B-11E, with one difference being that the wavelength conversion layers 310 are formed over only specific portions of the light pipe 320 shared by the micro LED devices 400 in the pixel 106. Additional modifications can also be incorporated into the configurations illustrated in FIGS. 11G-11J. The profile of the light pipe 320 can be altered over certain micro LED devices 400. For example, the light pipe 320 can be made thicker over "naked" micro LED devices 400 over which a wavelength conversion layer 310 is not formed. The light pipes 320 of FIGS. 11A-11J can also be tapered, for example, as previously described with regard to FIGS. 9C-9D, or include reflective layers as previously described with regard to FIGS. 10A-10F.

Referring now to FIGS. 12A-12F, various configurations for implementing micro LED device pairs are described. The embodiments illustrated and described with regard to FIGS. 12A-12F may be combinable with other configurations described herein. For example, the configurations illustrated and described with regard to FIGS. 12A-12E may be combinable with the pixel arrangements described above with regard to FIGS. 11A-11E, and the configurations illustrated and described with regard to FIG. 12F may be combinable with the pixel arrangements described above with regard to FIGS. 11-F-11J.

Figure 12A:
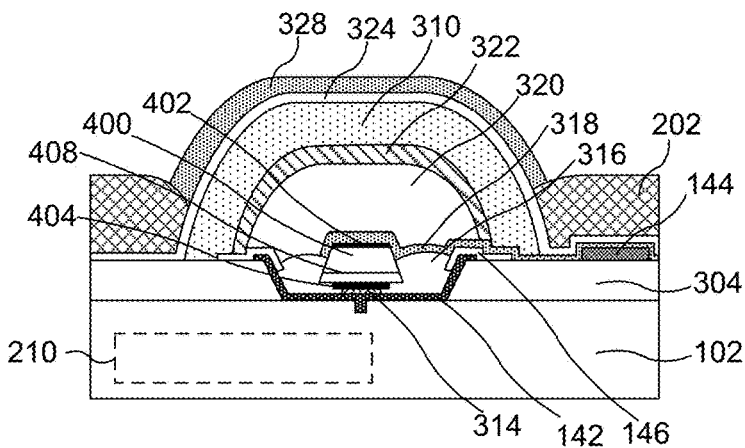
FIG. 12A is a cross-sectional side view illustration of a light pipe and wavelength conversion layer over a reflective bank structure in accordance with an embodiment of the invention.
Figure 12B:
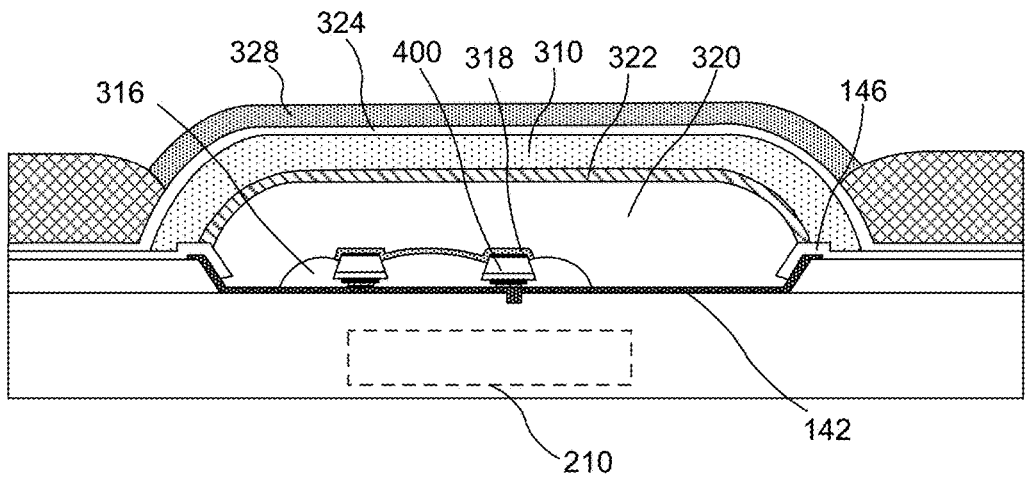
FIG. 12B is a cross-sectional side view illustration orthogonal to the cross-sectional side view illustration in FIG. 12A illustrating a top electrode layer formed over a pair of micro LED devices in accordance with an embodiment of the invention.

FIG. 12A illustrates a cross-sectional side view across the shorter width of a rectangular shaped reflective bank layer 142 illustrated in FIG. 7B, while FIG. 12B is an illustration of a longer width, orthogonal to the shorter width, of the rectangular shaped reflective bank layer 142 illustrated in FIG. 7B. It is to be appreciated that the particular embodiments illustrated in FIGS. 12A-12F are provided to illustrate particular examples for integrating micro LED device pairs in a redundancy and repair scheme, combined with a wavelength conversion layer for a tunable color emission spectrum. The particular embodiments illustrated include a wavelength conversion layer 310 formed over an elongated dome shaped light distribution layer 320 in the form a light pipe, where the wavelength conversion layer 310 is also formed over the reflective bank layer 142. Furthermore, FIGS. 12A-12F illustrate various top electrode configurations. However, as previously described in the preceding embodiments and figures, embodiments of the invention are not so limited. Accordingly, embodiments of the invention are not limited to the specific combinations of the top electrode configurations and redundancy and repair schemes illustrated in FIGS. 12A-12F.

In an embodiment a pair of micro LED devices 400 are bonded to a reflective bank layer 142 on or within a substrate 102 including an underlying circuitry 210. The micro LED devices 400 can be transferred and bonded to the substrate 102 as part of an array of micro LED devices 400 using a variety of techniques including a transfer bonding process, transfer using elastomeric stamps, or transfer and bonding using an electrostatic transfer head array, as previously described. Following the transfer process, and prior to formation of the passivation layers 316 and top electrode layers 318 illustrated in FIGS. 12A-12F the display substrate 102 can be examined for defective, missing, or contaminated micro LED devices. In this manner, detection of defective, missing, or contaminated micro LED devices can be used to potentially alter the deposition patterns of the passivation layer 316 and top electrode layers 318, as well as the wavelength conversion layers, and to potentially transfer replacement micro LED devices where required.

Still referring to FIGS. 12A-12B, a sidewall passivation layer 316 can be formed around the sidewalls of the micro LED devices 400. In an embodiment where the micro LED devices 400 are vertical LED devices, the sidewall passivation layer 316 covers and spans the quantum well structures 408. In accordance with embodiments of the invention, the sidewall passivation layer 316 may be transparent or semi-transparent to the visible wavelength spectrum so as to not significantly degrade light extraction efficiency from sidewalls of the micro LED devices 400. Sidewall passivation layer 316 may be formed of a variety of materials such as, but not limited to epoxy, silicone, acrylic, poly(methyl methacrylate) (PMMA), benzocyclobutene (BCB), polyimide, and polyester. In an embodiment, sidewall passivation layer 316 is formed by ink jet printing around the light emitting devices 400, followed by curing. In an embodiment, sidewall passivation layer 316 is cured with ultraviolet (UV) light to minimize volume change as a result of cure and protect the integrity of the bond between the micro LED devices and the reflective bank layer 142, though thermal curing may also be performed. Sidewall passivation layer 316 can also be deposited using other techniques such as slit coating, physical vapor deposition or chemical vapor deposition of a dielectric material such as a nitride or oxide, spin on technique such as a spin on glass, or spray coating followed by solvent evaporation. In an embodiment, sidewall passivation layer is an a-staged or b-staged coating already formed over the substrate 102 prior to bonding the micro LED devices 400 wherein the micro LED devices punch through the coating during the transfer and bonding operations, and the coating is then cured after bonding of the micro LED devices 400.

In an embodiment the sidewall passivation layer 316 at least partially covers the reflective bank layer 142. The sidewall passivation layer may completely cover the reflective bank layer 142, however, this is not required. Any combination of other insulating layers can be used to electrically insulate the reflective bank layer 142 from other electrically conductive layers. For example, insulator layer 146 can be deposited over edges of the reflective bank layer 142. The reflective bank layer 142 can be discontinuous, for example, so that sidewalls are not electrically connected to the bottom surface of the reflective bank layer 142 in electrical communication with the micro LED devices 400. In accordance with embodiments of the invention, a sidewall passivation layer 316 may not be required where a conformal dielectric barrier layer 107 is present along sidewalls of the micro LED devices 400. Alternatively, a sidewall passivation layer 316 may be formed in combination with an existing conformal dielectric barrier layer 107.

In embodiments including vertical micro LED device pairs, following the formation of optional sidewall passivation layer 316, a top electrode layer 318 is formed on the micro LED device 400 pairs and in electrical contact with the top contacts 402 and ground tie line 144. Depending upon the particular application, top electrode layer 318 may be opaque, reflective, transparent, or semi-transparent to the visible wavelength. Exemplary transparent conductive materials include amorphous silicon, transparent conductive oxides (TCO) such as indium-tin-oxide (ITO) and indium-zinc-oxide (IZO), carbon nanotube film, or a transparent conductive polymer such as poly(3,4-ethylenedioxythiophene) (PEDOT), polyaniline, polyacetylene, polypyrrole, and polythiophene. In an embodiment top electrode layer 318 is approximately 50 nm-1 µm thick ITO-silver-ITO stack, with the silver layer thin enough to be transparent to the visible wavelength spectrum. In a particular embodiment, the top electrode layer 318 is formed by ink jet printing. In an embodiment top electrode layer 318 is approximately 50 nm-1 µm thick PEDOT. Other methods of formation may include chemical vapor deposition (CVD), physical vapor deposition (PVD), or spin coating depending upon the desired area to be coated and any thermal constraints.

Figure 12C:
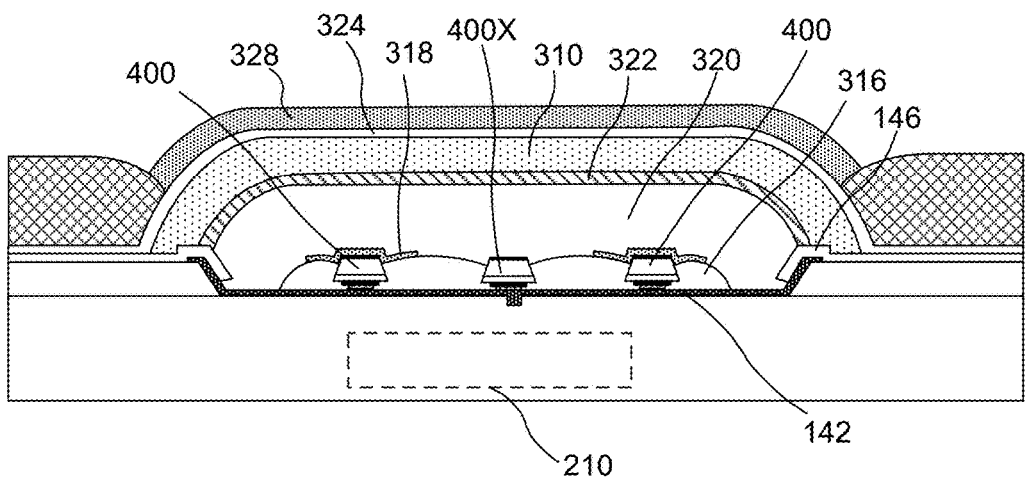
FIG. 12C is a cross-sectional side view illustration orthogonal to the cross-sectional side view illustration in FIG. 12A illustrating one or more top electrode layers formed over a pair of micro LED devices in accordance with an embodiment of the invention.
Figure 12D:
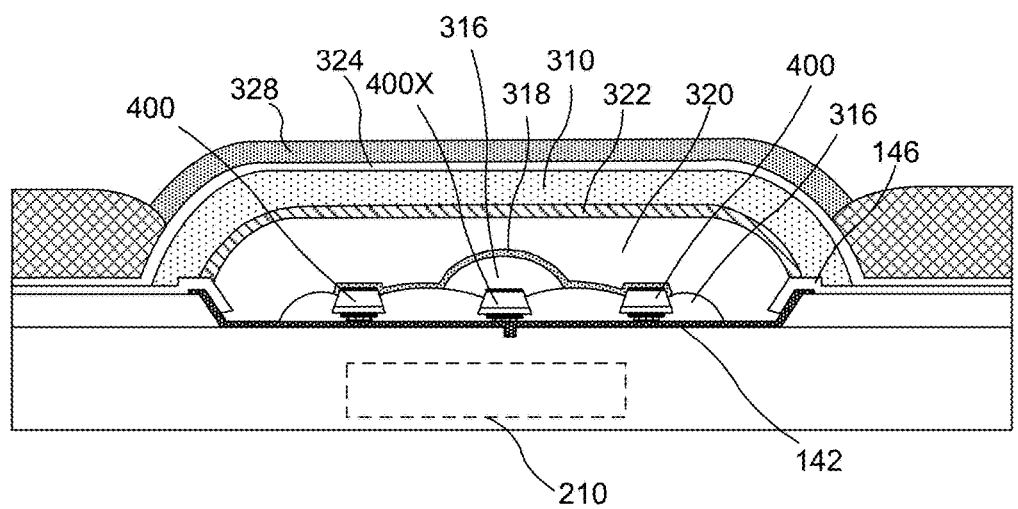
FIG. 12D is a cross-sectional side view illustration orthogonal to the cross-sectional side view illustration in FIG. 12A illustrating a top electrode layer formed over a plurality of micro LED devices in accordance with an embodiment of the invention.
Figure 12E:
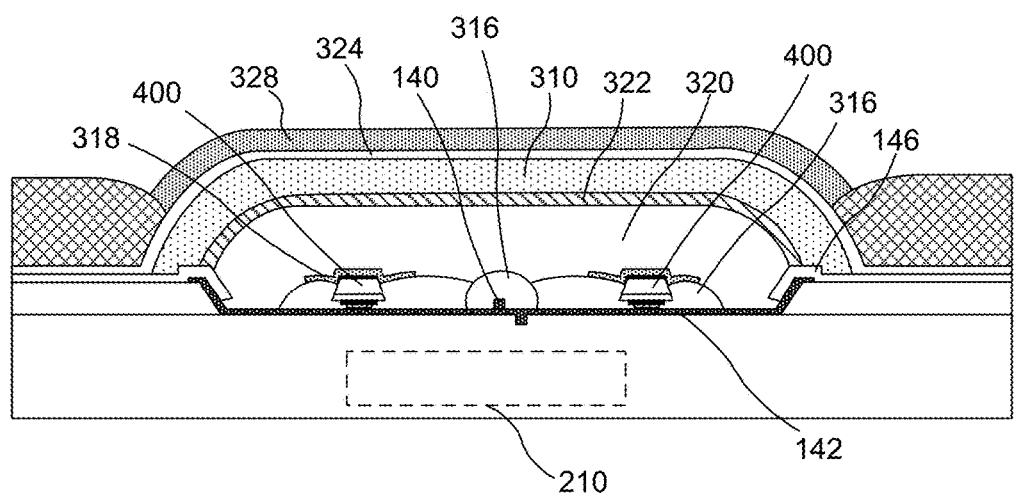
FIG. 12E is a cross-sectional side view illustration orthogonal to the cross-sectional side view illustration in FIG. 12A illustrating one or more top electrode layers formed over a pair of micro LED devices in accordance with an embodiment of the invention.
Figure 12F:
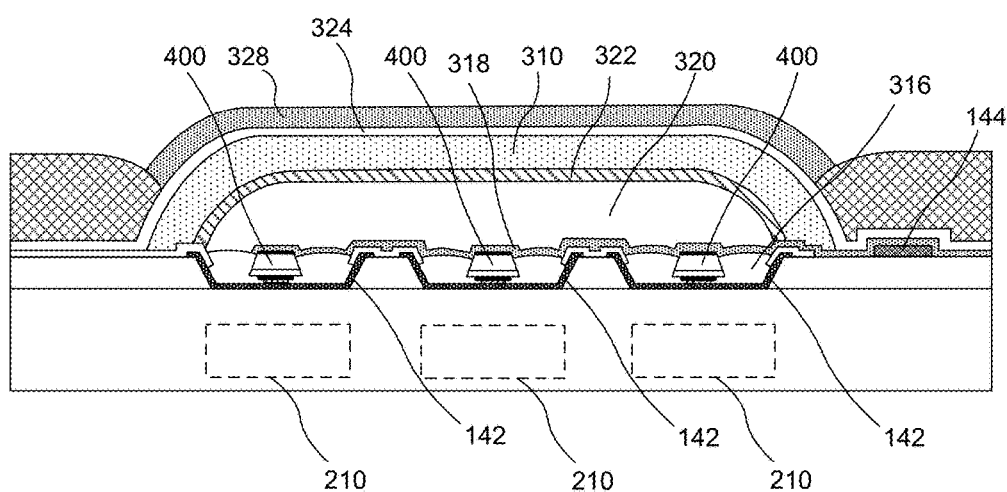
FIG. 12F is a cross-sectional side view illustration of a plurality of micro LED devices with top and bottom contacts within a plurality of reflective bank structures, and a light pipe and wavelength conversion layer over the plurality of micro LED devices in accordance with an embodiment of the invention.

In accordance with embodiments of the present invention, one or more top electrode layers 318 may be used to electrically connect the micro LED device 400 pairs from the array of subpixels to ground tie line 144. A variety of configurations are possible with different redundancy and repair configurations. In interest of clarity, FIGS. 12A-12E are limited to exemplary top electrode layer 318 configurations within a single subpixel, and FIG. 12F shows an exemplary top electrode layer 318 configuration within a single pixel. A more detailed description is provided with regard to FIGS. 15-19 for various top electrode layer configurations across the pixel area.

Referring again to FIG. 12B, in one embodiment a single top electrode layer is illustrated as connecting both micro LED devices 400 of the pair to ground 144/116. For example, such a configuration may be used when both micro LED devices 400 have been determined to be transferred to the display substrate and not be defective or contaminated. Referring to FIG. 12C, an embodiment is illustrated where a micro LED device 400X is determined to be defective or contaminated. In the embodiment illustrated, a repair micro LED device 400 is then bonded to the reflective bank layer 142, and one or more top electrode layers 318 are then formed over only the operable micro LED device 400 pair to electrically connect them to ground 144/116. FIGS. 12D-12E illustrate embodiments in which a passivation layer 316 can be formed over defective or contaminated micro LED devices 400X, or over a bonding layer 140 of a missing micro LED device. In the embodiment illustrated in FIG. 12D a single top electrode layer 318 is formed over the operable and defective, contaminated, or missing micro LED devices, where the passivation layer 316 prevents electrical contact with the defective, contaminated, or missing micro LED devices. In the embodiment illustrated in FIG. 12E, one or more top electrode layers 318 are formed only over the operable micro LED devices.

Figure 11F:
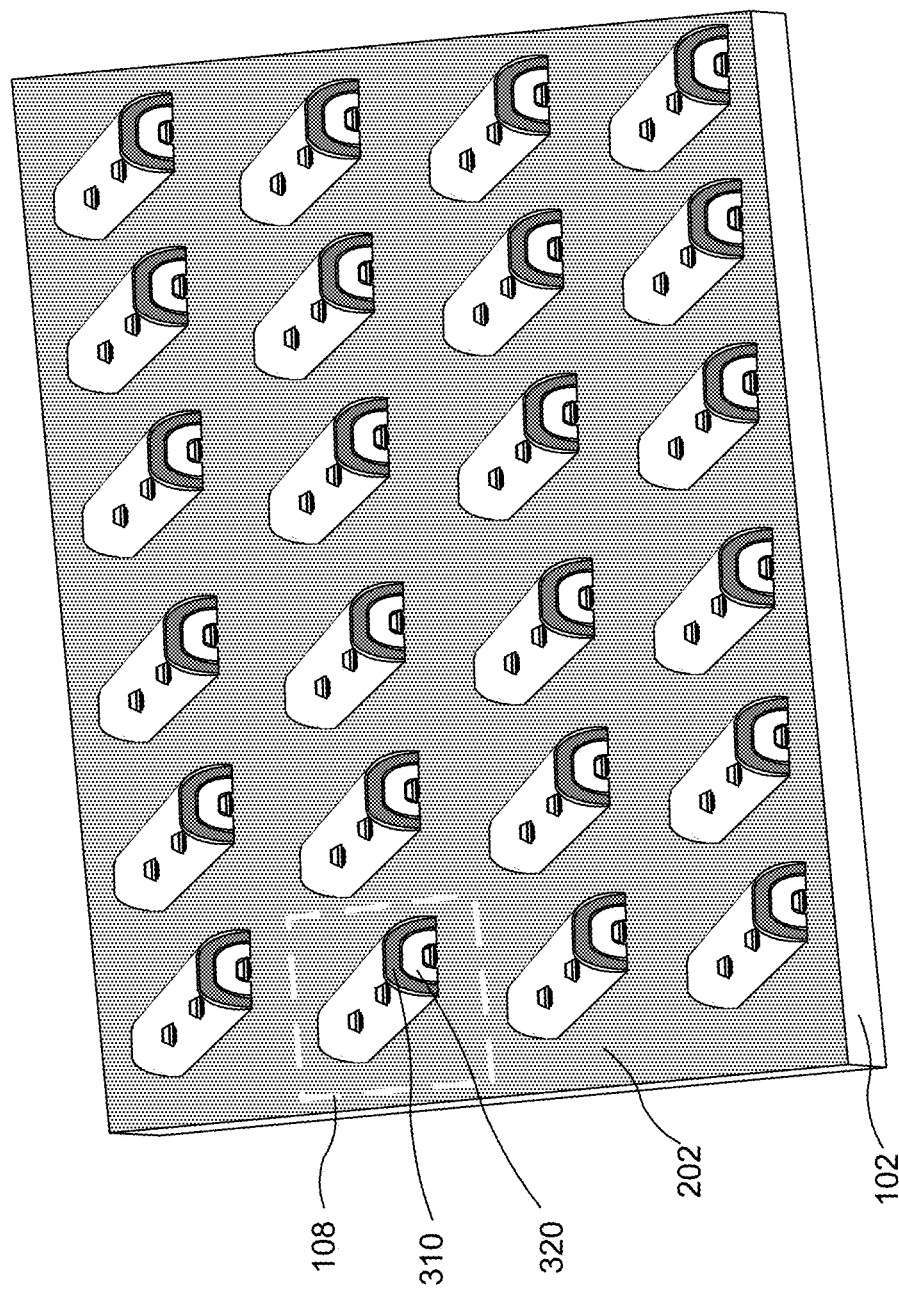
FIG. 11F is a combination view illustration of a display including a plurality of micro LED devices and a plurality of light pipes and wavelength conversion layers around the plurality of micro LED devices in accordance with an embodiment of the invention.
Figure 11G:
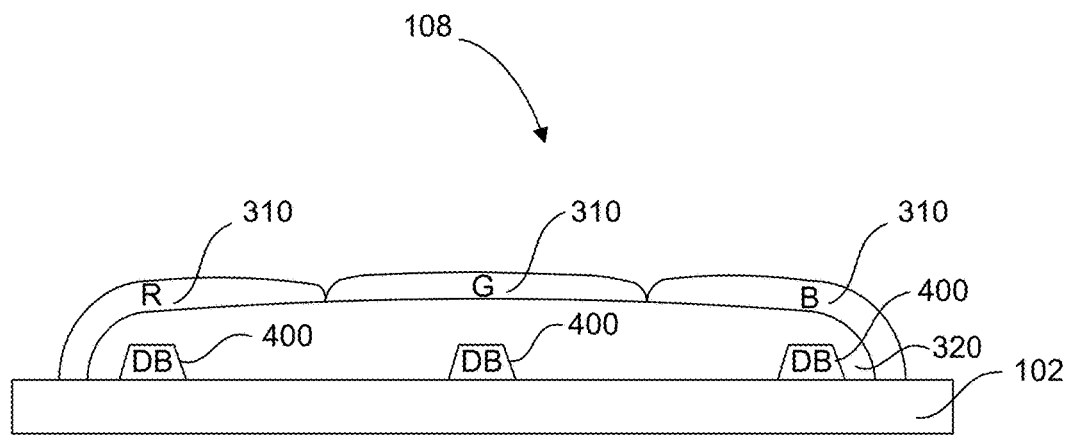
FIG. 11G-J are schematic side view illustrations of pixels in accordance with embodiments of the invention.
Figure 11H:
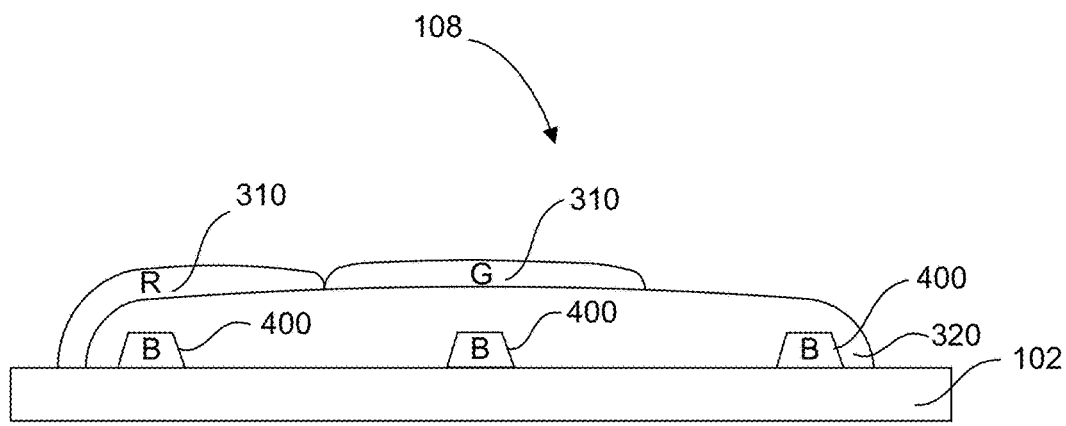
Figure 11I:
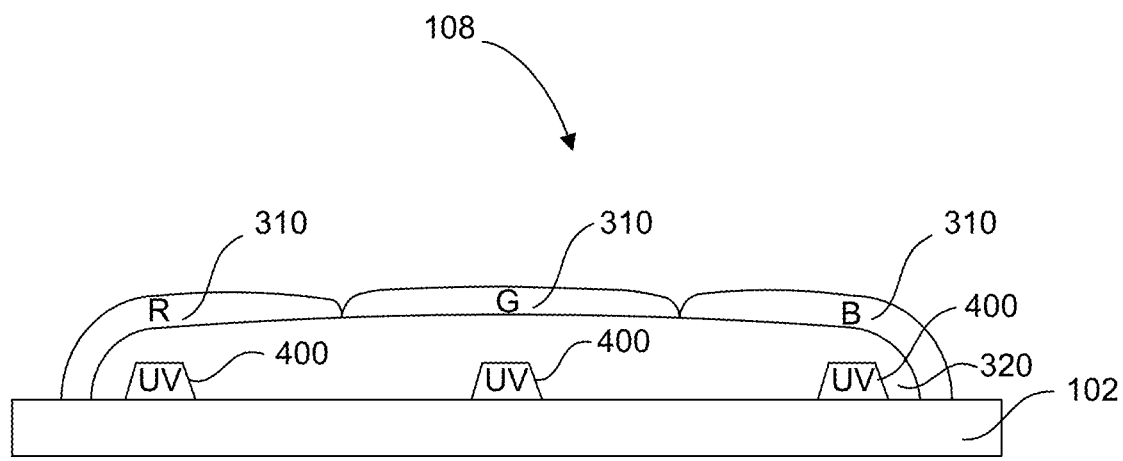
Figure 11J:
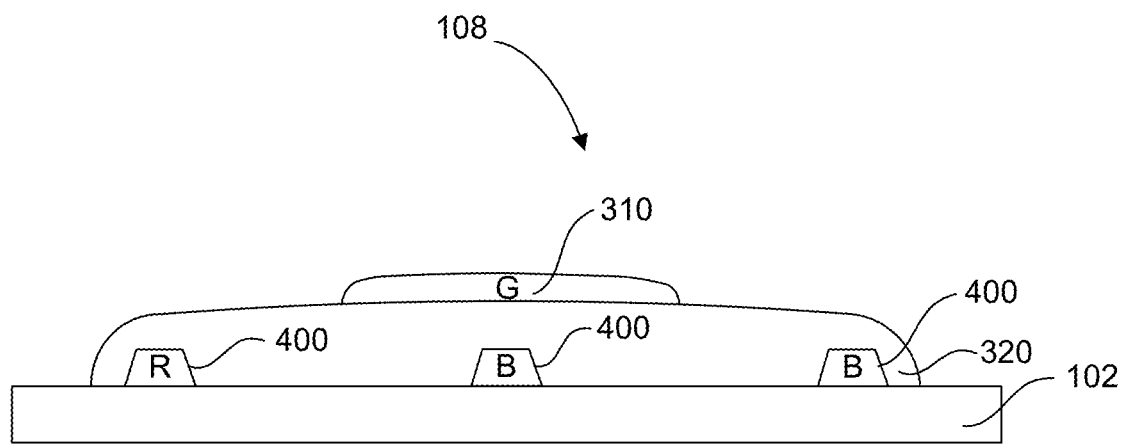

Optional wavelength distribution layer 320, optional matching layer 322, wavelength conversion layer 310, and optional barrier layer 324 may then be formed as described above with regard to FIG. 9A. Referring briefly back to FIGS. 11A, 11F a black matrix (or alternatively white matrix) material 202 is illustrated between the reflective bank layers 142 in order to block light transmission, and to separate bleeding of light between adjacent subpixels. Black (or white) matrix 202 can be formed from a method that is appropriate based upon the material used, and composition of layers already formed. Manner of formation may also be determined by whether the black (or white) matrix is formed in a single side manner (see FIG. 14A) or a top press down manner (see FIG. 14B). For example, black (or white) matrix 202 can be applied using ink jet printing, sputter and etching, spin coating with lift-off, or a printing method. In some embodiments, black (or white) matrix 202 is formed by ink jet printing and UV cured in order to not thermally degrade the phosphor particles in a wavelength conversion layer 110 already formed. Exemplary black matrix materials include carbon, metal films (e.g. nickel, aluminum, molybdenum, and alloys thereof), metal oxide films (e.g. chromium oxide), and metal nitride films (e.g. chromium nitride), organic resins, glass pastes, and resins or pastes including a black pigment or silver particles. Exemplary white matrix materials include metal particles or $TiO_2$ particles loaded within a polymer, organic resin, or glass paste, for example.

Referring again to FIGS. 12A-12E a color filter layer 328 may optionally be formed over the wavelength conversion layer 310 to filter out colors emitting through the wavelength conversion layer 310 other than those desired and to sharpen the emission spectrum of the light emitting device. By way of example, a red color filter layer 328 may be placed over a wavelength conversion layer 310 including red emitting phosphor particles in order to filter out colors other than red, a green color filter layer 328 may be placed over a wavelength conversion layer 310 including green emitting phosphor particles in order to filter out colors other than green, and a blue color filter layer 328 may be placed over a wavelength conversion layer 310 including blue emitting phosphor particles in order to filter out colors other than blue. Referring back to FIG. 11B, in an embodiment, a blue color filer may not be necessary over a blue wavelength conversion layer 310 wherein the underlying micro LED device 400 is deep blue emitting. Referring back to FIG. 11C, in an embodiment, a blue color filer may not be necessary over naked (e.g. no wavelength conversion layer) blue emitting underlying micro LED device 400. It is to be appreciated that these configurations are exemplary and a variety of configurations are possible depending upon desired light emission spectrum. Suitable materials for the color filter include pigments or dyes as previously described above. In an embodiment, color filter layer 328 includes a pigment or dye dispersed in a transparent matrix material. In an embodiment, the matrix material is the same polymer used for the wavelength conversion layer 310, such as epoxy, silicone, or acrylic. Likewise, the color filter may be formed using similar techniques, such as ink jet printing with UV cure. In an embodiment, the wavelength conversion layer 310 has an index of refraction within 0.3, or more particularly within 0.1, of the index of refraction for the wavelength conversion layer 310. In the embodiments illustrated in FIGS. 12A-12E the color filter layer 328 is formed after the black matrix 202. In other embodiments, the color filter layer 328 is formed before the black matrix 202.

Referring now to FIG. 12F a cross-sectional side view illustration is provided of a light pipe around a plurality of micro LED devices with top and bottom contacts within a plurality of reflective bank structures, and a wavelength conversion layer over the light pipe in accordance with embodiments of the invention. The configuration illustrated in FIG. 12F is similar to that of FIG. 12A, with the difference being that the light pipe 320 is formed over multiple subpixels in a pixel, with each reflective bank layer 142 corresponding to a separate subpixel that is independently addressable by its own underlying circuitry 210. Similar to the other configurations, the wavelength conversion layer 310 may be wider than the openings in the patterned bank layer 304 including the multiple reflective bank layers 142.

Figure 13A:
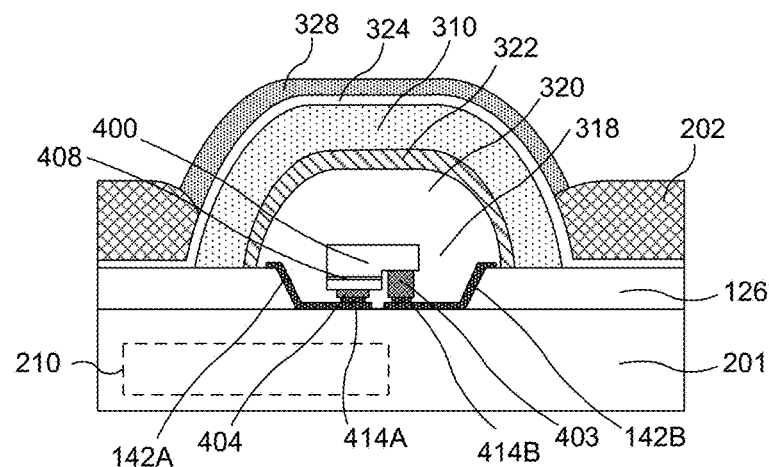
FIGS. 13A-13B are cross-sectional side view illustrations of a plurality of micro LED devices with bottom contacts within a reflective bank structure, and a light pipe and wavelength conversion layer over the plurality of micro LED devices in accordance with embodiments of the invention.
Figure 13B:
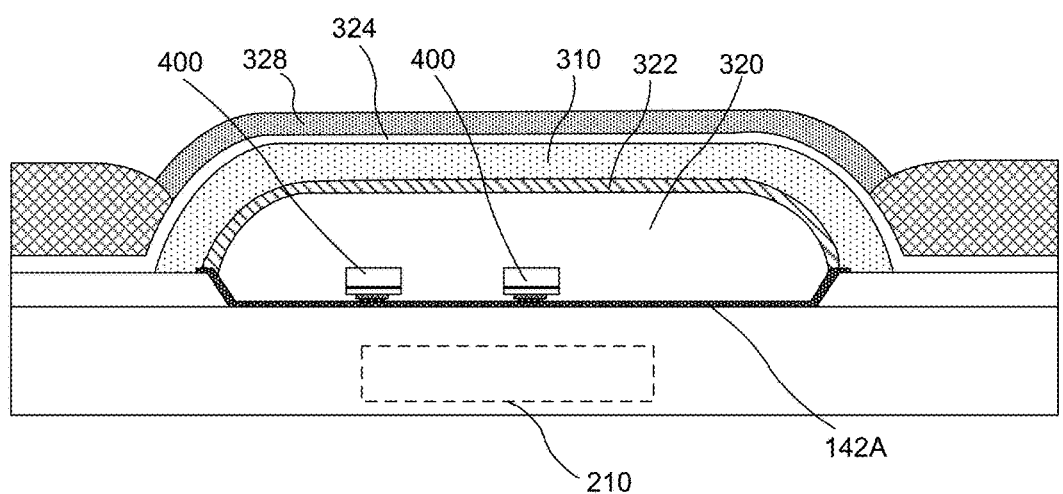
Figure 13C:
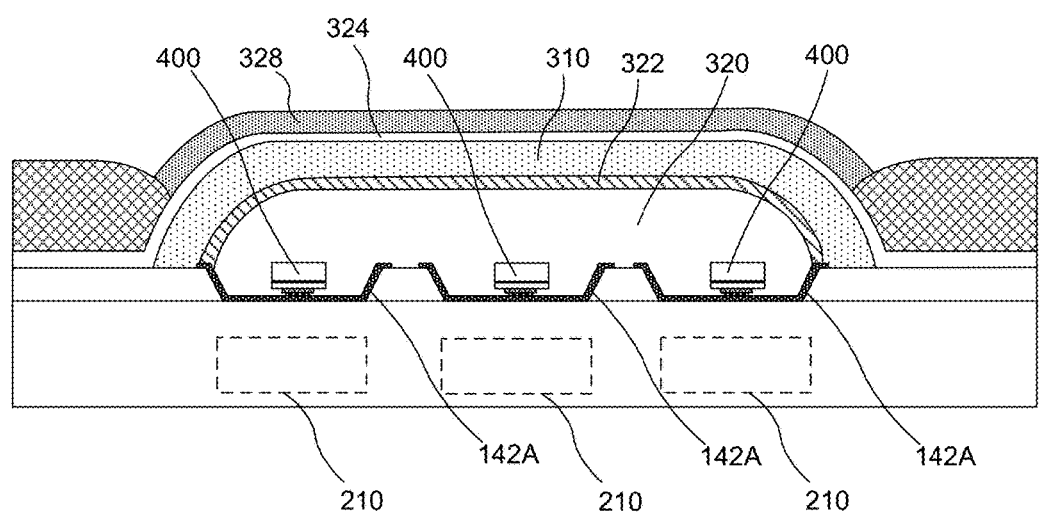
FIG. 13C is a cross-sectional side view illustration of a plurality of micro LED devices with bottom contacts within a plurality of reflective bank structures, and a light pipe and wavelength conversion layer over the plurality of micro LED devices in accordance with an embodiment of the invention.

FIGS. 13A-13B are cross-sectional side view illustrations of a light pipe around a plurality of micro LED devices with bottom contacts within a reflective bank structure, and a wavelength conversion layer over the light pipe in accordance with embodiments of the invention. FIG. 13C is a cross-sectional side view illustrations of a light pipe around a plurality of micro LED devices with bottom contacts within a plurality of reflective bank structures, and a wavelength conversion layer over the light pipe in accordance with embodiments of the invention. FIGS. 13A-13C are similar to those of FIGS. 12A-12B and 12F with one difference being that the micro LED devices 400 include bottom contacts 404, 403 rather than both a bottom and top contact. As a result, it may not be required to form a top electrode layer to contact the ground tie line 144. Sidewall passivation layer 316 also may be omitted, and the light pipe 320 or other layers can electrically insulate the reflective bank structure layers 142A, 142B and quantum well structure 408. As illustrated, reflective bank structure layers 142A, 142B are electrically insulated from one another.

Figure 14A:
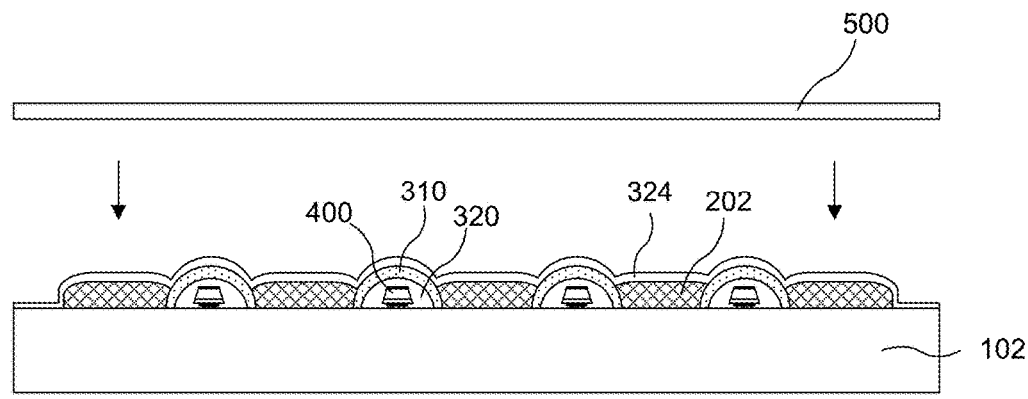
FIG. 14A is an illustration of a single side manner for applying wavelength conversion layers over micro LED devices, and a black matrix between subpixels in accordance with an embodiment of the invention.
Figure 14B:
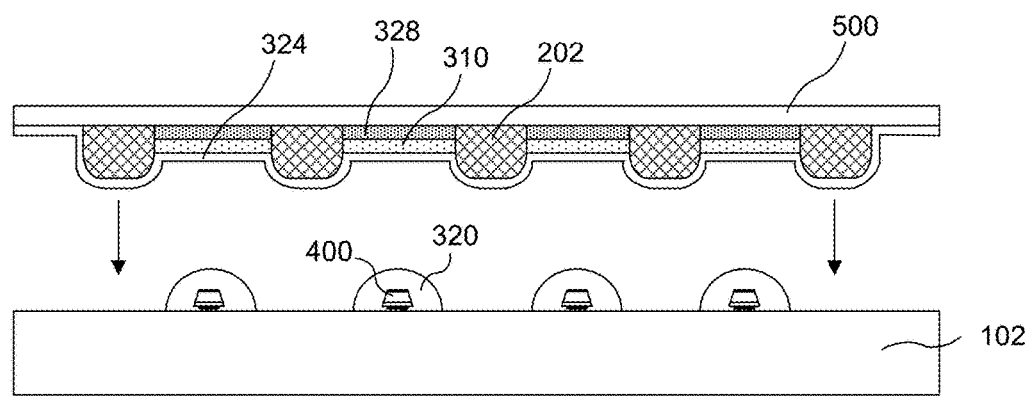
FIG. 14B is an illustration of a top press down manner for applying wavelength conversion layer over micro LED devices, and a black matrix between subpixels in accordance with an embodiment of the invention.

Referring now to FIGS. 14A-14B, alternative cover designs are described and illustrated for packaging the displays in accordance with embodiments. FIG. 14A is an illustration of a single side fabrication manner for applying wavelength conversion layers and a black (or white) matrix between subpixels in accordance with an embodiment. As illustrated, the wavelength conversion layers 310 and matrix 202 are formed on substrate 102 prior to applying a cover 500 over the light emitting devices. Top cover 500 can be rigid or flexible, and can be applied in a variety of manners. In an embodiment, top cover 500 is a transparent plastic material and is laminated onto the display substrate 102. In an embodiment, top cover 500 is a rigid glass plate that is applied over the light display substrate 102, and sealed around the peripheral edges of the display substrate 102 with a sealant. A getter material may optionally be placed inside the sealed region containing the micro LED devices and the wavelength conversion layer 310 to absorb moisture, particularly if the wavelength conversion layer includes quantum dots.

FIG. 14B is an illustration of a top press down manner for applying wavelength conversion layers and a black (or white) matrix between subpixels in accordance with an embodiment. In the embodiment illustrated in FIG. 14B, the matrix 202, wavelength conversion layer 310, oxygen barrier film 324, and optional color filter layer 328 are formed on the top cover 500 and pressed down over the array of micro LED devices 400 and light distribution layers 320. In an embodiment, the top cover 500 of FIG. 14B is a rigid glass plate, and is sealed around the peripheral edges of the display substrate 102 with a sealant. A getter material may optionally be placed inside the sealed region containing the micro LED devices and the wavelength conversion layer 310 to absorb moisture, particularly if the wavelength conversion layer includes quantum dots. Either of the top cover configurations of FIGS. 14A-14B can be used when forming the display devices described and illustrated herein.

Figure 15:
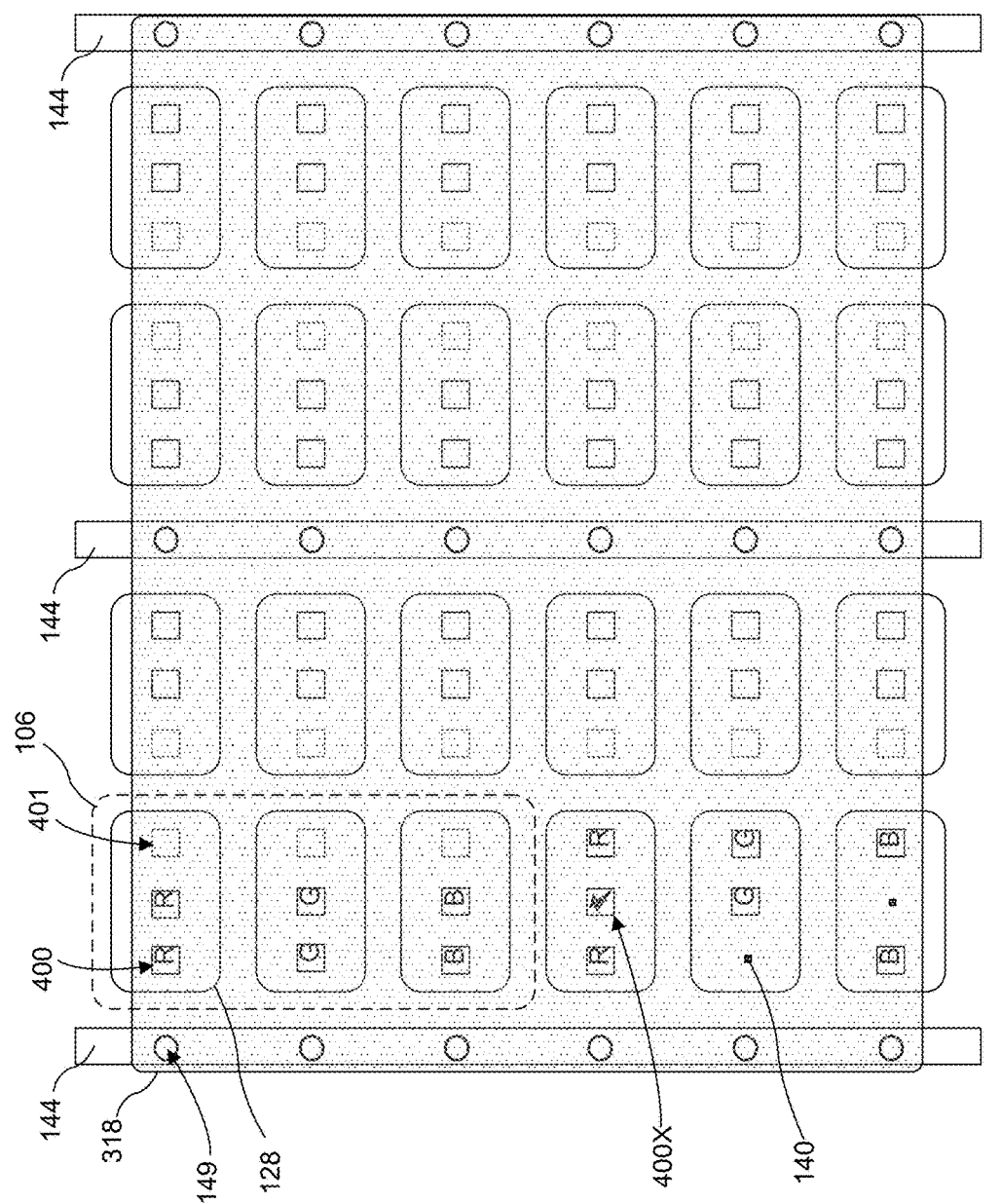
FIG. 15 is a top schematic view illustration of a top electrode layer formed over an array of micro LED devices including a variety of configurations in accordance with an embodiment of the invention.

FIG. 15 is a top schematic view illustration of an array of micro LED devices including a variety of configurations described in FIGS. 12A-12F in accordance with embodiments of the invention. In the particular embodiments illustrated in FIG. 15, a top electrode layer 318 is formed over a plurality of bank openings 128, and may be formed over a plurality of subpixels or pixels 106. In an embodiment, the top electrode layer 318 is formed over all of the micro LED devices 400 in the pixel area.

The embodiment illustrated in FIG. 12B is illustrated in the labeled pixel 106 in which the micro LED device 400 pairs are transferred without detection of any missing, defective, or contaminated micro LED devices. In this embodiment, the repair bonding sites 401 are open, and repair micro LED devices have not been transferred.

The embodiment illustrated in FIG. 12D is also illustrated as one of the red-emitting subpixels in FIG. 15 including a repair micro LED device, where the top electrode layer 318 is formed over both the red emitting micro LED devices 400 and the defective or contaminated micro LED device 400X, where the defective or contaminated micro LED device 400X is covered with the passivation layer 316.

Similarly, an embodiment is illustrated for one of the blue-emitting subpixels of FIG. 15 including a repair micro LED device, where the top electrode layer 318 is formed over both the blue emitting micro LED devices 400 and the bonding layer 140 corresponding to a missing micro LED device.

Figure 16:
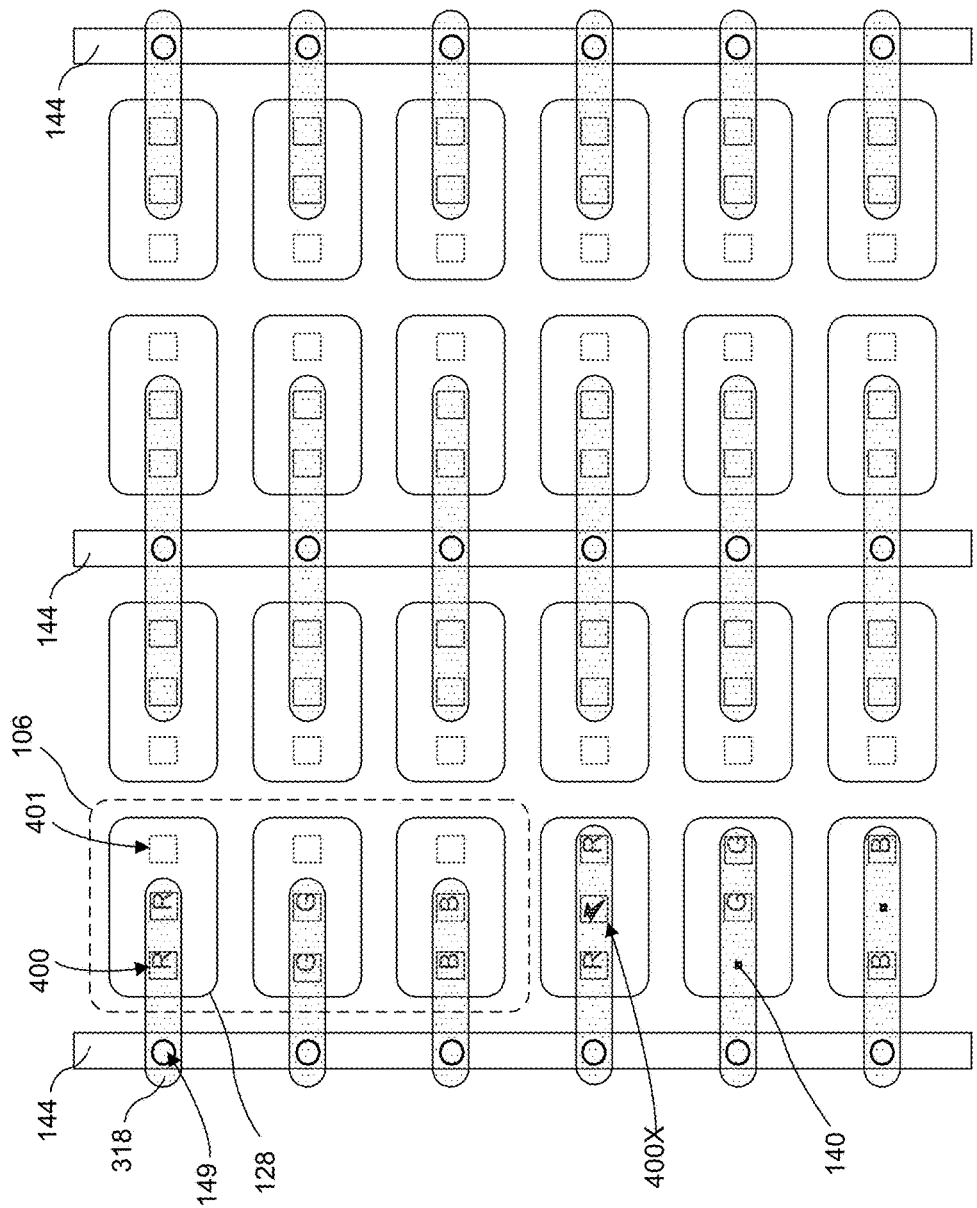
FIG. 16 is a top schematic view illustration of a plurality of separate top electrode layers formed over an array of micro LED devices including a variety of configurations in accordance with an embodiment of the invention.

FIG. 16 is a top schematic view illustration of an array of micro LED devices including a variety of configurations described in FIGS. 12A-12F in accordance with embodiments of the invention. In the particular embodiments illustrated in FIG. 16, the arrangements of micro LED devices 400 are the same as those described above with regard to FIG. 15. The embodiments illustrated in FIG. 16 differ from those illustrated in FIG. 15 particularly in formation of a plurality of separate top electrode layers 318. In one embodiment, such as those illustrated in the labeled pixel 106 where a micro LED device 400 is not placed on the repair bonding site 401, it is not required for the top electrode layers 318 to be formed thereon. Accordingly, the length of the top electrode layer 318 can be determined based upon whether or not a replacement micro LED device is added. The top electrode layer 318 may also be formed over the bonding site 401.

In some embodiments, the top electrode layers 318 are formed by ink jet printing or screen printing. Ink jet printing in particular may be suitable since it is a non-contact printing method. Conventional AMOLED backplane processing sequences typically blanket deposit the tope electrode layer in a deposition chamber followed by singulation of the individual backplanes from a larger substrate. In accordance with embodiments of the invention, a display substrate 102 can be singulated from a larger substrate prior to transferring the array of micro LED devices. In an embodiment ink jet printing or screen printing provides a practical approach for patterning the individual top electrode layers without requiring a separate mask layer for each particular configuration in the redundancy and repair scheme. Line width can also vary for the top electrode layers 118 depending upon application. For example, the line width may approach that of the subpixel area. Alternatively, the line width may be minimal. For example, line widths as low as approximately 15 microns may be accomplished with commercially available ink jet printers, and line widths as low as approximately 30 microns may be accomplished with commercially available screen printers. Accordingly, the line width may be more or less than the maximum width of the micro LED devices.

Figure 17:
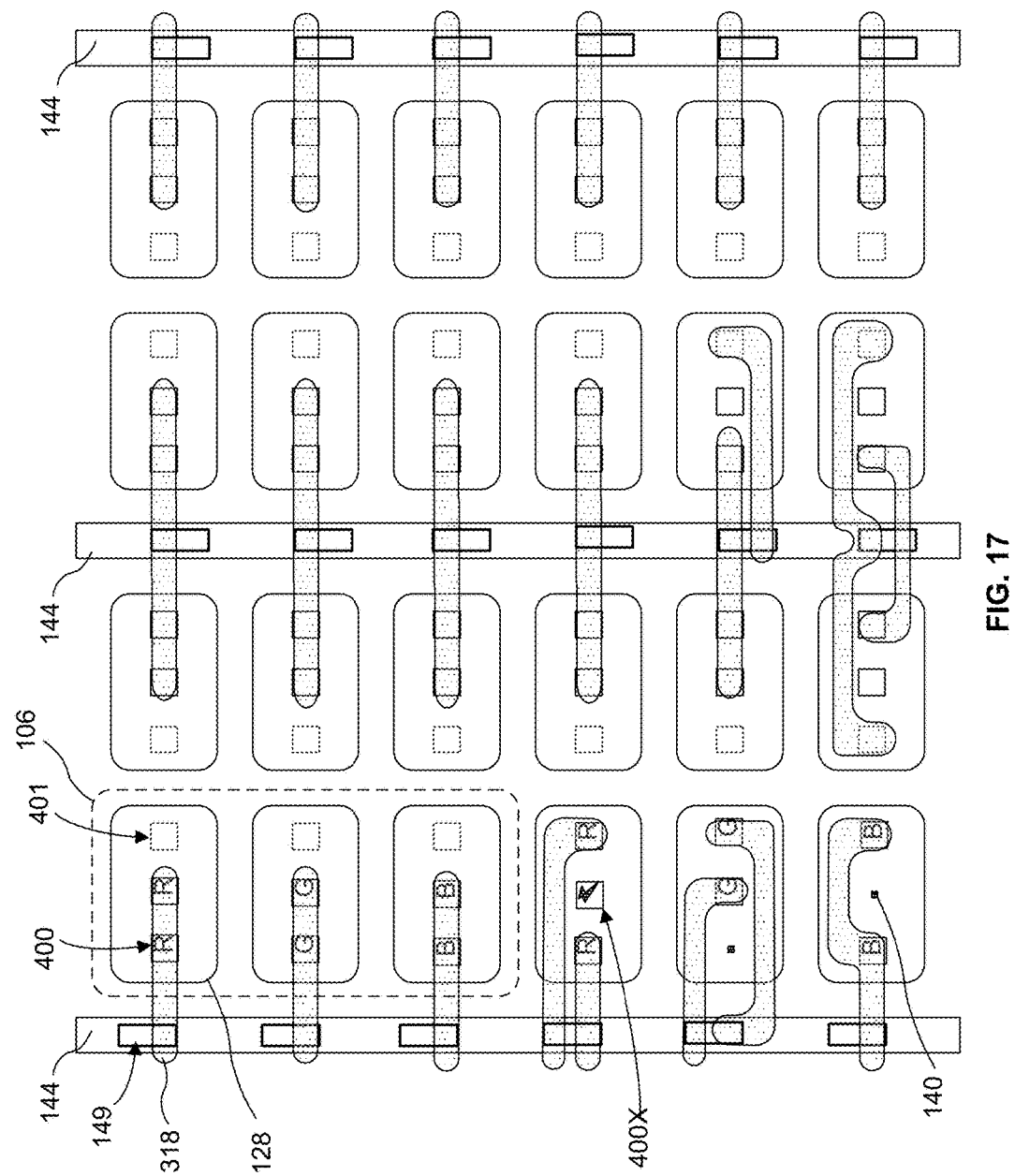
FIG. 17 is a top schematic view illustration of a plurality of separate top electrode layers formed over an array of micro LED devices including a variety of configurations in accordance with an embodiment of the invention.
Figure 18:
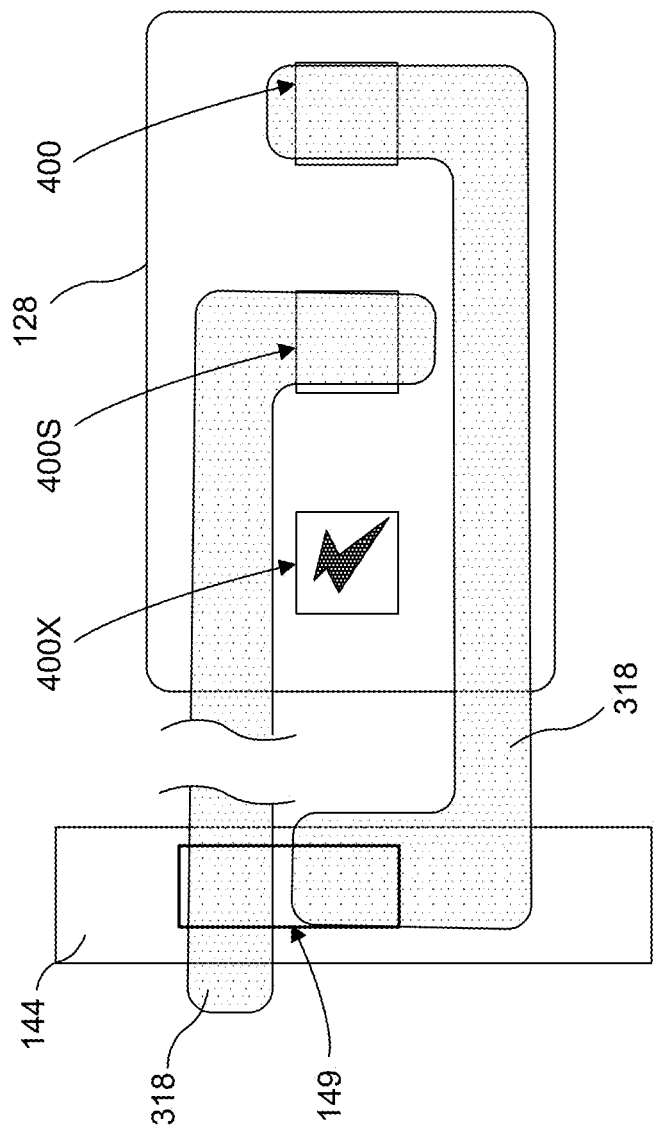
FIG. 18 is a top schematic view illustration of a scribed top electrode layer in accordance with an embodiment of the invention.

FIG. 17 is a top schematic view illustration of an array of micro LED devices including a variety of configurations described in FIGS. 12A-12F in accordance with embodiments of the invention. In the particular embodiments illustrated in FIG. 17, the arrangements of micro LED devices 400 are the same as those described above with regard to FIGS. 15-16. The embodiments illustrated in FIG. 17 differ from those illustrated in FIG. 16 particularly in formation of the top electrode layers 318. The embodiments illustrated in FIG. 16 were shown as altering the length of the top electrode layers 318, while the embodiments illustrated in FIG. 17 are shown as altering the path of the top electrode layers 318, and/or number of top electrode layers 318. For example, the top electrode layers 318 illustrated in FIG. 17 may correspond to those illustrated in FIG. 12C and FIG. 12E. In the exemplary embodiments illustrated in FIG. 17 for the red and green emitting micro LED devices, a separate top electrode layer 318 can be formed for each micro LED device 400 in the subpixel. In the embodiment illustrated in the bottom-most blue-emitting subpixel, a single top electrode layer 318 can be formed for multiple micro LED devices 400 in a subpixel where the path is adjusted to avoid a bonding layer 140, or alternatively a defective or contaminated micro LED device. In this manner, adjusting the path of the top electrode layers 318 can be used in the alternative to, or in addition to, adjusting deposition of the passivation layer 316 to cover defective or contaminated micro LED devices or the bonding sites of missing micro LED devices.

The formation of separate top electrode layer(s) 318 may provide an additional benefit during electrical testing of the display substrate 102 after formation of the top electrode layer(s) 318. For example, prior to formation of the top electrode layer 318 it may not have been possible to detect certain defects resulting in shorting of a micro LED device 400S. The implication of a shorted micro LED device 400S could result in a dark subpixel in which all of the current flows through the shorted micro LED devices 400S rather than any of the other micro LED devices in the subpixel. In the embodiment illustrated in FIG. 18 the top electrode layer 318 connected to a shorted micro LED device 400S is cut using a suitable technique such as laser scribing. In this manner, electrical shorts that could not have been or were not detected during the integrated testing method previously described could potentially be detected during an electrical test with the application of electrical current through the display after formation of the top electrode layer 318. In such an embodiment, if a micro LED device 400S is shorted, the top electrode layer 318 to the micro LED device 400S can be cut, allowing the redundant and/or repair micro LED device to provide the emission from the subpixel.

Figure 19:
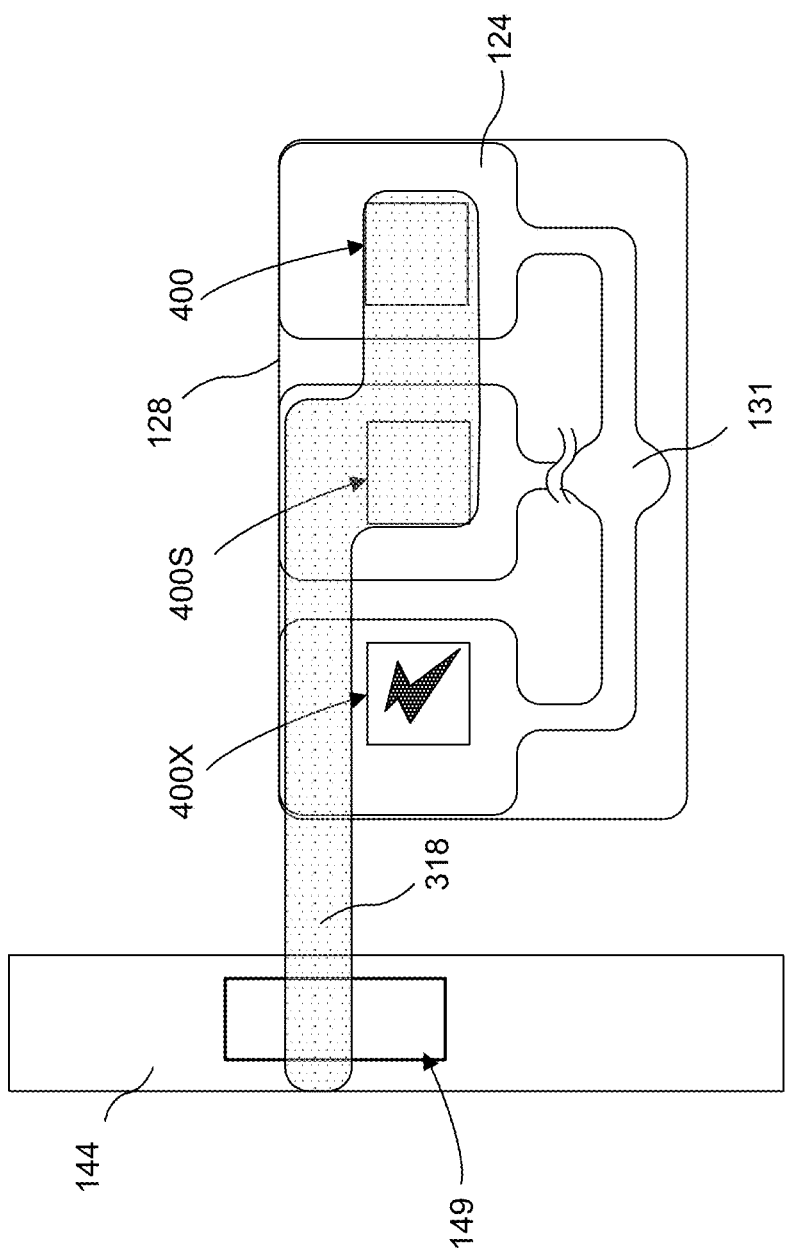
FIG. 19 is a top schematic view illustration of a scribed bottom contact layer in accordance with an embodiment of the invention.

FIG. 19 illustrates an alternative embodiment where rather than cutting or scribing the top electrode layer 318, the reflective bank layer 142 can be formed to include multiple bottom contact areas 124 that can be cut using a suitable technique such as laser scribing to segregate irregular micro LED devices. In the particular embodiment illustrated, the bottom contact area 124 includes separate landing areas for the micro LED devices. In the particular embodiment illustrated, the bottom contact area 124 supporting the micro LED device 400S is cut using a suitable technique such as laser scribing to segregate the irregular micro LED device so that it is not in electrical communication with the underlying TFT circuitry through filled opening 131.

Figure 20:
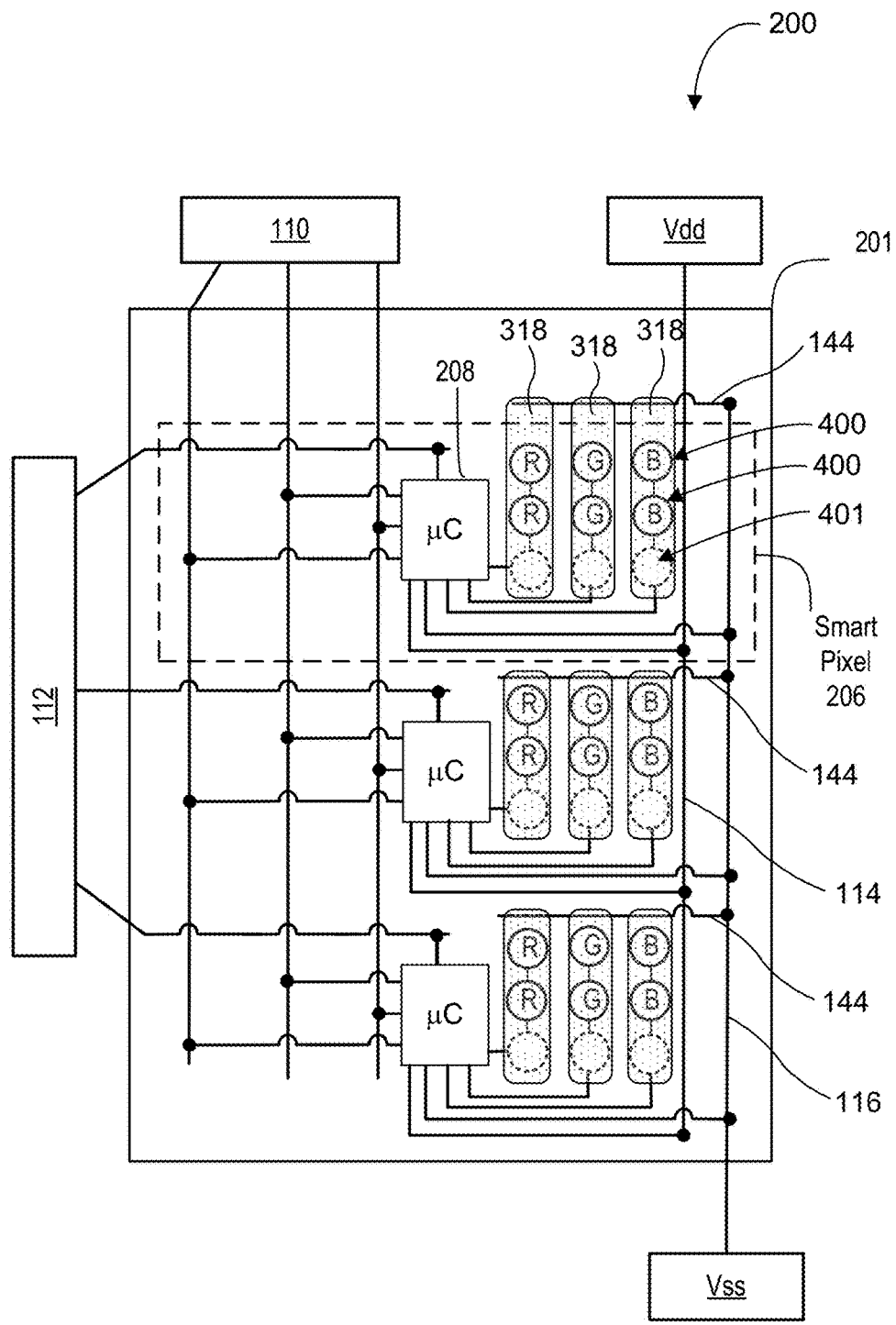
FIG. 20 is a top view schematic illustration of a smart pixel display including a redundancy and repair site configuration in accordance with an embodiment of the invention.

Up until this point, embodiments of the invention have been illustrated and described with a display substrate 102 including an underlying circuitry 210. However, embodiments of the invention are not so limited. For example, the circuitry can be provided on top of the substrate in the form of micro chips. FIG. 20 is a top view schematic illustration of a smart pixel display including a redundancy and repair site configuration in accordance with an embodiment of the invention. As shown the display panel 200 includes a substrate 201 which may be opaque, transparent, rigid, or flexible. A smart pixel area 206 may include separate subpixels of different emission colors, and a micro controller chip 208 including the working circuitry described above with regard to the TFT substrate. In this manner, rather than forming the pixel area on a TFT substrate including the working circuitry, the micro LED devices 400 and micro controller chip 208 are both transferred to the same side or surface of the substrate 201. Electrical distribution lines can connect the micro controller chip 208 to the data driver circuit 109 and scan driver circuit 112 similarly as with a TFT substrate. Likewise, reflective bank layer structures can be formed on the substrate 201 similarly as described above for the TFT substrate to contain the micro LED devices 400 and repair bonding site 401. Similarly, a top electrode layer 318, or separate top electrode layers 318 can connect the micro LED devices 400 to a ground tie line 144 or ground ring 116 similarly as described above with regard to the TFT substrate configuration. Wavelength conversion layers, and other optional layers, can also be formed over the micro LED devices 400 to generate the determined color emission spectrum as described above. Thus, similar color emission configurations including wavelength conversion layers, redundancy, and repair site configurations can be formed with the smart pixel configuration as described above for the TFT substrate configurations.

Figure 21:
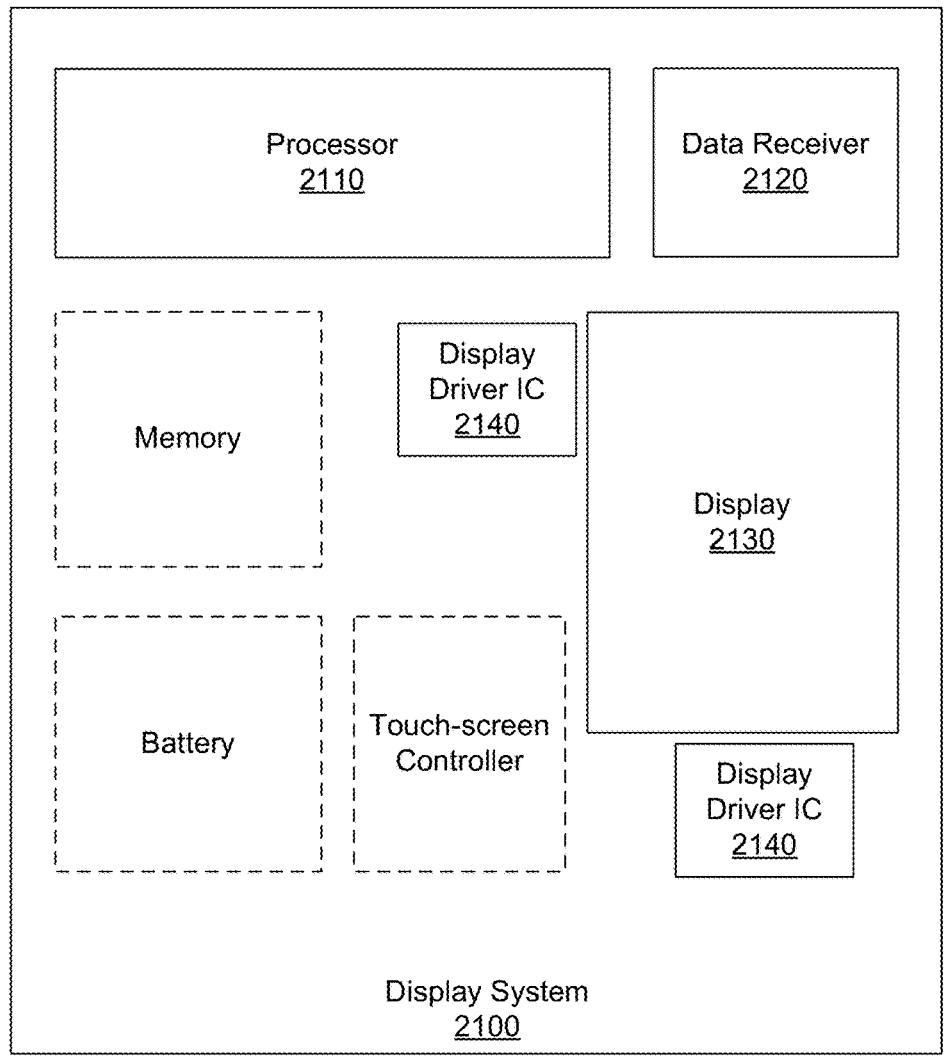
FIG. 21 is a schematic illustration of a display system in accordance with an embodiment of the invention.

FIG. 21 illustrates a display system 2100 in accordance with an embodiment. The display system houses a processor 2110, data receiver 2120, a display 2130, and one or more display driver ICs 2140, which may be scan driver ICs and data driver ICs. The data receiver 2120 may be configured to receive data wirelessly or wired. Wireless may be implemented in any of a number of wireless standards or protocols including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The one or more display driver ICs 2140 may be physically and electrically coupled to the display 2130.

In some embodiments, the display 2130 includes one or more micro LED devices 400 and wavelength conversion layers 310 that are formed in accordance with embodiments of the invention described above. For example, the display 2130 may include a plurality of micro LED devices, a plurality of light distribution layers around the micro LED devices, and a plurality of wavelength conversion layers over the light distribution layers.

Depending on its applications, the display system 2100 may include other components. These other components include, but are not limited to, memory, a touch-screen controller, and a battery. In various implementations, the display system 2100 may be a television, tablet, phone, laptop, computer monitor, kiosk, digital camera, handheld game console, media display, ebook display, or large area signage display.

In utilizing the various aspects of this invention, it would become apparent to one skilled in the art that combinations or variations of the above embodiments are possible for integrating micro LED devices and wavelength conversion layers into display applications. Although the present invention has been described in language specific to structural features and/or methodological acts, it is to be understood that the invention defined in the appended claims is not necessarily limited to the specific features or acts described. The specific features and acts disclosed are instead to be understood as particularly graceful implementations of the claimed invention useful for illustrating the present invention.

What is claimed is:

1. A display panel comprising:
a display substrate including an array of pixels;
a first pixel of the array of pixels that includes a first subpixel designed for a first color emission spectrum, and a second subpixel designed for a second color emission spectrum different from the first color emission spectrum;
a first vertical light emitting diode (LED) mounted on a first bottom electrode within the first subpixel;
a second vertical LED mounted on a second bottom electrode within the second subpixel;
a sidewall passivation material that laterally surrounds the first and second vertical LEDs;
a top electrode layer that spans over the sidewall passivation layer material and the first and second vertical LEDs, and is in electrical contact with the first and second vertical LEDs;
a first wavelength conversion layer comprising phosphor particles over the top electrode layer and the first vertical LED, wherein the first wavelength conversion layer is not over the second vertical LED.

2. The display panel of claim 1, wherein the display substrate further comprises a terminal line, and the top electrode layer electrically connects the first vertical LED and the second vertical LED to the terminal line.

3. The display panel of claim 2, wherein the first and second vertical LEDs each have a maximum width of 1-100 um.

4. The display panel of claim 2, wherein the first vertical LED is mounted to the first bottom electrode within a bank opening.

5. The display panel of claim 4, wherein the first wavelength conversion layer completely covers the bank opening.

6. The display panel of claim 4, further comprising a reflective bank layer within the bank opening.

7. The display panel of claim 6, wherein the first wavelength conversion layer completely covers the bank opening.

8. The display panel of claim 6, wherein the reflective bank layer is the first bottom electrode.

9. The display panel of claim 4, wherein the second vertical LED is mounted to the second bottom electrode within a second bank opening.

10. The display panel of claim 9, further comprising a second reflective bank layer within the second bank opening.

11. The display panel of claim 2, further comprising a black matrix layer arranged between the first and second subpixels.

12. The display panel of claim 2, wherein the phosphor particles are quantum dots.

13. The display panel of claim 12, wherein the first wavelength conversion layer further comprises scattering particles.

14. The display panel of claim 1, further comprising a color filter over the first wavelength conversion layer, wherein the color filter is designed to filter out light emitted from the first vertical LED.

15. The display panel of claim 1, further comprising an array of controller chips in a pixel areas of the display substrate, each controller chip to switch and drive a corresponding plurality of vertical LEDs.

16. The display panel of claim 15, wherein the array of controller chips includes a first controller chip to switch and drive the first and second vertical LEDs.

17. The display panel of claim 1, wherein the first and second vertical LEDs are bonded to the first and second bottom electrodes with a solder material.

18. The display panel of claim 17, wherein each of the first and second vertical LEDs comprises a p-n diode, and a conformal dielectric barrier layer spanning sidewalls of the p-n diode.

* * * * *